(12) United States Patent
Matsumoto

(10) Patent No.: US 11,335,624 B2
(45) Date of Patent: May 17, 2022

(54) PRINT HEAD AND LIQUID DISCHARGE APPARATUS

(71) Applicant: SEIKO EPSON CORPORATION, Tokyo (JP)

(72) Inventor: Yusuke Matsumoto, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 317 days.

(21) Appl. No.: 16/572,865

(22) Filed: Sep. 17, 2019

(65) Prior Publication Data

US 2020/0091041 A1    Mar. 19, 2020

(30) Foreign Application Priority Data

Sep. 19, 2018 (JP) .............................. JP2018-174372
May 16, 2019 (JP) .............................. JP2019-092830

(51) Int. Cl.

| | | |
|---|---|---|
| H01L 23/48 | (2006.01) | |
| B41J 2/045 | (2006.01) | |
| B41J 3/54 | (2006.01) | |
| B41J 2/03 | (2006.01) | |
| G06K 15/10 | (2006.01) | |
| G06K 15/02 | (2006.01) | |
| H01L 41/047 | (2006.01) | |
| H01L 41/29 | (2013.01) | |

(52) U.S. Cl.
CPC ........ *H01L 23/481* (2013.01); *B41J 2/04563* (2013.01); *B41J 2/04591* (2013.01); *G06K 15/10* (2013.01); *G06K 15/102* (2013.01); *G06K 15/1803* (2013.01); *H01L 41/0475* (2013.01); *H01L 41/29* (2013.01); *B41J 2/04541* (2013.01); *B41J 2/04581* (2013.01)

(58) Field of Classification Search
CPC ... H01L 41/0475; H01L 41/29; H01L 23/481; G06K 15/10; G06K 15/1803; G06K 15/102; B41J 2/04563; B41J 2/04591; B41J 2/04581; B41J 2/04541
See application file for complete search history.

(56) References Cited

U.S. PATENT DOCUMENTS

| | | | | |
|---|---|---|---|---|
| 10,328,690 B2* | 6/2019 | Chino | .................. | B41J 2/04586 |
| 10,471,714 B2* | 11/2019 | Chen | ...................... | B41J 2/1632 |
| 10,814,646 B2* | 10/2020 | Matsumoto | ................ | B41J 3/54 |

(Continued)

FOREIGN PATENT DOCUMENTS

JP        2017-114020 A        6/2017

*Primary Examiner* — Alonzo Chambliss

(74) *Attorney, Agent, or Firm* — Global IP Counselors, LLP

(57) ABSTRACT

A liquid discharge apparatus includes a print head discharging a liquid and a control circuit controlling an operation of the print head. the print head includes a connector having a first terminal, a second terminal, a third terminal, and a fourth terminal, a first integrated circuit, a circuit substrate on which the connector and the first integrated circuit are provided and which has first wiring, second wiring, third wiring, fourth wiring, fifth wiring, and sixth wiring, and a first wiring substrate, in which the first wiring electrically couples the first terminal and the first integrated circuit to each other, the fifth wiring electrically couples the first terminal and the first integrated circuit to each other, and the sixth wiring electrically couples the first integrated circuit and the first wiring substrate to each other.

17 Claims, 33 Drawing Sheets

(56) References Cited

U.S. PATENT DOCUMENTS

| | | | |
|---|---|---|---|
| 10,882,313 B2* | 1/2021 | Matsumoto | B41J 2/04588 |
| 10,974,502 B2* | 4/2021 | Hasegawa | B41J 2/04588 |
| 11,034,146 B2* | 6/2021 | Ito | B41J 2/04541 |
| 2012/0212540 A1* | 8/2012 | Dietl | B41J 2/14201 |
| | | | 347/29 |
| 2019/0009531 A1 | 1/2019 | Furukawa | |

* cited by examiner

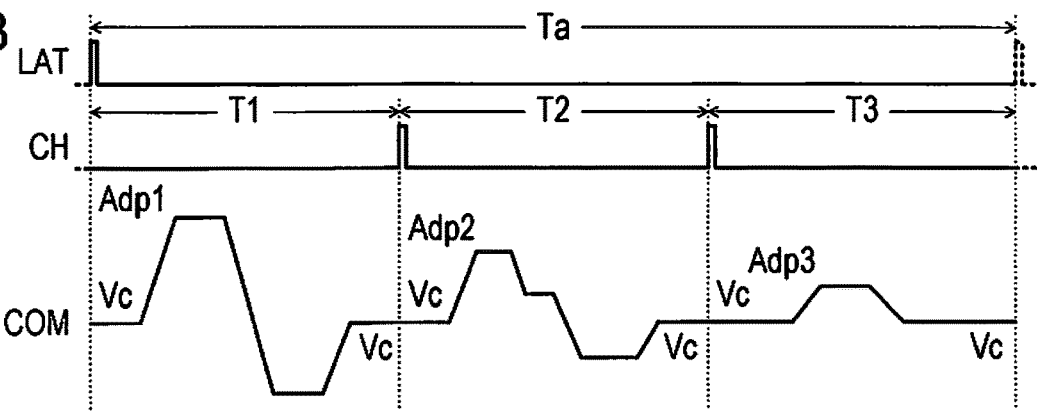
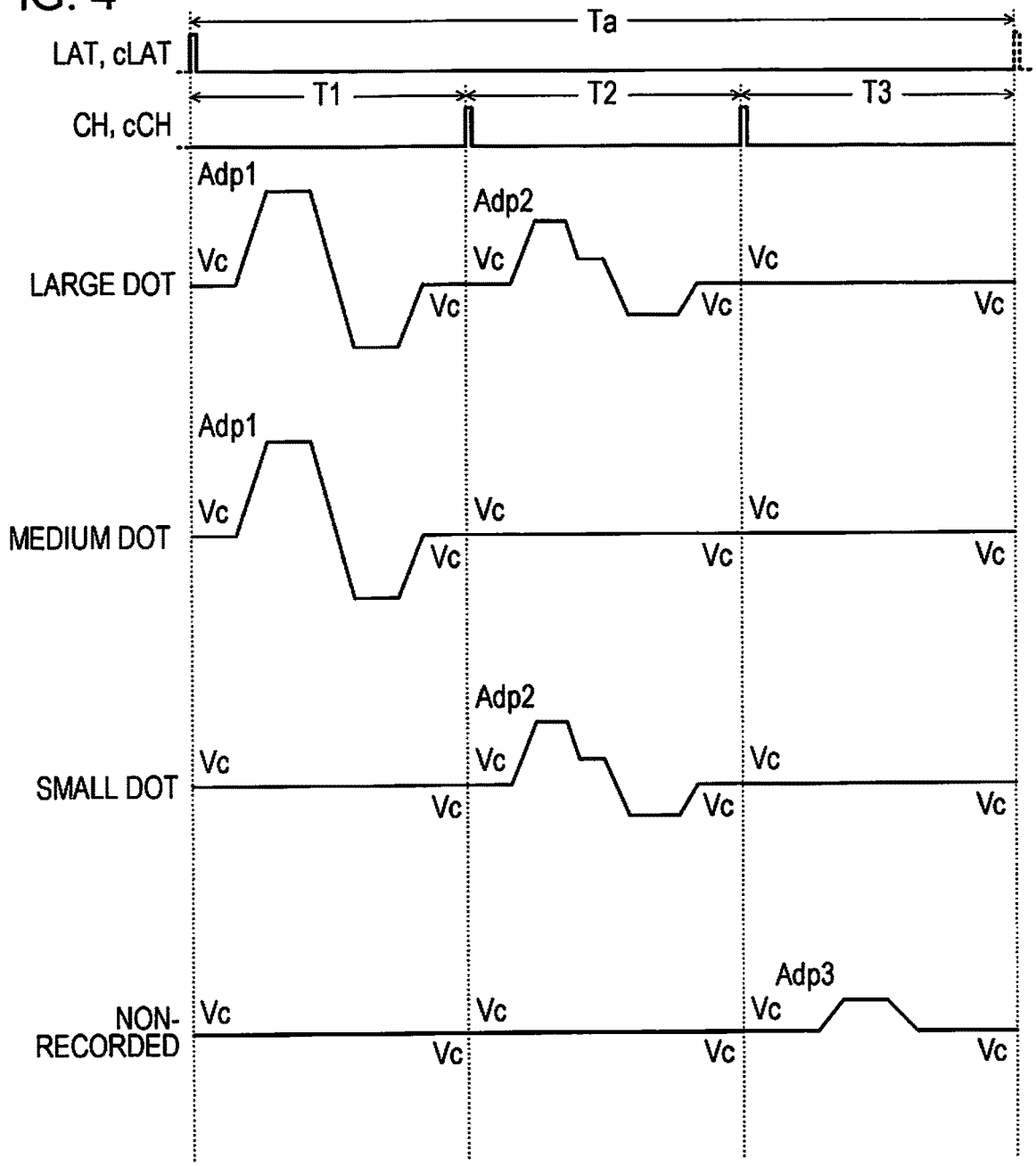

| [LATa, LATb] ([SIH, SIL]) | [1, 1] | [1, 0] | [0, 1] | [0, 0] |
|---|---|---|---|---|
| DOT SIZE | LARGE DOT | MEDIUM DOT | SMALL DOT | NON-RECORDED |
| SELECTION CONTROL SIGNAL | q0 | q1 | q2 | q3 |
| S  T1 | H | H | L | L |
| T2 | H | L | H | L |
| T3 | L | L | L | H |

FIG. 19

| CONNECTOR 350 TERMINAL NUMBER | SIGNAL |
|---|---|
| 353-1 | COM6 |
| 353-2 | CGND6 |
| 353-3 | COM5 |
| 353-4 | CGND5 |
| 353-5 | COM4 |
| 353-6 | CGND4 |
| 353-7 | COM3 |
| 353-8 | CGND3 |
| 353-9 | COM2 |
| 353-10 | CGND2 |
| 353-11 | COM1 |
| 353-12 | CGND1 |
| 353-13 | VHV |
| 353-14 | GND |
| 353-15 | XHOT and DIG-E |
| 353-16 | GND |
| 353-17 | TD1 and DIG-D |
| 353-18 | GND |
| 353-19 | CH and DIG-C |
| 353-20 | GND |
| 353-21 | SCK and DIG-B |
| 353-22 | GND |
| 353-23 | LAT and DIG-A |
| 353-24 | GND |
| 353-25 | TH |
| 353-26 | GND |

FIG. 20

| CONNECTOR 360 TERMINAL NUMBER | SIGNAL |
|---|---|
| 363-1 | CGND6 |
| 363-2 | COM6 |
| 363-3 | CGND5 |
| 363-4 | COM5 |
| 363-5 | CGND4 |
| 363-6 | COM4 |
| 363-7 | CGND3 |
| 363-8 | COM3 |
| 363-9 | CGND2 |
| 363-10 | COM2 |
| 363-11 | CGND1 |
| 363-12 | COM1 |
| 363-13 | GND |
| 363-14 | GND |
| 363-15 | GND |
| 363-16 | TD6 |
| 363-17 | GND |
| 363-18 | TD5 |
| 363-19 | GND |
| 363-20 | TD4 |
| 363-21 | VDD2 |
| 363-22 | TD3 |
| 363-23 | GND |
| 363-24 | TD2 |
| 363-25 | GND |
| 363-26 | VDD1 |

FIG. 30

| CONNECTOR 350 TERMINAL NUMBER | SIGNAL |
|---|---|
| 353-1 | COM5 |
| 353-2 | CGND5 |
| 353-3 | COM4 |
| 353-4 | CGND4 |
| 353-5 | COM3 |
| 353-6 | CGND3 |
| 353-7 | COM2 |
| 353-8 | CGND2 |
| 353-9 | COM1 |
| 353-10 | CGND1 |
| 353-11 | TD1 and DIG-D |
| 353-12 | GND |
| 353-13 | CH1 and DIG-C |
| 353-14 | GND |
| 353-15 | SCK1 and DIG-B |
| 353-16 | GND |
| 353-17 | LAT1 and DIG-A |
| 353-18 | GND |
| 353-19 | TH |
| 353-20 | GND |

FIG. 31

| CONNECTOR 360 TERMINAL NUMBER | SIGNAL |
|---|---|
| 363-1 | CGND5 |
| 363-2 | COM5 |
| 363-3 | CGND4 |
| 363-4 | COM4 |
| 363-5 | CGND3 |
| 363-6 | COM3 |
| 363-7 | CGND2 |
| 363-8 | COM2 |
| 363-9 | CGND1 |
| 363-10 | COM1 |
| 363-11 | GND |
| 363-12 | TD5 |
| 363-13 | GND |
| 363-14 | TD4 |
| 363-15 | GND |
| 363-16 | TD3 |
| 363-17 | GND |
| 363-18 | TD2 |
| 363-19 | GND |
| 363-20 | VDD1 |

FIG. 32

| CONNECTOR 370 TERMINAL NUMBER | SIGNAL |
|---|---|
| 373-1 | CGND6 |
| 373-2 | COM6 |
| 373-3 | CGND7 |
| 373-4 | COM7 |
| 373-5 | CGND8 |
| 373-6 | COM8 |
| 373-7 | CGND9 |
| 373-8 | COM9 |
| 373-9 | CGND10 |
| 373-10 | COM10 |
| 373-11 | GND |
| 373-12 | XHOT and DIG-E |
| 373-13 | GND |
| 373-14 | LAT2 and DIG-F |
| 373-15 | GND |
| 373-16 | SCK2 and DIG-G |
| 373-17 | GND |
| 373-18 | CH2 and DIG-H |
| 373-19 | GND |
| 373-20 | TD10 and DIG-I |

FIG. 33

| CONNECTOR 380 TERMINAL NUMBER | SIGNAL |
|---|---|
| 383-1 | COM6 |
| 383-2 | CGND6 |
| 383-3 | COM7 |
| 383-4 | CGND7 |
| 383-5 | COM8 |
| 383-6 | CGND8 |
| 383-7 | COM9 |
| 383-8 | CGND9 |
| 383-9 | COM10 |
| 383-10 | CGND10 |
| 383-11 | VHV |
| 383-12 | GND |
| 383-13 | TD6 |
| 383-14 | GND |
| 383-15 | TD7 |
| 383-16 | VDD2 |
| 383-17 | TD8 |
| 383-18 | GND |
| 383-19 | TD9 |
| 383-20 | GND |

PRINT HEAD AND LIQUID DISCHARGE APPARATUS

The present application is based on, and claims priority from JP Application Serial Number 2018-174372, filed Sep. 19, 2018 and JP Application Serial Number 2019-092830, filed May 16, 2019, the disclosures of which are hereby incorporated by reference herein in their entirety.

BACKGROUND

1. Technical Field

The present disclosure relates to a liquid discharge apparatus and a print head.

2. Related Art

A liquid discharge apparatus such as an ink jet printer discharges a liquid such as an ink filled in a cavity from a nozzle by driving a piezoelectric element provided on a print head by a driving signal to form a character or an image on a recording medium. When failure occurs to the printer head in the liquid discharge apparatus, discharge abnormality that hinders normal discharge of the liquid from the nozzle may occur. When the discharge abnormality occurs, discharge accuracy of ink discharged from the nozzle may deteriorate and thus quality of the image formed on the recording medium may deteriorate.

JP-A-2017-114020 discloses a print head which has a self-diagnosis function of determining, by a head unit (print head) itself, whether or not dots satisfying a normal printing quality can be formed in accordance with a plurality of signals input to the print head, and a liquid discharge apparatus which propagates, through a common signal path, a signal for performing the self-diagnosis function and a signal for performing print processing of discharging ink from a nozzle.

However, when the signal for performing the self-diagnosis function and the signal for performing the print processing of discharging ink from the nozzle propagate through the common signal path, distortion may occur in a waveform of the signal for performing the print processing due to an influence of a self-diagnosis circuit for performing the self-diagnosis function. As a result, discharge accuracy of ink may deteriorate. That is, when the signal for performing the self-diagnosis function and the signal for performing the print processing propagate through the common signal path, it is difficult to achieve both normally performing the self-diagnosis function of the print head and performing the print processing while reducing the possibility of ink discharge accuracy deterioration.

SUMMARY

According to an aspect of the present disclosure, there is provided a liquid discharge apparatus including: a print head discharging a liquid; and a control circuit controlling an operation of the print head, in which the print head includes a connector having a first terminal, a second terminal, a third terminal, and a fourth terminal, a first integrated circuit; a circuit substrate on which the connector and the first integrated circuit are provided, and a first wiring substrate electrically coupled to the circuit substrate, the circuit substrate has first wiring, second wiring, third wiring, fourth wiring, fifth wiring, and sixth wiring, the first wiring electrically couples the first terminal and the first integrated circuit to each other, the second wiring electrically couples the second terminal and the first integrated circuit to each other, the third wiring electrically couples the third terminal and the first integrated circuit to each other, the fourth wiring electrically couples the fourth terminal and the first integrated circuit to each other, the fifth wiring electrically couples the first terminal and the first wiring substrate to each other, and the sixth wiring electrically couples the first integrated circuit and the first wiring substrate to each other.

In the aspect of the liquid discharge apparatus, the print head may include a second integrated circuit, the second integrated circuit may be provided on the first wiring substrate, the first wiring substrate may have seventh wiring and eighth wiring, the seventh wiring may electrically couple the fifth wiring and the second integrated circuit to each other, and the eighth wiring may electrically couple the sixth wiring and the second integrated circuit to each other.

In the aspect of the liquid discharge apparatus, the connector and the first integrated circuit may be provided on an identical surface of the circuit substrate.

In the aspect of the liquid discharge apparatus, the first wiring substrate may be a flexible wiring substrate.

In the aspect of the liquid discharge apparatus, the print head may include a second wiring substrate electrically coupled to the circuit substrate, and a shortest distance between the first wiring substrate and the connector may be shorter than a shortest distance between the second wiring substrate and the connector.

In the aspect of the liquid discharge apparatus, the print head may include a plurality of wiring substrates including the first wiring substrate and the second wiring substrate, and the first wiring substrate may be provided to be closest to the connector among the plurality of wiring substrates.

In the aspect of the liquid discharge apparatus, a frequency of a signal propagating through the first wiring may be higher than a frequency of a signal propagating through the second wiring.

In the aspect of the liquid discharge apparatus, a frequency of a signal propagating through the first wiring may be higher than a frequency of a signal propagating through the third wiring.

In the aspect of the liquid discharge apparatus, the first integrated circuit may determine whether or not the liquid is normally discharged based on a first signal, a second signal, a third signal, and a fourth signal.

The liquid discharge apparatus may further include a driving signal output circuit outputting a driving signal, in which the driving signal includes a first waveform, a second waveform, and a constant voltage waveform between the first and second waveforms, the first and second waveforms being for discharging the liquid from the print head.

In the aspect of the liquid discharge apparatus, the first terminal may serve as a terminal to which the first signal and a fifth signal for specifying a selection of waveform of the driving signal are input.

In the aspect of the liquid discharge apparatus, the second terminal may serve as a terminal to which the second signal and a sixth signal for specifying a liquid discharge timing are input.

In the aspect of the liquid discharge apparatus, the sixth signal may be input to the second terminal in a period during which the driving signal has the constant voltage waveform.

In the aspect of the liquid discharge apparatus, the third terminal may serve as a terminal to which the third signal and a seventh signal for specifying a waveform switching timing of the driving signal are input.

In the aspect of the liquid discharge apparatus, the seventh signal may be input to the third terminal in a period during which the driving signal has the constant voltage waveform.

In the aspect of the liquid discharge apparatus, the fourth terminal may serve as a terminal to which the fourth signal and an eighth signal for specifying an operation timing of the print head are input.

According to another aspect of the present disclosure, there is provided a print head including: a connector having a first terminal, a second terminal, a third terminal, and a fourth terminal; a first integrated circuit; a circuit substrate on which the connector and the first integrated circuit are provided; and a first wiring substrate electrically coupled to the circuit substrate, in which the circuit substrate has first wiring, second wiring, third wiring, fourth wiring, fifth wiring, and sixth wiring, the first wiring electrically couples the first terminal and the first integrated circuit to each other, the second wiring electrically couples the second terminal and the first integrated circuit to each other, the third wiring electrically couples the third terminal and the first integrated circuit to each other, the fourth wiring electrically couples the fourth terminal and the first integrated circuit to each other, the fifth wiring electrically couples the first terminal and the first wiring substrate to each other, and the sixth wiring electrically couples the first integrated circuit and the first wiring substrate to each other.

BRIEF DESCRIPTION OF THE DRAWINGS

FIG. 3 is a view illustrating an example of a waveform of a driving signal.

FIG. 4 is a view illustrating an example of a waveform of a driving signal.

FIG. 19 is a view for explaining details of signals input to the connector.

FIG. 20 is a view for explaining details of signals input to the connector.

FIG. 30 is a view for explaining details of signals input to the connector in the second embodiment.

FIG. 31 is a view for explaining details of signals input to the connector in the second embodiment.

FIG. 32 is a view for explaining details of signals input to the connector.

FIG. 33 is a view for explaining details of signals input to the connector.

DESCRIPTION OF EXEMPLARY EMBODIMENTS

Hereinafter, preferred embodiments of the present disclosure will be described with reference to the drawings. The drawings used are for convenience of explanation. Note that, the embodiments described below are not intended to unduly limit the contents of the present disclosure described in the claims. Further, all the configurations described below are not limited to necessarily essential components of the present disclosure.

1. First Embodiment 1.1. Outline of Liquid Discharge Apparatus

Figure 1:
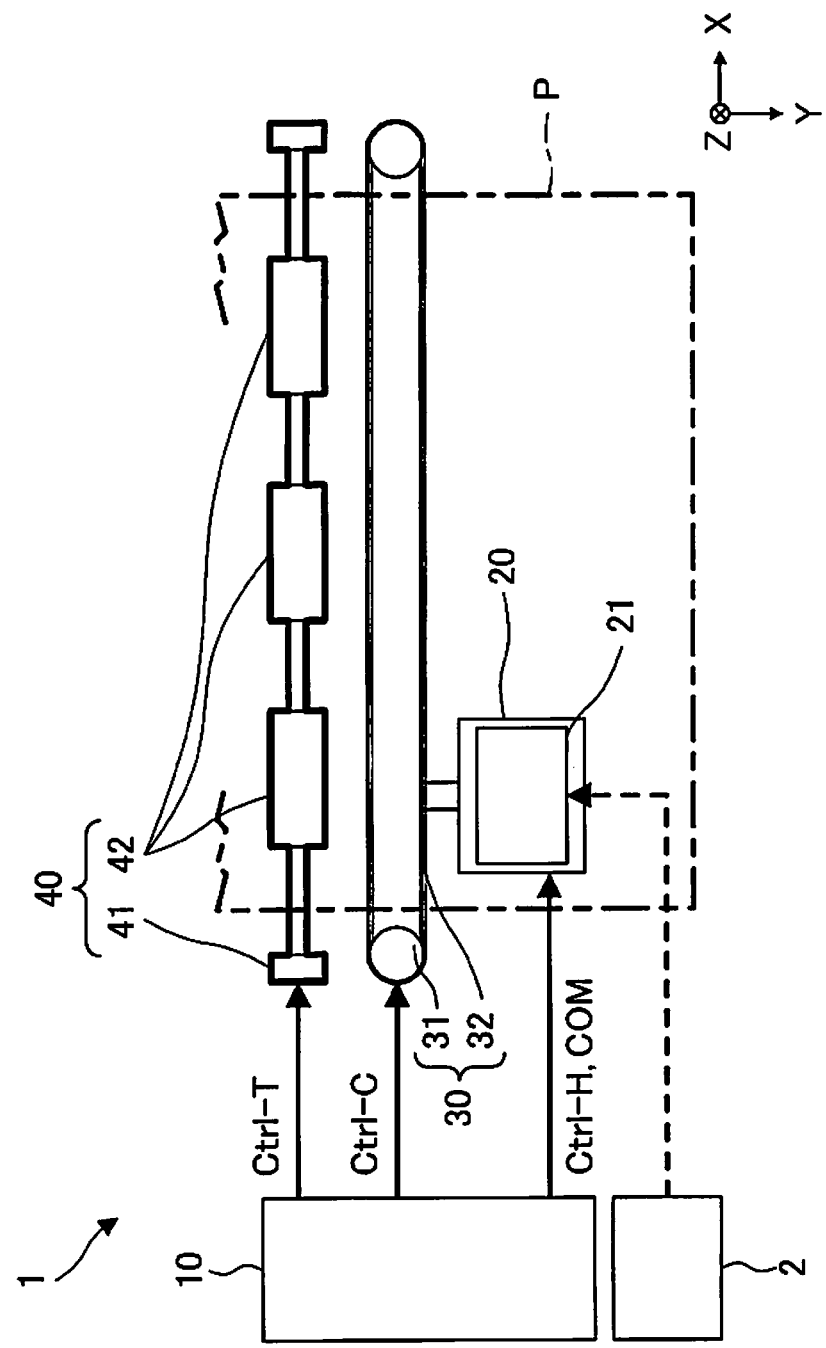
FIG. 1 is a view illustrating a schematic configuration of a liquid discharge apparatus.

FIG. 1 is a view illustrating a schematic configuration of a liquid discharge apparatus 1. The liquid discharge apparatus 1 is a serial printing type ink jet printer. In the liquid discharge apparatus 1, a carriage 20 on which a print head 21 for discharging ink as an example of liquid is mounted is reciprocated and the ink is discharged to a medium P being transported, thereby forming an image on the medium P. Hereinafter, the description is made on the assumption that a direction in which the carriage 20 moves is an X direction, a direction in which the medium P is transported is a Y direction, and a direction in which the ink is discharged is a Z direction. Noted that, it is described that the X direction, the Y direction, and the Z direction are directions orthogonal to each other, but is not limited to the case where various components which constitute the liquid discharge apparatus 1 are provided orthogonal to each other. In addition, any print objects such as printing paper, a resin film, a fabric, and the like can be used as the medium P.

The liquid discharge apparatus 1 includes a liquid container 2, a control mechanism 10, the carriage 20, a movement mechanism 30, and a transport mechanism 40.

The liquid container 2 stores a plurality of types of ink to be discharged to the medium P. Examples of colors of ink stored in the liquid container 2 includes black, cyan, magenta, yellow, red, gray, and the like. As the liquid container 2 in which the ink is stored, an ink cartridge, a bag-like ink pack formed of and a flexible film, and an ink tank capable of refilling the ink are used.

The control mechanism 10 includes a processing circuit such as a central processing unit (CPU) and a field programmable gate array (FPGA), and the like, and a storage circuit such as a semiconductor memory, and controls each component of the liquid discharge apparatus 1.

The carriage 20 is mounted on the print head 21. In addition, the carriage 20 is fixed to an endless belt 32 included in the movement mechanism 30. The liquid container 2 may also be equipped with the carriage 20.

A control signal Ctrl-H output from the control mechanism 10 to control the print head 21 and one or a plurality of driving signals COM for driving the print head 21 are input to the print head 21. And then, the print head 21 discharges the ink supplied from the liquid container 2 based on the control signal Ctrl-H and the driving signal COM.

The movement mechanism 30 includes a carriage motor 31 and the endless belt 32. The carriage motor 31 is operated based on a control signal Ctrl-C input from the control mechanism 10. The endless belt 32 is rotated in accordance with the operation of the carriage motor 31. Thus, the carriage 20 fixed to the endless belt 32 is reciprocated in the X direction.

The transport mechanism 40 includes a transport motor 41 and a transport roller 42. The transport motor 41 is operated based on a control signal Ctrl-T input from the control mechanism 10. The transport roller 42 is rotated in accordance with the operation of the transport motor 41. The medium P is transported in the Y direction in accordance with the rotation of the transport roller 42.

As described above, the liquid discharge apparatus 1 discharges the ink from the print head 21 mounted on the carriage 20 in conjunction with a transport of the medium P by the transport mechanism 40 and a reciprocation of the carriage 20 by the movement mechanism 30, thereby landing the ink at any position of a surface of the medium P and forming a desired image on the medium P.

1.2. Electrical Configuration of Liquid Discharge Apparatus

Figure 2:
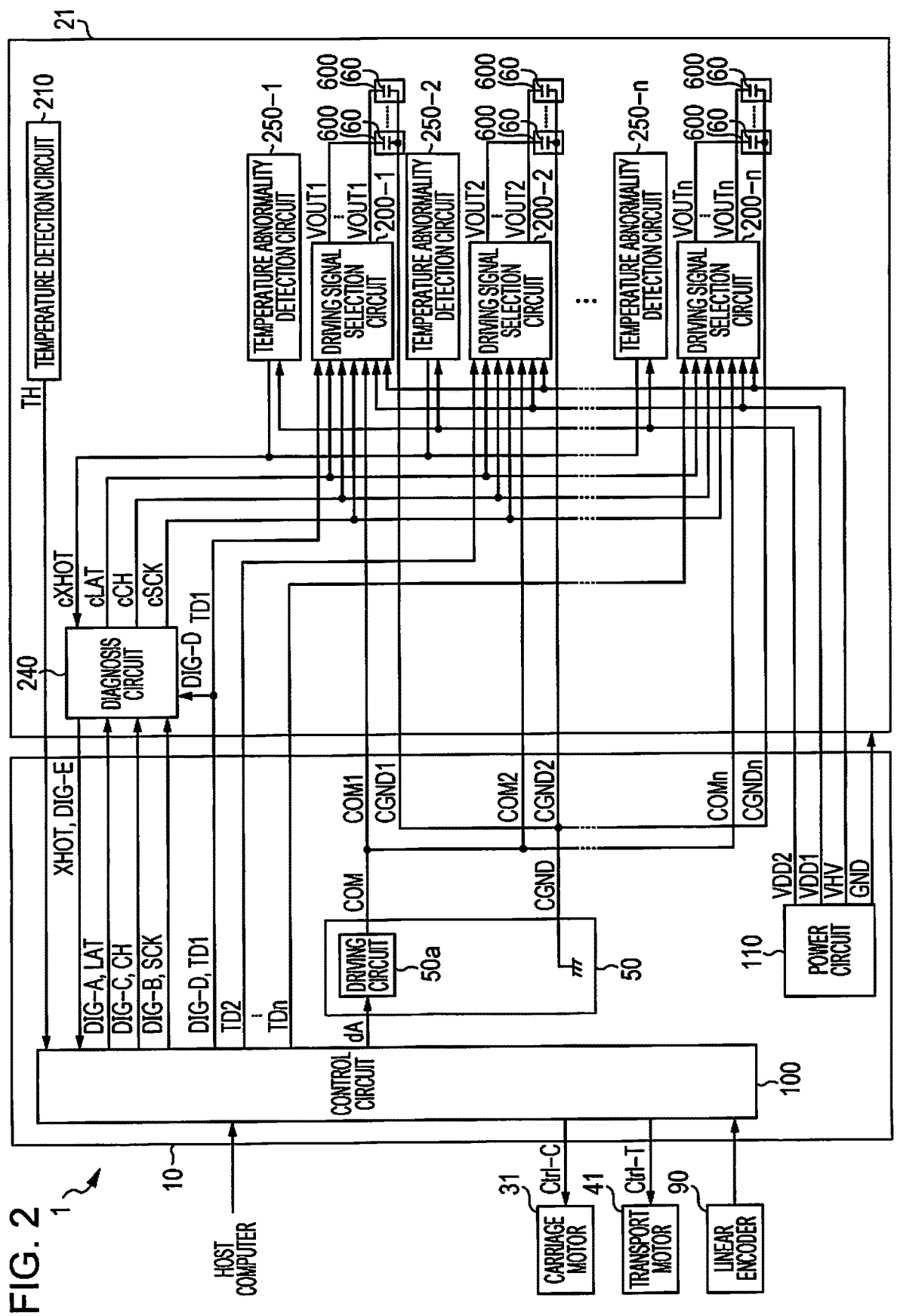
FIG. 2 is a block diagram illustrating an electrical configuration of the liquid discharge apparatus.

FIG. 2 is a block diagram illustrating an electrical configuration of the liquid discharge apparatus 1. The liquid discharge apparatus 1 includes the control mechanism 10, the print head 21, the carriage motor 31, the transport motor 41, and a linear encoder 90.

The control mechanism 10 includes a driving signal output circuit 50, a control circuit 100, and a power circuit 110. The control circuit 100 includes, for example, a processor such as a microcontroller. The control circuit 100 generates and outputs data or various signals for controlling the liquid discharge apparatus 1 based on the various signals such as image data input from a host computer.

Specifically, the control circuit 100 grasps a scanning position of the print head 21 based on a detection signal input from the linear encoder 90. The control circuit 100 generates and outputs various signals in accordance with the scanning position of the print head 21. In detail, the control circuit 100 generates the control signal Ctrl-C for controlling the reciprocation of the print head 21 and outputs the control signal Ctrl-C to the carriage motor 31. In addition, the control circuit 100 generates the control signal Ctrl-T for controlling the transport of the medium P and outputs the control signal Ctrl-T to the transport motor 41. The control signal Ctrl-C may be input to the carriage motor 31 after signal conversion through a carriage motor driver (not illustrated), and similarly, the control signal Ctrl-T may be input to the transport motor 41 after signal conversion through a transport motor driver (not illustrated).

In addition, the control circuit 100 generates setting signals TD1 to TDn, a change signal CH, a latch signal LAT, and a clock signal SCK as the control signal Ctrl-H for controlling the print head 21 and outputs the setting signals TD1 to TDn, the change signal CH, the latch signal LAT, and the clock signal SCK to the print head 21, based on the various signals such as image data input from the host computer and the scanning position of the print head 21.

In addition, the control circuit 100 generates diagnosis signals DIG-A to DIG-D for diagnosing whether or not the print head 21 can discharge liquid normally and outputs the diagnosis signals DIG-A to DIG-D to the print head 21. Here, in the liquid discharge apparatus 1 in the first embodiment, each of the diagnosis signals DIG-A to DIG-D, and each of the latch signal LAT, the clock signal SCK, the change signal CH, and the setting signals TD1 are input to the print head 21 through the common propagation path. Specifically, the diagnosis signal DIG-A and the latch signal LAT are input through the common propagation path, the diagnosis signal DIG-B and the clock signal SCK are input through the common propagation path, the diagnosis signal DIG-C and the change signal CH are input through the common propagation path, and the diagnosis signal DIG-D and the setting signal TD1 are input through the common propagation path.

In addition, the control circuit 100 outputs a driving control signal dA, which is a digital signal, to the driving signal output circuit 50.

The driving signal output circuit 50 includes a driving circuit 50a. The driving control signal dA is input to the driving circuit 50a. The driving circuit 50a converts the driving control signal dA into a digital/analog signal, and then the converted analog signal is class-D amplified to generate the driving signal COM. That is, the driving control signal dA is a digital signal which specifies a waveform of the driving signal COM, and the driving signal output circuit 50 generates and outputs the driving signal COM by class-D amplifying the waveform specified by the driving control signal dA. Therefore, the driving control signal dA may be a signal which can specify the waveform of the driving signal COM, and for example, the driving control signal dA may be an analog signal. The driving circuit 50a included in the driving signal output circuit 50 may amplify the waveform specified by the driving control signal dA, and for example, may be constituted by a class-A amplification circuit, a class-B amplification circuit, a class-AB amplification circuit, or the like.

In addition, the driving signal output circuit 50 outputs a reference voltage signal CGND representing a reference potential of the driving signal COM. The reference voltage signal CGND may be a ground potential signal having a voltage value of 0 V, and may be a direct current (DC) voltage signal having a voltage value of 6 V or the like.

The driving signal COM and the reference voltage signal CGND are output to the print head 21 after being branched by the control mechanism 10. Specifically, the driving signal COM is branched into n driving signals COM1 to COMn each corresponding to n driving signal selection circuits 200 (described later) in the control mechanism 10, and then is output to the print head 21. Similarly, the reference voltage signal CGND is output to the print head 21 after being branched into n reference voltage signals CGND1 to CGNDn by the control mechanism 10. The driving signal COM is an example of the driving signal, and each of the driving signals COM1 to COMn into which the driving signal COM is branched is also an example of the driving signal.

The power circuit 110 generates and outputs voltages VHV, VDD1, and VDD2 and a ground signal GND. The voltage VHV is a DC voltage signal having a voltage value of, for example, 42 V. In addition, the voltages VDD1 and VDD2 are DC voltage signals having a voltage value of, for example, 3.3 V. In addition, the ground signal GND is a signal representing a reference potential of the voltages VHV, VDD1, and VDD2, and for example, is a ground potential signal having a voltage value of 0 V. The voltage VHV is used as a voltage for amplification in the driving signal output circuit 50, and each of the voltages VDD1 and VDD2 are used as a power supply voltage or a control voltage of various configurations in the control mechanism 10. In addition, the voltages VHV, VDD1, and VDD2, and the ground signal GND are output to the print head 21. Note that, the voltage values of the voltages VHV, VDD1, and VDD2 and the ground signal GND are not respectively limited to 42 V, 3.3 V, and 0 V described above. In addition, the power circuit 110 generates and outputs a signal having a plurality of voltage values other than the voltages VHV, VDD1, and VDD2 and the ground signal GND.

As described above, the control circuit 100 generates various signals for controlling the operation of the print head 21 and outputs the various signals to the print head 21. That is, the control circuit 100 controls the operation of the print head 21.

The print head 21 includes driving signal selection circuits 200-1 to 200-n, a temperature detection circuit 210, a diagnosis circuit 240, temperature abnormality detection circuits 250-1 to 250-n, and a plurality of discharge sections 600.

In the diagnosis circuit 240, each of a set of the diagnosis signal DIG-A and the latch signal LAT, a set of the diagnosis signal DIG-B and the clock signal SCK, a set of the diagnosis signal DIG-C and the change signal CH, and a set of the diagnosis signal DIG-D and the setting signal TD1 is propagated and input through common wiring. The diagnosis circuit 240 diagnoses whether or not the ink can be normally discharged based on the diagnosis signals DIG-A to DIG-D. In other words, the diagnosis circuit 240 determines whether or not the ink can be normally discharged based on the diagnosis signals DIG-A to DIG-D.

For example, the diagnosis circuit 240 may detect whether or not the voltage value of one of the input diagnosis signals DIG-A to DIG-D or all of the signals is normal, and may diagnose whether or not the print head 21 and the control mechanism 10 are normally coupled to each other based on the detection result. In addition, the diagnosis circuit 240 may operate any configurations of the driving signal selection circuits 200-1 to 200-n and a piezoelectric element 60 that are included in the print head 21 in accordance with a logical level of any of the input diagnosis signals DIG-A to DIG-D or a combination of logical levels of all of the signals, detect whether or not the voltage value due to the operation is normal, and diagnose whether or not the print head 21 can be operated normally based on the detection result. That is, the print head 21 performs self-diagnosis whether or not the ink can be normally discharged based on the diagnosis result of the diagnosis circuit 240. Here, the diagnosis signal DIG-A is an example of a second signal, the diagnosis signal DIG-B is an example of a fourth signal, the diagnosis signal DIG-C is an example of a third signal, and the diagnosis signal DIG-D is an example of a first signal.

When the diagnosis circuit 240 determines that the ink can be normally discharged from the print head 21, the diagnosis circuit 240 outputs the latch signal LAT, the clock signal SCK, and the change signal CH as a latch signal cLAT, a clock signal cSCK, and a change signal cCH. After the diagnosis signal DIG-D and the setting signal TD1 are branched in the print head 21, the branched one signal is input to the diagnosis circuit 240 and the branched other signal is input to the driving signal selection circuit 200-1. In other words, the setting signal TD1 is input to the driving signal selection circuit 200-1 not through the diagnosis circuit 240.

The change signal cCH, the latch signal cLAT, and the clock signal cSCK output from the diagnosis circuit 240 may be the signals having the same waveform as the change signal CH, the latch signal LAT, and the clock signal SCK input to the diagnosis circuit 240. That is, when the diagnosis circuit 240 determines that the ink can be normally discharged from the print head 21, a terminal of the diagnosis circuit 240 to which the latch signal LAT, the clock signal SCK, and the change signal CH are each input and a terminal of the diagnosis circuit 240 from which the latch signal cLAT, the clock signal cSCK, and the change signal cCH are each input may be electrically coupled to each other inside the diagnosis circuit 240. In addition, each of the change signal cCH, the latch signal cLAT, and the clock signal cSCK may be a signal in which the waveform of each of the change signal CH, the latch signal LAT, and the clock signal SCK is corrected.

In addition, the diagnosis circuit 240 generates the diagnosis signal DIG-E representing the diagnosis result based on the diagnosis signals DIG-A to DIG-D, and outputs the diagnosis signal DIG-E to the control circuit 100. Here, the diagnosis circuit 240 includes one or a plurality of integrated circuit (IC) devices.

The voltages VHV and VDD1, the driving signals COM1 to COMn, the setting signals TD1 to TDn, the clock signal cSCK, the latch signal cLAT, and the change signal cCH are input to the driving signal selection circuits 200-1 to 200-n, respectively. Each of the voltages VHV and VDD1 functions as a power supply voltage and a control voltage of the driving signal selection circuits 200-1 to 200-n. The driving signal selection circuits 200-1 to 200-n generate driving signals VOUT1 to VOUTn by selecting or non-selecting the driving signals COM1 to COMn, respectively, based on the input setting signals TD1 to TDn, the input clock signal cSCK, the input latch signal cLAT, and the input change signal cCH.

The driving signals VOUT1 to VOUTn generated by respective driving signal selection circuits 200-1 to 200-n are supplied to the piezoelectric element 60 included in the corresponding discharge section 600. The piezoelectric element 60 is displaced by the driving signals VOUT1 to VOUTn supplied thereto. Ink the amount of which depends on the displacement caused by the piezoelectric element 60 is discharged from the discharge section 600.

Specifically, the driving signal COM1, the setting signal TD1, the latch signal cLAT, the change signal cCH, and the clock signal cSCK are input to the driving signal selection circuit 200-1. The driving signal selection circuit 200-1 generates and outputs the driving signal VOUT1 by selecting or non-selecting the waveform of the driving signal COM1 based on the setting signal TD1, the latch signal cLAT, the change signal cCH, and the clock signal cSCK. The driving signal VOUT1 is supplied to one end of the piezoelectric element 60 in the discharge section 600 provided corresponding to the driving signal VOUT1. In addition, the reference voltage signal CGND1 is supplied to the other end of the piezoelectric element 60. Then, the piezoelectric element 60 is displaced by a potential difference between the driving signal VOUT1 and the reference voltage signal CGND1.

Similarly, a driving signal COMi (i is any one of 1 to n), a setting signal TDi, the latch signal cLAT, the change signal cCH, and the clock signal cSCK are input to the driving signal selection circuit 200-i. The driving signal selection circuit 200-i generates and outputs the driving signal VOUTi by selecting or non-selecting the waveform of the driving signal COMi based on the setting signal TDi, the latch signal cLAT, the change signal cCH, and the clock signal cSCK. The driving signal VOUTi is supplied to one end of the piezoelectric element 60 in the discharge section 600 provided corresponding to the driving signal VOUTi. In addition, a reference voltage signal CGNDi is supplied to the other end of the piezoelectric element 60. Then, the piezoelectric element 60 is displaced by a potential difference between the driving signal VOUTi and the reference voltage signal CGNDi.

The print head 21 has a plurality of piezoelectric elements 60 each corresponding to the n driving signal selection circuits 200-1 to 200-n. In other words, the print head 21 has a plurality of driving element groups including a driving element group formed of the plurality of piezoelectric elements 60 corresponding to the driving signal selection circuit 200-1 and a driving element group formed of the plurality of piezoelectric elements 60 corresponding to the driving signal selection circuit 200-2. In addition, each of the driving signal selection circuits 200-1 to 200-n has the same circuit configuration. Thus, when it is not required to distinguish the driving signal selection circuits 200-1 to 200-n in the following description, the driving signal selection circuits 200-1 to 200-n is referred to as a driving signal selection circuit 200, and in this case, the driving signals COM1 to COMn input to the driving signal selection circuit 200 is referred to as a driving signal COM, the setting signals TD1 to TDn are referred to as a setting signal TD, and the driving signals VOUT1 to VOUTn output from the driving signal selection circuit 200 are referred to as a driving signal VOUT. Details of an operation of the driving signal selection circuit 200 will be described later. Here, each of the driving signal selection circuits 200-1 to 200-i is configured as, for example, an integrated circuit device. In addition, among the setting signals TD1 to TDn input to and corresponding to each of the driving signal selection circuits 200-1 to 200-n, the setting signal TD1 input to the driving signal selection circuit 200-1 and specifying the selection of the waveform of the driving signal COM1 is an example of a fifth signal.

The temperature abnormality detection circuits 250-1 to 250-n are provided corresponding to each of the driving signal selection circuits 200-1 to 200-n. The temperature abnormality detection circuits 250-1 to 250-n diagnose whether or not there is temperature abnormality in the corresponding driving signal selection circuits 200-1 to 200-n. Specifically, the temperature abnormality detection circuits 250-1 and 250-n operate by using the voltage VDD2 as a power supply voltage. When each of the temperature abnormality detection circuits 250-1 to 250-n detects a temperature of the corresponding driving signal selection circuits 200-1 to 200-n and determines that the temperature is normal, each of the temperature abnormality detection circuits 250-1 to 250-n generates an abnormality signal cXHOT of a high level (H level) and outputs the abnormality signal cXHOT to the diagnosis circuit 240. Meanwhile, when each of the temperature abnormality detection circuits 250-1 to 250-n determines that there is temperature abnormality in the corresponding driving signal selection circuits 200-1 to 200-n, each of the temperature abnormality detection circuits 250-1 to 250-n generates the abnormality signal cXHOT of a low level (L level) and outputs the abnormality signal cXHOT to the diagnosis circuit 240.

The diagnosis circuit 240 determines whether or not there is temperature abnormality in the driving signal selection circuits 200-1 to 200-n based on the logical level of the input abnormality signal cXHOT, and outputs an abnormality signal XHOT based on the determination result. That is, each of the temperature abnormality detection circuits 250-1 to 250-n determines that there is temperature abnormality in the driving signal selection circuits 200-1 to 200-n is also an example of self-diagnosis of the print head 21. The diagnosis circuit 240 may output the abnormality signal XHOT of the specific logical level or may output the input abnormality signal cXHOT as it is as the abnormality signal XHOT, based on whether or not there is temperature abnormality in the driving signal selection circuits 200-1 to 200-n. In other words, the abnormality signal cXHOT may be output to the control circuit 100 as the abnormality signal XHOT through the diagnosis circuit 240. As described above, the diagnosis signal DIG-E and the abnormality signal XHOT generated by the diagnosis circuit 240 propagate to the control circuit 100 through the common propagation path.

In addition, each of the temperature abnormality detection circuits 250-1 to 250-n has the same circuit configuration. For this reason, when it is not required to distinguish the temperature abnormality detection circuits 250-1 to 250-n in the following description, the temperature abnormality detection circuits 250-250-n are referred to as a temperature abnormality detection circuit 250. Details of the temperature abnormality detection circuit 250 will be described later. In addition, each of the temperature abnormality detection circuits 250-1 to 250-i is configured as, for example, an integrated circuit device, otherwise, a temperature abnormality detection circuit 250-i and the corresponding driving signal selection circuit 200-i may be configured as one integrated circuit device.

The temperature detection circuit 210 includes a temperature detection element such as a thermistor. The temperature detection circuit 210 generates a temperature signal TH of an analog signal having temperature information of the print head 21 based on the detection signal detected by the temperature detection element, and outputs the temperature signal TH to the control circuit 100.

1.3. Example of Waveform of Driving Signal

Here, FIG. 3 illustrates an example of a waveform of the driving signal COM generated by the driving signal output circuit 50, and FIG. 4 illustrates an example of a waveform of the driving signal VOUT supplied to the piezoelectric element 60.

FIG. 3 is a view illustrating an example of a waveform of the driving signal COM. As illustrated in FIG. 3, the driving signal COM is a waveform in which a trapezoid waveform Adp1, a trapezoid waveform Adp2, and a trapezoid waveform Adp3 are continuous, the trapezoid waveform Adp1 being arranged in a period T1 from the rise of the latch signal LAT until the rise of the change signal CH, the trapezoid waveform Adp2 being arranged in a period T2 until the rise of the next change signal CH after the period T1, and the trapezoid waveform Adp3 being arranged in a period T3 until the rise of the next latch signal LAT after the period T2. When the trapezoid waveform Adp1 is supplied to one end of the piezoelectric element 60, a moderate amount of ink is discharged from the discharge section 600 corresponding to the piezoelectric element 60. In addition, when the trapezoid waveform Adp2 is supplied to one end of the piezoelectric element 60, an amount less than the moderate amount of ink is discharged from the discharge section 600 corresponding to the piezoelectric element 60. In addition, when the trapezoid waveform Adp3 is supplied to one end of the piezoelectric element 60, the ink is not discharged from the discharge section 600 corresponding to the piezoelectric element 60. The trapezoid waveform Adp3 is a waveform for micro-vibrating the ink in the vicinity of a nozzle open hole of the discharge section 600 and for preventing an increase in ink viscosity.

Here, as illustrated in FIG. 3, a cycle Ta from the rise of the latch signal LAT until the rise of the next latch signal LAT corresponds to a printing cycle forming new dots to the medium P. As described above, the latch signal LAT and the latch signal cLAT are signals specifying a discharge timing of the ink from the print head 21, and the change signal CH and the change signal cCH are signals specifying a waveform switching timing of the trapezoid waveforms Adp1, Adp2, and Adp3 included in the driving signal COM. The latch signal LAT is an example of a sixth signal, and the change signal CH is an example of a seventh signal.

Here, the setting signal TD includes data corresponding to the number of discharge sections 600 of the print head 21 in the cycle Ta. That is, the setting signal TD includes data of the logical level corresponding to the number of discharge sections 600 in the cycle Ta. In other words, a frequency of the setting signal TD is higher than frequencies of the change signal CH and the change signal cCH.

In addition, voltages in start and end timings of all of the trapezoid waveforms Adp1, Adp2, and Adp3 are common to the voltage Vc. That is, each of the trapezoid waveforms Adp1, Adp2, and Adp3 is a waveform which starts and ends at the voltage Vc. The driving signal COM may be a signal of a waveform in which one or two trapezoid waveforms are continuous in the cycle Ta, and may be a signal of a waveform in which four or more trapezoid waveforms are continuous.

As described above, the driving signal COM includes the trapezoid waveforms Adp1, Adp2, and Adp3 for making the ink be discharged from the print head 21, and a waveform of the voltage Vc provided between the trapezoid waveform Adp1 and the trapezoid waveform Adp2, and between the trapezoid waveform Adp2 and the trapezoid waveform Adp3. Here, any one of the trapezoid waveforms Adp1, Adp2, and Adp3 are an example of a first waveform, any different one of trapezoid waveforms Adp1, Adp2, and Adp3 are an example of a second waveform, and the waveform of the voltage Vc is an example of constant voltage waveform.

In addition, the trapezoid waveforms Adp1, Adp2, and Adp3 included in the driving signal COM are generated in a period specified in the change signal CH in the cycle Ta specified by the LAT. That is, the trapezoid waveforms Adp1, Adp2, and Adp3 are output in a period between the latch signal LAT and the change signal CH, between the change signal CH and the change signal CH, and between the change signal CH and the latch signal LAT, respectively. In other words, the latch signal LAT and the change signal CH are input to the print head 21 in a period during which the driving signal COM is the voltage Vc. Therefore, a possibility that the high-voltage driving signal COM interferes with the change signal CH and the latch signal LAT is reduced, and influence on discharge accuracy of ink can be reduced even if slight delays occurs to the change signal CH and the latch signal LAT.

FIG. 4 is a view illustrating an example of a waveform of the driving signal VOUT corresponding to each of a "large dot", a "medium dot", "small dot", and a "non-recorded".

As illustrated in FIG. 4, the driving signal VOUT corresponding to the "large dot" has a waveform in which the trapezoid waveform Adp1, the trapezoid waveform Adp2, and the constant waveform are continuous in the cycle Ta, the trapezoid waveform Adp1 being arranged in the period T1, the trapezoid waveform Adp2 being arranged in the period T2, and the constant waveform at the voltage Vc being arranged in the period T3. When the driving signal VOUT is supplied to one end of the piezoelectric element 60, a moderate amount of ink and a small amount of ink are discharged from the discharge section 600 corresponding to the piezoelectric element 60 in the cycle Ta. Thus, the large dot is formed on the medium P by landing and combining the moderate amount of ink and the small amount of ink.

The driving signal VOUT corresponding to the "medium dot" has a waveform in which the trapezoid waveform Adp1, and the constant waveform are continuous in the cycle Ta, the trapezoid waveform Adp1 being arranged in the period T1 and the constant waveform at the voltage Vc being arranged in the periods T2 and T3. When the driving signal VOUT is supplied to one end of the piezoelectric element 60, a moderate amount of ink is discharged from the discharge section 600 corresponding to the piezoelectric element 60 in the cycle Ta. Thus, the medium dot is formed on the medium P by landing the moderate amount of ink.

The driving signal VOUT corresponding to the "small dot" has a waveform in which the constant waveform and the trapezoid waveform Adp2 are continuous in the cycle Ta, the constant waveform at the voltage Vc being arranged in the periods T1 and T3 and the trapezoid waveform Adp2 being arranged in the period T2. When the driving signal VOUT is supplied to one end of the piezoelectric element 60, a small amount of ink is discharged from the discharge section 600 corresponding to the piezoelectric element 60 in the cycle Ta. Thus, the small dot is formed on the medium P by landing and the small amount of ink.

The driving signal VOUT corresponding to the "non-recorded" has a waveform in which the constant waveform and the trapezoid waveform Adp3 are continuous in the cycle Ta, the constant waveform being arranged in the periods T1 and T2 with the voltage Vc and the trapezoid waveform Adp3 being arranged in the period T3. When the driving signal VOUT is supplied to one end of the piezoelectric element 60, the ink is not discharged by only micro-vibrating the ink in the vicinity of the nozzle open hole of the discharge section 600 corresponding to the piezoelectric element 60 in the cycle Ta. Thus, a dot is not formed on the medium P without landing the ink.

The constant waveform at the voltage Vc is also a waveform including a voltage in which the previous voltage Vc is held by the capacity component of the piezoelectric element 60 when none of the trapezoid waveforms Adp1, Adp2, and Adp3 are not selected as the driving signal VOUT. For this reason, the voltage Vc is supplied to the piezoelectric element 60 as the driving signal VOUT when none of the trapezoid waveforms Adp1, Adp2, and Adp3 are not selected as the driving signal VOUT.

As illustrated in FIGS. 3 and 4, the driving signal COM and the driving signal VOUT are merely an example, and a combination of various waveforms may be used in accordance with a moving speed of the carriage 20 mounted on the print head 21, physical properties of ink supplied to the print head 21, a material of the medium P, and the like.

1.4. Configuration of Driving Signal Selection Circuit

Figure 5:
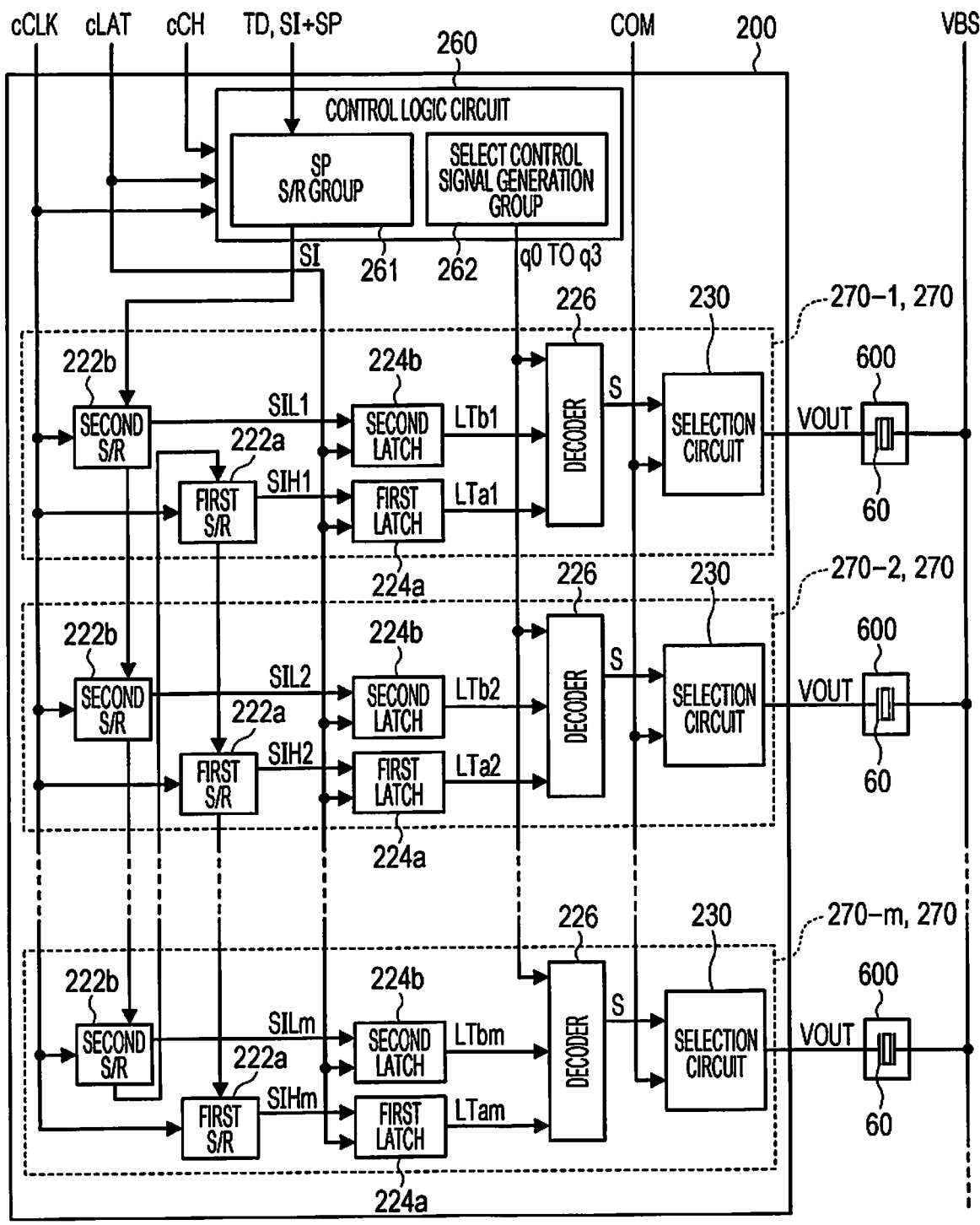
FIG. 5 is a view illustrating a configuration of a driving signal selection circuit.

Next, FIGS. 5 to 8 illustrate a configuration and an operation of the driving signal selection circuit 200. FIG. 5 is a view illustrating a configuration of the driving signal selection circuit 200. As illustrated in FIG. 5, the driving signal selection circuit 200 includes a control logic circuit 260 and a plurality of selection control circuits 270. The plurality of selection control circuits 270 are provided corresponding to the plurality of discharge sections 600, respectively. In other words, the driving signal selection circuit 200 includes the selection control circuits 270 having the same number as the total number m of the discharge section 600. In the following description, a sequence in which the setting signal TD is input from the upstream to the driving signal selection circuit 200 is referred to as a first step, a second step, ..., and an m-th step, and the selection control circuit 270 corresponding to each of the first step, second step, ..., and the m-th step may be referred to as selection control circuits 270-1, 270-2, ..., and 270-m.

The setting signal TD, the latch signal cLAT, the change signal cCH, the clock signal cSCK, and the driving signal COM are input to the driving signal selection circuit 200. In addition, the driving signal selection circuit 200 selects or non-selects the trapezoid waveforms Adp1, Adp2, and Adp3 included in the driving signal COM based on the setting signal TD, the latch signal cLAT, the change signal cCH, and the clock signal cSCK, thereby outputting the trapezoid waveforms Adp1, Adp2, and Adp3 as the driving signal VOUT.

The control logic circuit 260 includes an SP shift register (S/R) group 261 and the selection control signal generation group 262. The SP shift register group 261 holds a setting data signal SP included in the setting signal TD input in synchronization with the clock signal cSCK. The selection control signal generation group 262 latches the setting data signal SP held in the SP shift register group 261 and generates and outputs selection control signals q0 to q3 based on the latched setting data signal SP.

The selection control circuit 270 includes a first shift resistor 222a, a second shift register 222b, a first latch circuit 224a, a second latch circuit 224b, a decoder 226, and a selection circuit 230.

The first shift transistor 222a and the second shift register 222b hold a print data signal SI included in the setting signal TD input in synchronization with the clock signal cSCK. Specifically, the setting signal TD includes data of high-order print data SIH and low-order print data SIL each of which corresponds to the plurality of discharge sections 600 as the print data signal SI. In the print data signal SI which synchronizes with and propagates in the clock signal cSCK, the high-order print data SIH is held by the first shift register 222a, and the lower-order print data SIL is held in the second shift register 222b. The high-order print data SIH held in the first shift register 222a and the lower-order print data SIL held in the second shift register 222b specify an amount of ink discharged from the corresponding discharge section 600. In the following description, the high-order print data SIH and the lower-order print data SIL corresponding to the discharge section 600 may be referred to as print data [SIH, SIL], and the print data [SIH, SIL] corresponding to the discharge section 600 in each of the first to m-th steps may be referred to as print data [SIH1, SIL1], print data [SIH2, SIL2], ..., and print data [SIHm, SILm].

The SP shift register group 261, the first shift register 222a, and the second shift register 222b are cascaded to the driving signal selection circuit 200. Specifically, the SP shift register group 261, the first shift register 222a, and the second shift register 222b are cascaded to the driving signal selection circuit 200, in order of the SP shift register group 261, the second shift register 222b corresponding to each of the first to m-th steps, and the first shift register 222a corresponding to each of the first to m-th steps. That is, the setting signal TD synchronizes with the clock signal cSCK and transfers in order of the SP shift register group 261, the second shift register 222b corresponding to each of the first to m-th steps, and the first shift register 222a corresponding to each of the first to m-th steps.

That is, the setting signal TD is a serial signal including the setting data signal SP, the high-order print data SIH, and the lower-order print data SIL in order of the high-order print data SIH corresponding to the discharge section 600 in each of the m-th to first steps, the lower-order print data SIL corresponding to the discharge section 600 in each of the m-th to first steps, and the setting data signal SP. By transferring the setting signal TD in order of the SP shift register group 261, the second shift register 222b, and the first shift resister 222a, the setting data signal SP is held in the SP shift register group 261, the lower-order print data SIL corresponding to the discharge section 600 in each of the first to m-th steps is held in the second shift register 222b, and the high-order print data SIH corresponding to the discharge section 600 in each of the first to m-th steps is held in the first shift register 222a.

The high-order print data SIH corresponding to the discharge section 600 in each of the first to m-th steps held in the first shift register 222a is latched by the first latch circuit 224a corresponding to the discharge section 600 in each of the first to m-th steps at the rise of the latch signal cLAT. In addition, the low-order print data SIL corresponding to the discharge section 600 in each of the first to m-th steps held in the second shift register 222b is latched by the second latch circuit 224b corresponding to the discharge section 600 in each of the first to m-th steps at the rise of the latch signal cLAT.

The first latch circuit 224a outputs the latched high-order print data SIH as latch data LTa, and the second latch circuit 224b outputs the latched lower-order print data SIL as latch data LTb. In the following description, the latch data LTa output from the first latch circuit 224a corresponding to the discharge section 600 in each of the first step, the second step, ..., and the m-th step may be referred to as latch data LTa1, LTa2, ..., and LTam, and the latch data LTb output from the second latch circuit 224b corresponding to the discharge section 600 in each of the first step, the second step, ..., and the m-th step may be referred to as latch data LTb1, LTb2, ..., and LTbm. In addition, In the following description, the latch data [LTa, LTb] may be referred to as latch data [LTa, LTb], and the latch data [LTa, LTb] corresponding to the discharge section 600 in each of the first step, the second step, ..., and the m-th step may be referred to as latch data [LTa1, LTb1], latch data [LTa2, LTb2], ..., and latch data [LTam, LTbm].

The selection control signals q0 to q3 and the latch data [LTa, LTb] corresponding to the print data [SIH, SIL] are input to the decoder 226. In addition, the decoder 226 generates and outputs a selection signal S based on the selection control signals q0 to q3 and the latch data [LTa, LTb]. Here, the selection control signals q0 to q3 are signals for specifying a logical level of the selection signal S output in each of the periods T1, T2, and T3 illustrated in FIG. 3, and the latch data [LTa, LTb] is a signal for specifying the selection of the selection control signals q0 to q3. That is, the decoder 226 decodes the selection control signals q0 to q3 based on the latch data [LTa, LTb], thereby outputting the selection signal S of a predetermined logical level in each of the periods T1, T2, and T3. The selection signal S output from the decoder 226 may be converted into a high-amplitude logic signal based on the voltage VHV by a level shifter (not illustrated).

Figures 6, 7:
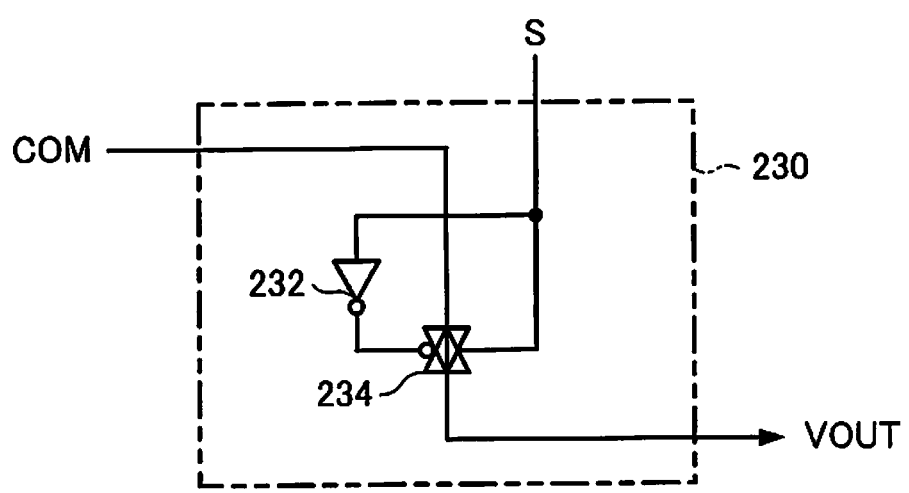
FIG. 6 is a table illustrating decoded contents of a decoder.
FIG. 7 is a view illustrating a configuration of a selection circuit corresponding to one discharge section.

FIG. 6 is a table illustrating decoded contents of a decoder 226. The selection control signal q0 specifies the logical level of the selection signal S as the H level, the H level, and the L level in the periods T1, T2, and T3, respectively. The selection control signal q1 specifies the logical level of the selection signal S as the H level, the L level, and the L level in the periods T1, T2, and T3, respectively. The selection control signal q2 specifies the logical level of the selection signal S as an L level, the H level, and the L level in the periods T1, T2, and T3, respectively. The selection control signal q3 specifies the logical level of the selection signal S as an L level, the L level, and the H level in the periods T1, T2, and T3, respectively.

The decoder 226 selects the selection control signals q0 to q3 based on the latch data [LTa, LTb] corresponding to the print data [SIH, SIL] latched by the first latch circuit 224a and the second latch circuit 224b. Specifically, the decoder 226 decodes the selection control signals q0 to q3 based on the latch data [LTa, LTb], thereby outputting the selection signal S of the corresponding logical level in accordance with the contents of FIG. 6 in each of the periods T1, T2, and T3. For example, in an example illustrated in FIG. 6, the decoder 226 outputs the selection signal S of the H level, the L level, and the L level specified by the selection control signal q1 in the periods T1, T2, and T3, respectively, when the latch data [LTa, LTb] input to the decoder 226 is [1, 0].

The selection signal S output from the decoder 226 is input to the selection circuit 230. FIG. 7 is a view illustrating a configuration of the selection circuit 230 corresponding to one discharge section 600. As illustrated in FIG. 7, the selection circuit 230 includes an inverter 232 which is a NOT circuit and the transfer gate 234. The selection signal S is input to a positive control terminal in which a round mark is not given to transfer gate 234 while logically inverted by the inverter 232 to input the selection signal S to a negative control terminal in which a round mark is given to the transfer gate 234. In addition, the driving signal COM is supplied to an input terminal of the transfer gate 234. Specifically, when the selection signal S is a H level, the transfer gate 234 gives conduction between the input terminal and the output terminal, and when the selection signal S is a L level, the transfer gate 234 does not give conduction between the input terminal and the output terminal. In addition, the driving signal VOUT is output from the output terminal of the transfer gate 234. In the following description, controlling the conduction between the input terminal and the output terminal is simply referred to as "turned on", and controlling the non-conduction between the input terminal and the output terminal is simply referred to as "turned off".

As described above, the setting signal TD, the latch signal cLAT, the change signal cCH, the clock signal cSCK, and the driving signal COM are input to the driving signal selection circuit 200. In addition, the driving signal VOUT is generated and output. Here, the setting signal TD includes the print data signal SI and the setting signal SP in a serial manner, and specifies the selection of waveform of the driving signal COM. The clock signal SCK and the clock signal cSCK are signals for specifying a timing of the setting signal TD to be input and specifying an operation timing of the print head 21. The clock signal SCK is an example of an eighth signal.

Figure 8:
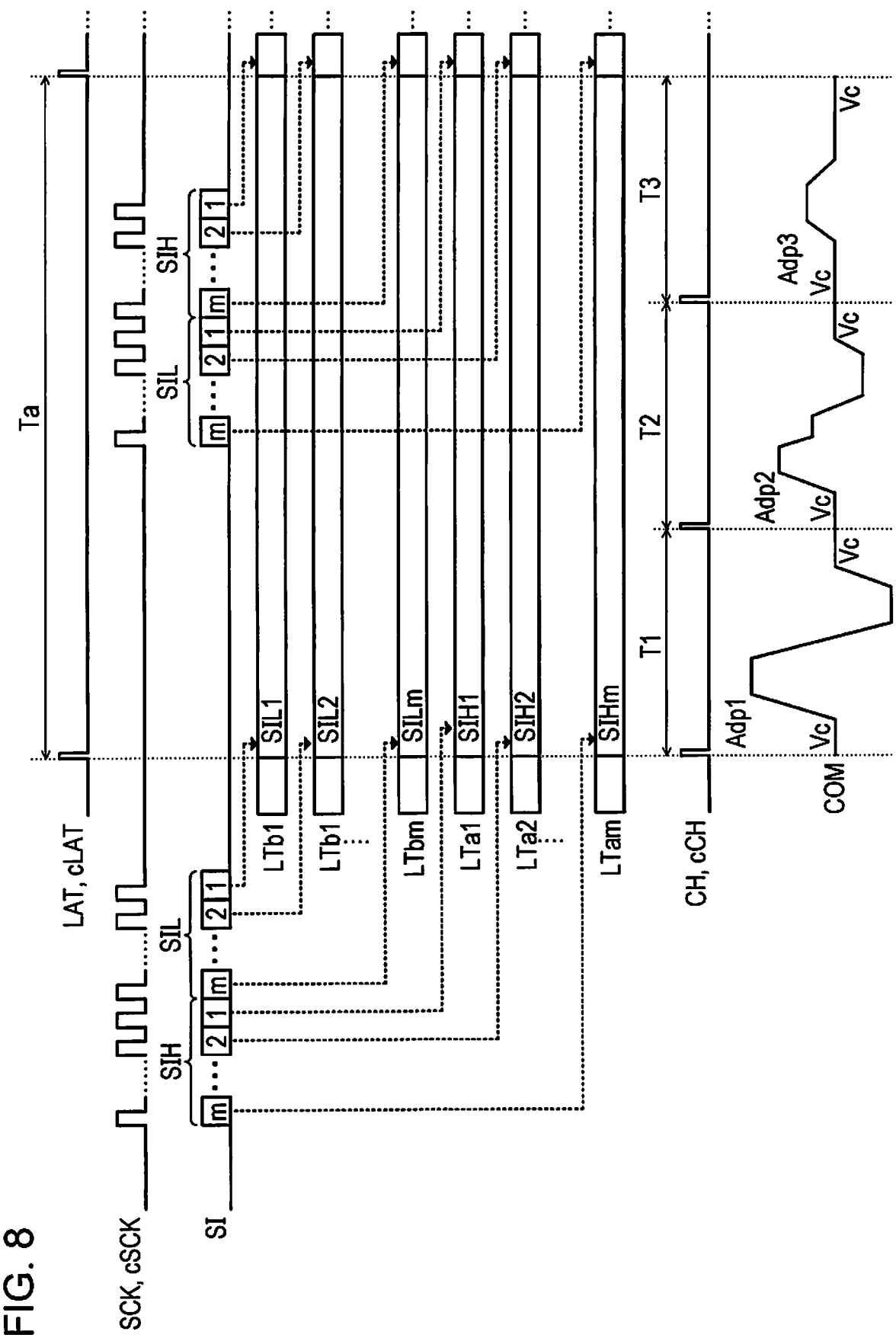
FIG. 8 is a view explaining an operation of the driving signal selection circuit.

Here, FIG. 8 illustrates an operation of the driving signal selection circuit 200. FIG. 8 is a view explaining an operation of the driving signal selection circuit 200. The print data signal SI included in the setting signal TD is serially input by synchronizing with the clock signal cSCK, and transferred to the second shift register 222b and the first shift register 222a in this order. When the input of the clock signal cSCK is stopped, the high-order print data SIH corresponding to each of the discharge sections 600 is held in the first shift register 222a and the lower-order print data SIL corresponding to the each of the discharge sections 600 is held in the second shift register 222b. In this case, the setting data signal SP is held in the SP shift register group 261.

When the latch signal cLAT rises, the selection control signal generation group 262 latches the setting data signal SP held in the SP shift register group 261. The selection control signal generation group 262 generates and outputs selection control signals q0 to q3 based on the latched setting data signal SP. When the latch signal cLAT rises, each first latch circuit 224a simultaneously latches the high-order print data SIH held in the first shift register 222a, and each second latch circuit 224b simultaneously latches the lower-order print data SIL held in the second shift register 222b.

The decoder 226 outputs the selection signal S of the logical level specified by the selection control signals q0 to q3 depending on a size of a dot specified by the latch data [LTa, LTb] which corresponds to the print data [SIH, SIL].

Specifically, the decoder 226 selects the selection control signal q0 when the print data [SIH, SIL] is [1, 1]. Therefore, the decoder 226 outputs the selection signal S of the H level, the H level, and the L level in the periods T1, T2, and T3, respectively. In this case, the selection circuit 230 selects the trapezoid waveform Adp1 in the period T1, selects the trapezoid waveform Adp2 in the period T2, and does not select the trapezoid waveform Adp3 in the period T3. As a result, the driving signal selection circuit 200 generates and outputs the driving signal VOUT corresponding to the "large dot" illustrated in FIG. 4.

Furthermore, the decoder 226 selects the selection control signal q1 when the print data [SIH, SIL] is [1, 0]. Therefore, the decoder 226 outputs the selection signal S of the H level, the L, level, and the L level in the periods T1, T2, and T3, respectively. In this case, the selection circuit 230 selects the trapezoid waveform Adp1 in the period T1, and does not select the trapezoid waveform Adp3 in the period T3 without selecting the trapezoid waveform Adp2 in the period T2. As a result, the driving signal selection circuit 200 generates and outputs the driving signal VOUT corresponding to the "medium dot" illustrated in FIG. 4.

Furthermore, the decoder 226 selects the selection control signal q2 when the print data [SIH, SIL] is [0, 1]. Therefore, the decoder 226 outputs the selection signal S of the L level, the H level, and the L level in the periods T1, T2, and T3, respectively. In this case, the selection circuit 230 selects the trapezoid waveform Adp2 in the period T2 without selecting the trapezoid waveform Adp1 in the period T1, and the trapezoid waveform Adp3 in the period T3. As a result, the driving signal selection circuit 200 generates and outputs the driving signal VOUT corresponding to the "small dot" illustrated in FIG. 4.

Furthermore, the decoder 226 selects the selection control signal q3 when the print data [SIH, SIL] is [0, 0]. Therefore, the decoder 226 outputs the selection signal S of the L level, the L level, and the H level in the periods T1, T2, and T3, respectively. In this case, the selection circuit 230 selects the trapezoid waveform Adp3 in the period T3 without selecting the trapezoid waveform Adp1 in the period T1 and the trapezoid waveform Adp2 in the period T2. As a result, the driving signal selection circuit 200 generates and outputs the driving signal VOUT corresponding to the "non-recorded" illustrated in FIG. 4.

As described above, the driving signal selection circuit 200 selects the waveform of the driving signal COM based on the setting signal TD, the latch signal cLAT, the change signal cCH, and the clock signal cSCK to generate and output the driving signal VOUT. In other words, the driving signal selection circuit 200 selects the waveform of the driving signal COM to generate and supply the drive signal VOUT to the piezoelectric element 60. Here, the driving signal VOUT is generated by selecting or non-selecting the waveform of the driving signal COM. Therefore, in a broad sense, the driving signal VOUT is also an example of the driving signal output from the driving signal output circuit 50.

1.5. Configuration of Temperature Abnormality Detection Circuit

Figure 9:
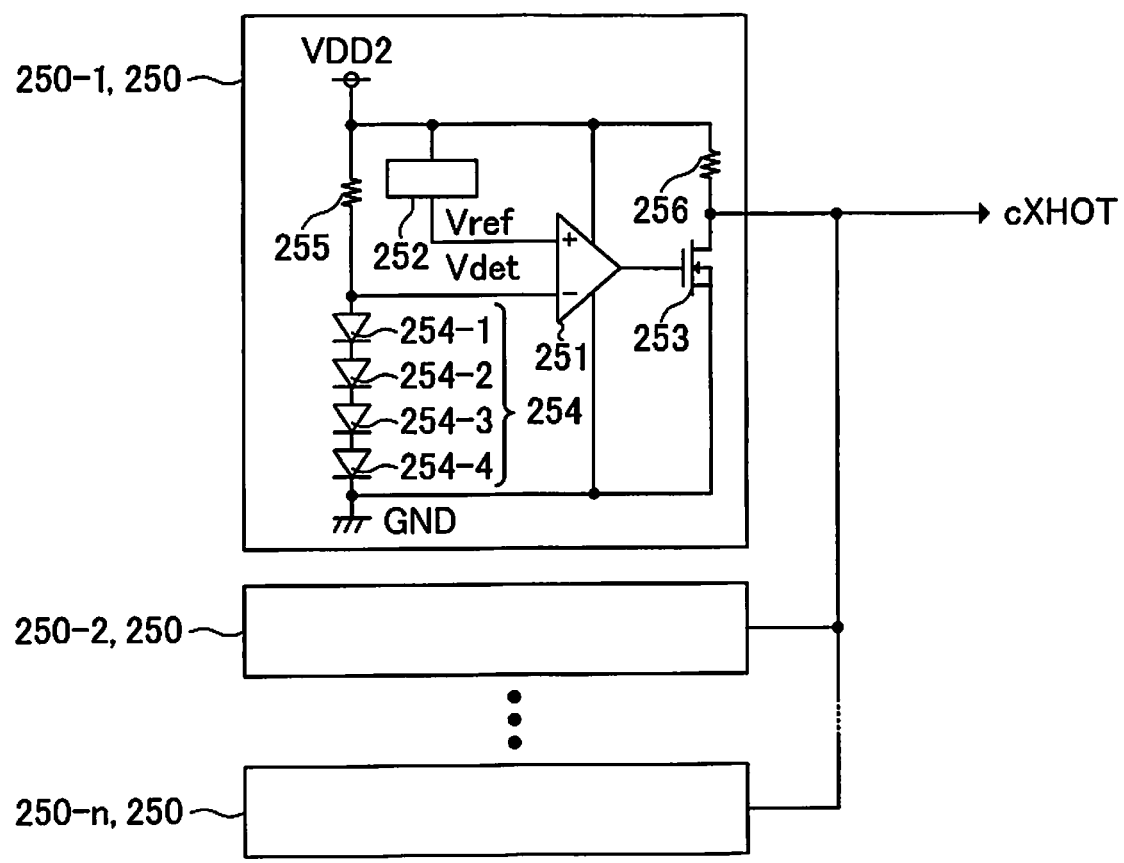
FIG. 9 is a view illustrating a configuration of a temperature abnormality detection circuit.

Next, FIG. 9 illustrates the driving signal selection circuit 250. FIG. 9 is a view illustrating a configuration of a temperature abnormality detection circuit 250. As illustrated in FIG. 9, the temperature abnormality detection circuit 250 includes a comparator 251, a reference voltage generation circuit 252, a transistor 253, a plurality of diodes 254, and resistors 255 and 256. As described above, all of the temperature abnormality detection circuits 250-1 to 250-$n$ have the same configuration. Therefore, details of the temperature abnormality detection circuits 250-2 to 250-$n$ are not illustrated in FIG. 9.

The voltage VDD2 is input to reference voltage generation circuit 252. The reference voltage generation circuit 252 generates a voltage Vref by converting the voltage VDD2 and supplies the voltage Vref to a positive side input terminal of the comparator 251. The reference voltage generation circuit 252 is configured of, for example, a voltage regulator circuit and the like.

The plurality of diodes 254 are coupled to each other in serial. Among the plurality of diodes 254 coupled in serial, the voltage VDD2 is supplied to an anode terminal of the diode 254 located at the highest potential side through the resistor 255, and the ground signal GND is supplied to a cathode terminal of the diode 254 located at the lowest potential side. Specifically, the temperature abnormality detection circuit 250 includes diodes 254-1, 254-2, 254-3, and 254-4 as the plurality of diodes 254. The voltage VDD2 is supplied to the anode terminal of the diode 254-1 through the resistor 255, and coupled to a negative side input terminal of the comparator 251. The cathode terminal of the diode 254-1 is coupled to the anode terminal of the diode 254-2. The cathode terminal of the diode 254-2 is coupled to the anode terminal of the diode 254-3. The cathode terminal of the diode 254-3 is coupled to the anode terminal of the diode 254-4. The ground signal GND is supplied to the cathode terminal of the diode 254-4. A voltage Vdet, which is a sum of a forward voltage of the each of the plurality of diodes 254, is supplied to the negative side input terminal of the comparator 251 by the resistor 255 and the plurality of diodes 254 configured as described above. In addition, the number of the plurality of diodes 254 are not limited to four.

The comparator 251 is operated depending on a potential difference between the voltage VDD2 and the ground signal GND. In addition, the comparator 251 compares a voltage Vref supplied to the positive input terminal with the voltage Vdet supplied to the negative side input terminal, and outputs a signal based on the comparison result from the output terminal.

The voltage VDD2 is supplied to a drain terminal of the transistor 253 through the resistor 256. In addition, a gate terminal of the transistor 253 is coupled to the output terminal of the comparator 251, and the ground signal GND is supplied to a source terminal. The voltage supplied to the drain terminal of the transistor 253 coupled as described above is output from the temperature abnormality detection circuit 250 as the abnormality signal cXHOT.

A value of the voltage Vref generated by the reference voltage generation circuit 252 is smaller than a value of the voltage Vdet when temperatures of the plurality of diodes 254 are within a predetermined range. In this case, the comparator 251 outputs the L-level signal. Therefore, the transistor 253 is controlled to be turned off, and as a result, the temperature abnormality detection circuit 250 outputs the H-level abnormality signal cXHOT.

The forward voltage of the diode 254 has characteristics that the forward voltage is lowered when the temperature rises. Therefore, when the temperature abnormality in the print head 21 occurs, the temperate of the diode 254 rises, and accordingly, the voltage Vdet is lowered. When the voltage Vdet is below the voltage Vref because of the temperature rise, the output signal of the comparator 251 is changed from the L level to the H level. Therefore, the transistor 253 is controlled to be turned on. As a result, the temperature abnormality detection circuit 250 outputs the L-level abnormality signal cXHOT.

As illustrated in FIG. 9, output of n temperature abnormality detection circuits 250-1 to 250-$n$ are coupled to each other in common. When the temperature abnormality occurs in any of the temperature abnormality detection circuits 250-1 to 250-$n$, the transistor 253 corresponding to the temperature abnormality detection circuit 250 where the temperature abnormality occurs is controlled to be turned on. As a result, the ground signal GND is supplied to a node where the temperature signal cXHOT is output through the transistor 253. Therefore, the abnormality signal cXHOT output from the temperature abnormality detection circuits 250-1 to 250-$n$ is controlled to the L level. That is, the temperature abnormality detection circuits 250-1 to 250-$n$ are wired-OR coupled to each other. Thus, even when the plurality of temperature abnormality detection circuits 250 are provided in the print head 21, the abnormality signal cXHOT indicating whether or not there is temperate abnormality of the print head 21 can propagate without increasing the number of wiring for propagating the abnormality signal cXHOT.

1.6. Configuration of Print Head

Figure 10:
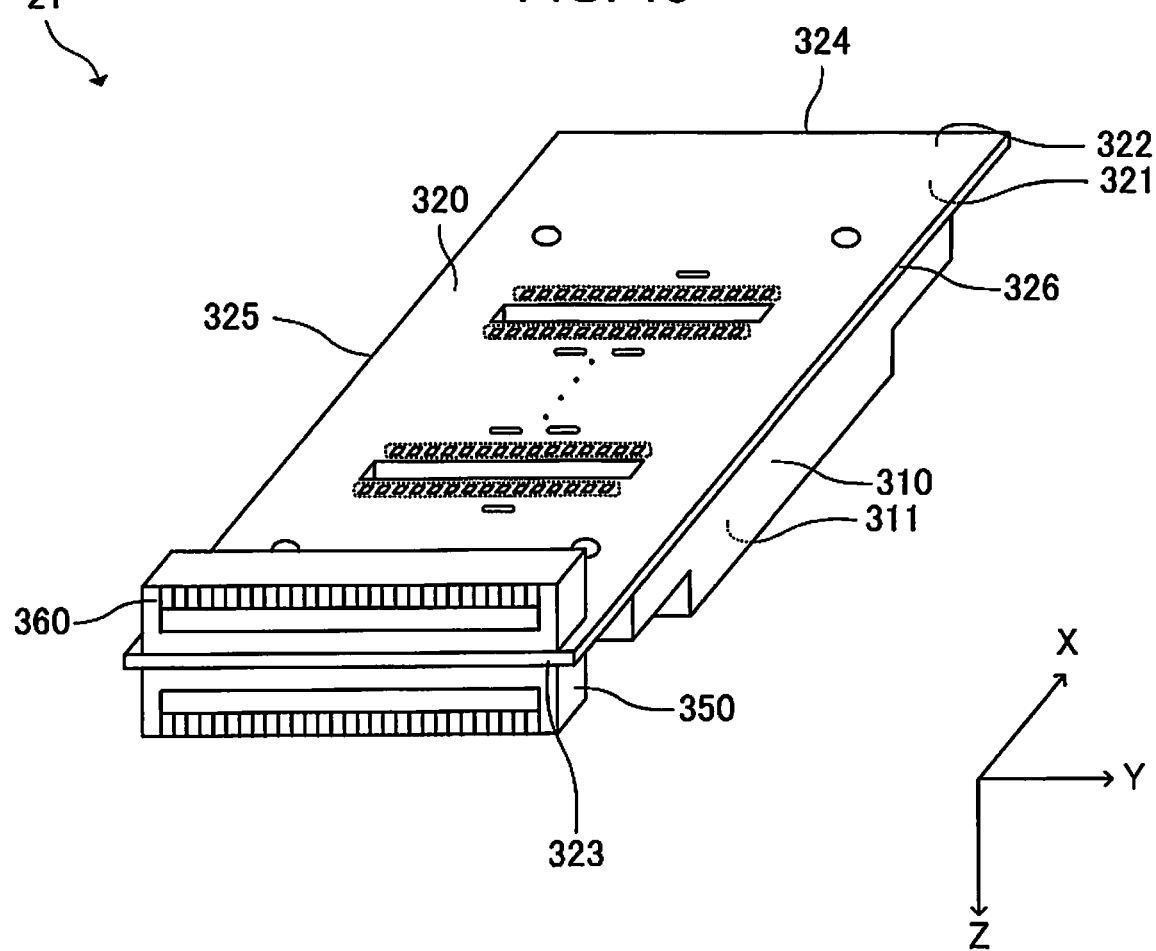
FIG. 10 is a perspective view illustrating a configuration of a print head.

Next, a configuration of the print head 21 will be described. FIG. 10 is a perspective view illustrating a configuration of the print head 21. As illustrated in FIG. 10, the print head 21 includes a head 310 and a substrate 320. In addition, an ink discharge surface 311 on which the plurality of discharge sections 600 are formed is located on a lower surface of the head 310 in the Z direction. In the following description, it is described that the print head 21 includes six driving signal selection circuits 200-1 to 200-6. That is, the six setting signals TD1 to TD6, the six driving signals COM1 to COM6, and the six reference voltage signals CGND1 to CGND6 that are correspond to the six driving signal selection circuits 200-1 to 200-6 are input to the print head 21.

Figure 11:
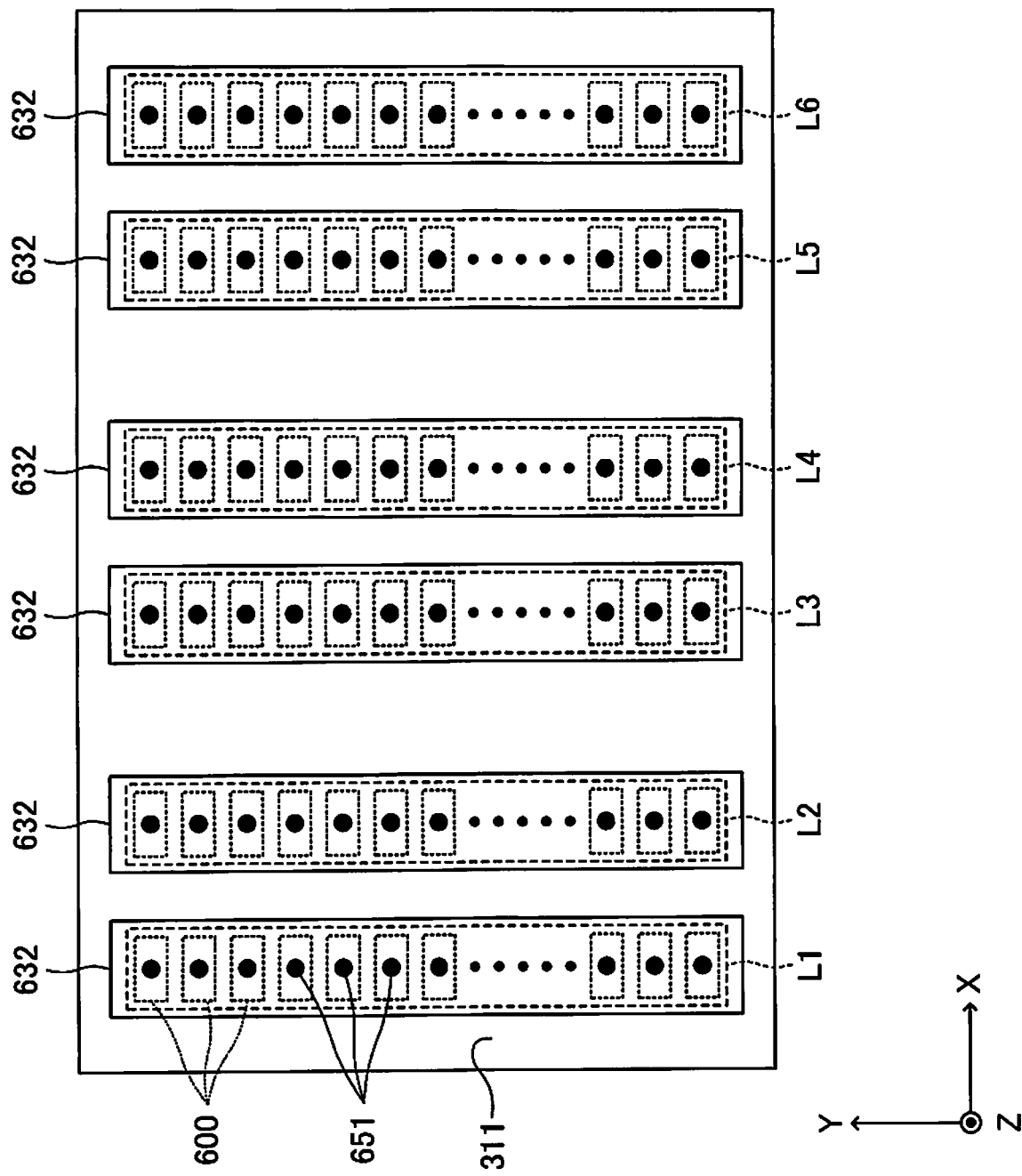
FIG. 11 is a plan view illustrating a configuration of an ink discharge surface.

FIG. 11 is a plan view illustrating a configuration of the ink discharge surface 311. As illustrated in FIG. 11, six nozzle plates 632 having nozzles 651 in the plurality of discharge sections 600 are provided on the ink discharge surface 311 in parallel to the X direction. In addition, the nozzles 651 are provided in parallel to the Y direction in each of the nozzle plates 632. That is, six nozzle columns L1 to L6 are formed on the ink discharge surface 311. In FIG. 11, the nozzles 651 are provided, in parallel to the Y direction in a column, in the nozzle columns L1 to L6 formed on the nozzle plates 632, respectively but the nozzle 651 may be provided in a parallel to the Y direction in two columns or more.

The nozzle columns L1 to L6 are provided corresponding to the driving signal selection circuits 200-$i$ to 200-6, respectively. Specifically, a driving signal VOUT1, based on the setting signal TD1, output from the driving signal selection circuit 200-1 is supplied to one end of the piezoelectric element 60 included in the plurality of discharge sections 600 provided in the nozzle column L1, and the reference voltage signal CGND1 is supplied to the other end of the piezoelectric element 60. Similarly, driving signals VOUT2 to VOUT6, based on the setting signals TD2 to TD6, output from the driving signal selection circuits 200-2 to 200-6 are supplied to one end of the piezoelectric element 60 included in the plurality of discharge sections 600 provided in the nozzle columns L2 to L6, and the reference voltage signals CGND2 to CGND6 are supplied to the other end of the corresponding piezoelectric element 60.

Figure 12:
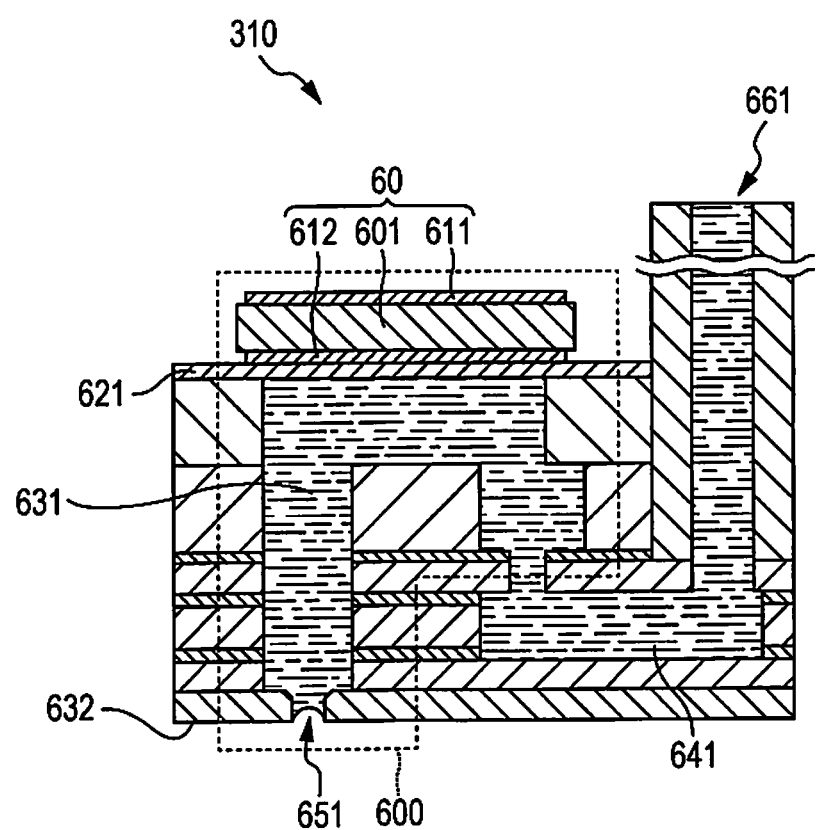
FIG. 12 is a view illustrating a schematic configuration of one of a plurality of discharge sections included in a head.

Next, FIG. 12 illustrates a configuration of the discharge section 600 included in the head 310. FIG. 12 is a view illustrating a schematic configuration of one of the plurality of discharge sections 600 included in the head 310. As illustrated in FIG. 12, the head 310 includes the discharge section 600 and a reservoir 641.

The reservoir 641 is provided corresponding to each of the nozzle columns L1 to L6. Moreover, ink is introduced into the reservoir 641 from an ink supply port 661.

The discharge section 600 includes the piezoelectric element 60, a vibration plate 621, a cavity 631, and the nozzle 651. The vibration plate 621 is deformed depending on displacement of the piezoelectric element 60 provided on an upper surface of the vibration plate 621 in FIG. 12. In addition, the vibration plate 621 functions as a diaphragm which enlarges/reduces an internal volume of the cavity 631. The inside of the cavity 631 is filled with the ink. The cavity 631 functions as a pressure chamber of which the internal volume is changed due to the displacement of the piezoelectric element 60. The nozzle 651 is opening which is formed in the nozzle plate 632 and communicates with the cavity 631. Moreover, the ink, which is stored in the cavity 631 depending on the change of the internal volume of the cavity 631, is discharged from the nozzle 651.

The piezoelectric element 60 has a structure in which a piezoelectric substance 601 is interposed between a pair of electrodes 611 and 612. Specifically, in FIG. 12, in the piezoelectric substance 601 of such a structure, a center portion of the electrodes 611 and 612 and the vibration plate 621 is bent vertically with respect to the both end portion, depending on the voltage supplied to the electrodes 611 and 612. Specifically, the driving signal VOUT is supplied to the electrode 611, and the reference voltage signal CGND is supplied to the electrode 612. When the voltage of the driving signal VOUT is high, a center portion of the piezoelectric element 60 is bent upwardly, and when the voltage of the driving signal VOUT is low, the center portion of the piezoelectric element 60 is bent downwardly. That is, if the piezoelectric element 60 is bent upwardly, the internal volume of the cavity 631 is enlarged. Therefore, the ink is drawn into the reservoir 641. In addition, if the piezoelectric element 60 is bent downwardly, the internal volume of the cavity 631 is reduced. Therefore, the ink is discharged from the nozzle 651, the amount of the ink depending on an extent of reduction in the internal volume of the cavity 631. As described above, the piezoelectric element 60 is driven by the driving signal VOUT based on the driving signal COM. Moreover, the ink is discharged from the nozzle 651 by driving the piezoelectric element 60.

Returning to FIG. 10, the substrate 320 has a first surface 321 and a second surface 322 facing the first surface 321, and has a substantially rectangular shape formed of a first side 323, a second side 324 facing the first side 323 in the X direction, a third side 325, and a fourth side 326 facing the third side 325 in the Y direction. The shape of the substrate 320 is not limited to the rectangle, but for example, may be a polygon such as hexagon or octagon, furthermore, a part of the substrate 320 may be formed in a notch, an arc, or the like.

Figure 13:
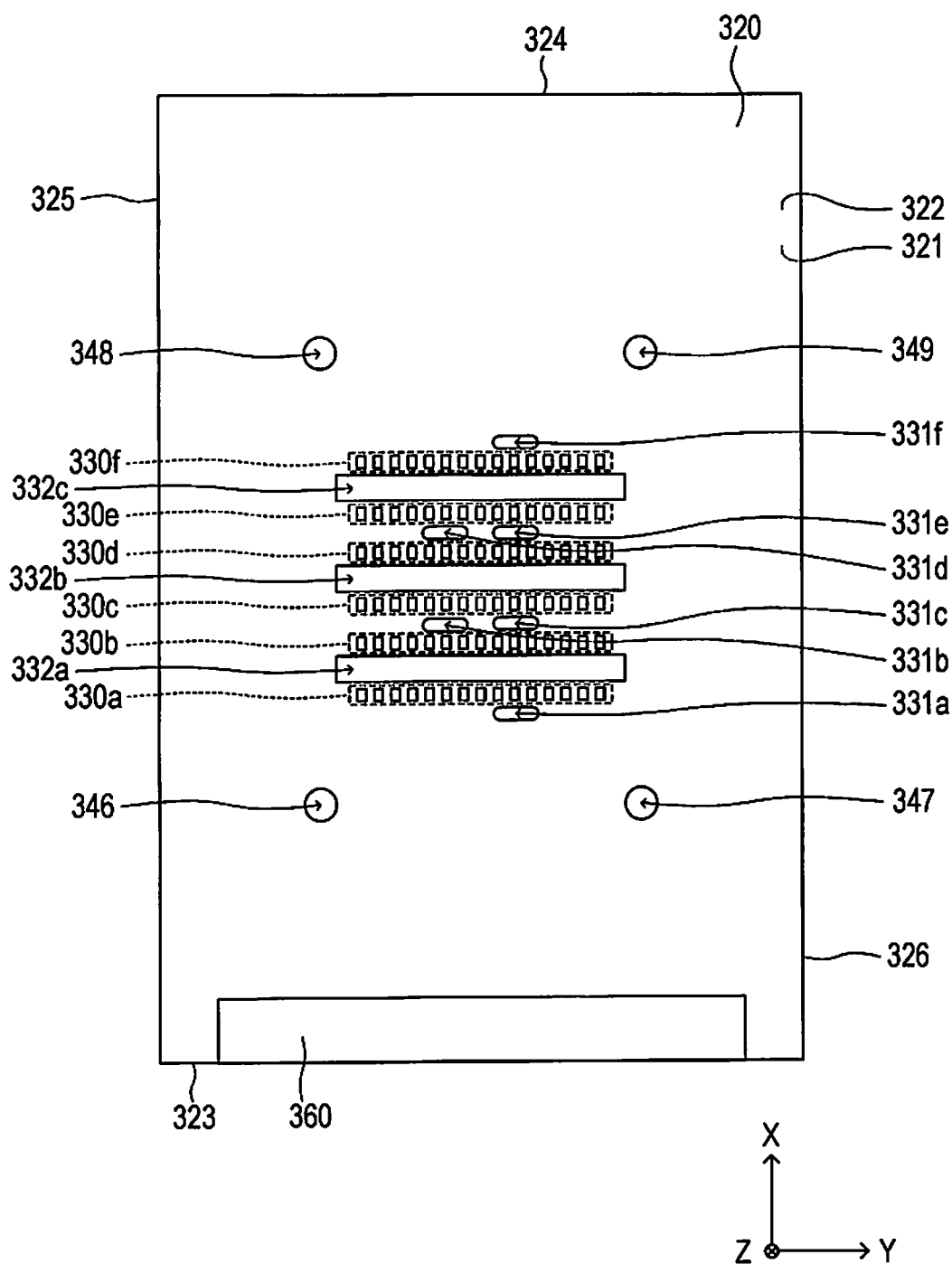
FIG. 13 is a plan view illustrating a substrate when viewed from a second surface.
Figure 14:
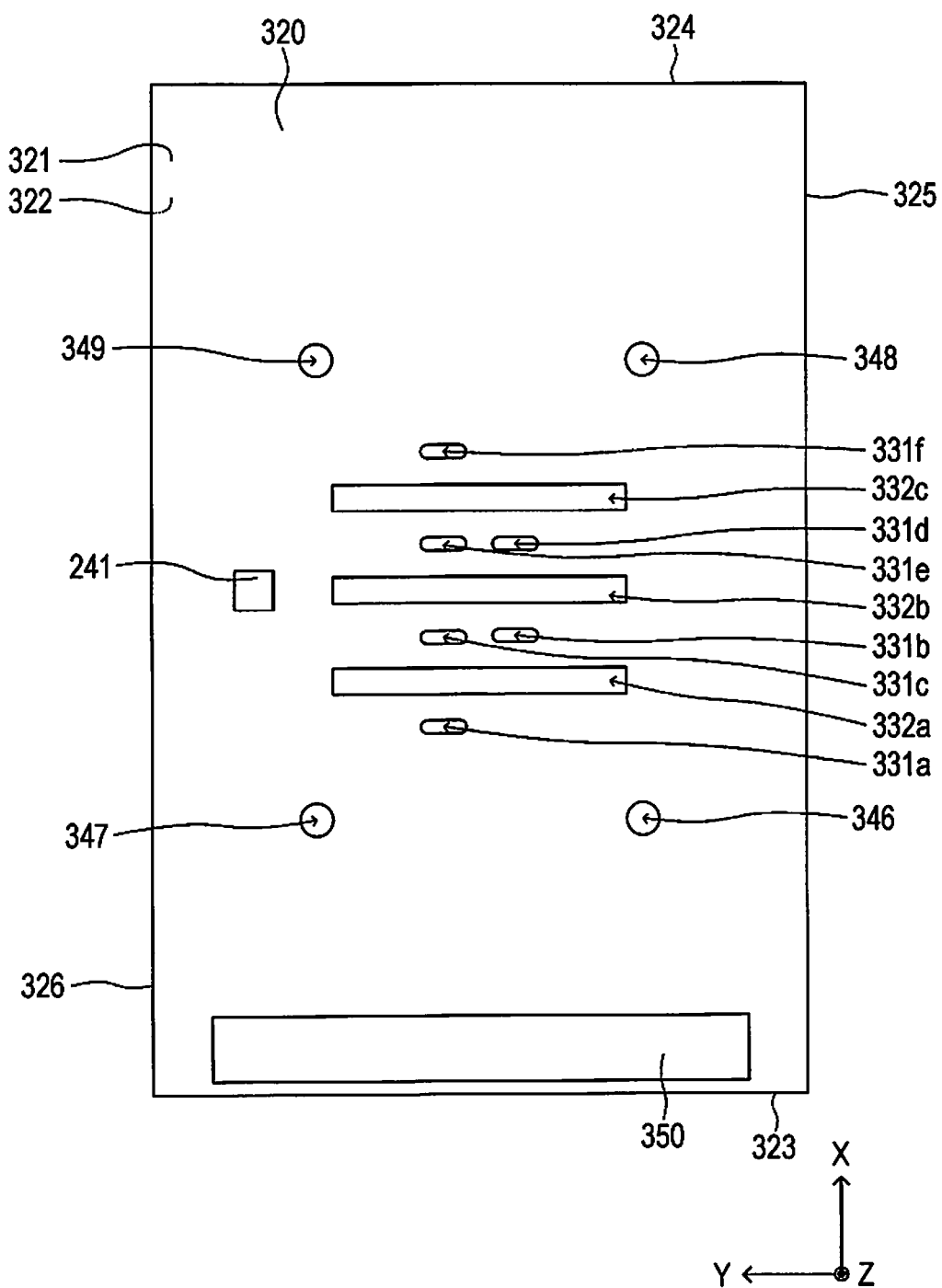
FIG. 14 is a plan view illustrating the substrate when viewed from a first surface.

Here, FIGS. 13 and 14 illustrate a configuration of the substrate 320. FIG. 13 is a plan view illustrating the substrate 320 when viewed from the second surface 322. In addition, FIG. 14 is a plan view illustrating the substrate 320 when viewed from the first surface 321.

As illustrated in FIG. 13, electrode groups 330$a$ to 330$f$ are provided on the second surface 322 of the substrate 320. Specifically, each of the electrode groups 330$a$ to 330$f$ has a plurality of electrodes which are juxtaposed in the Y direction. The electrode groups 330$a$ to 330$f$ are juxtaposed in order of the electrode groups 330$a$, 330$b$, 330$c$, 330$d$, 330$e$, and 330$f$ along the Y direction. Each of the electrode groups 330$a$ to 330$f$ as described above is electrically coupled to flexible wiring substrates (flexible printed circuits; FPCs) 335 illustrated in FIG. 17.

As illustrated in FIGS. 13 and 14, FPC insertion holes 332$a$ to 332$c$ and ink supply path insertion holes 331$a$ to 331$f$ that are through-holes penetrating through the first surface 321 and the second surface 322 are formed in the substrate 320.

The FPC insertion hole 332$a$ is located between the electrode group 330$a$ and the electrode group 330$b$ in the X direction, and a flexible wiring substrate 335 electrically coupled to the electrode group 330$a$ and a flexible wiring substrate 335 electrically coupled to the electrode group 330$b$ are inserted therethrough. The FPC insertion hole 332$b$ is located between the electrode group 330$c$ and the electrode group 330$d$ in the X direction, and a flexible wiring substrate 335 electrically coupled to the electrode group 330$c$ and a flexible wiring substrate 335 electrically coupled to the electrode group 330$d$ are inserted therethrough. The FPC insertion hole 332$c$ is located between the electrode group 330$e$ and the electrode group 330$f$ in the X direction, and a flexible wiring substrate 335 electrically coupled to the electrode group 330$e$ and a flexible wiring substrate 335 electrically coupled to the electrode group 330$f$ are inserted therethrough.

The ink supply path insertion hole 331$a$ is located on the first side 323 of the electrode group 330$a$ in the X direction. The ink supply path insertion holes 331$b$ and 331$c$ are located between the electrode group 330$b$ and the electrode group 330$c$ in the X direction, the ink supply path insertion hole 331$b$ and the ink supply path insertion hole 331$c$ are juxtaposed along the Y direction on the third side 325 and on the fourth side 326, respectively. The ink supply path insertion holes 331d and 331e are located between the electrode group 330d and the electrode group 330e in the X direction, the ink supply path insertion hole 331d and the ink supply path insertion hole 331e are juxtaposed along the Y direction on the third side 325 and on the fourth side 326, respectively. The ink supply path insertion hole 331f is located on the second side 324 of the electrode group 330f in the X direction. In addition, some of ink supply paths (not illustrated) are inserted into each of the ink supply path insertion holes 331a to 331f, the ink supply paths communicating with the ink supply port 661 for introducing the ink to the discharge section 600 corresponding to each of the nozzle columns L1 to L6.

As illustrated in FIGS. 13 and 14, the substrate 320 includes fixation portions 346 to 349 for fixing the substrate 320 included in the print head 21 to the carriage 20 illustrated in FIG. 1. Each of the fixation portions 346 to 349 is a through-hole penetrating through the first surface 321 and the second surface 322 of the substrate 320. The substrate 320 and the head 310 are fixed by a fixing member, such as a screw (not illustrated), inserted into the fixation portions 346 to 349. In addition, the fixing member may fix the print head 21 and the carriage 20. In addition, the fixation portions 346 to 349 is not limited to the through-holes formed in the substrate 320. For example, the fixation portions 346 to 349 may fix the substrate 320 and the head 310 by fitting each other.

The fixation portions 346 and 347 are located on the first side 323 of the ink supply path insertion hole 331a in the X direction, the fixation portion 346 and the fixation portion 347 are juxtaposed along the Y direction on the third side 325 and on the fourth side 326, respectively. In addition, The fixation portions 348 and 349 are located on the second side 324 of the ink supply path insertion hole 331f in the X direction, the fixation portion 348 and the fixation portion 349 are juxtaposed along the Y direction on the third side 325 and on the fourth side 326, respectively.

As illustrated in FIG. 14, an integrated circuit 241 configuring the diagnosis circuit 240 (illustrated in FIG. 2) is provided on the first surface 321 of the substrate 320. Specifically, the integrated circuit 241 is provided between the fixation portions 347 and 349 on the first surface 321 of the substrate 320, and is provided on the fourth side 326 of the electrode groups 330a to 330f.

As illustrated in FIGS. 13 and 14, connectors 350 and 360 are provided on the substrate 320. The connector 350 is provided along the first side 323 on the first surface 321 of the substrate 320. The connector 360 is provided along the first side 323 on the second surface 322 of the substrate 320.

Figure 15:
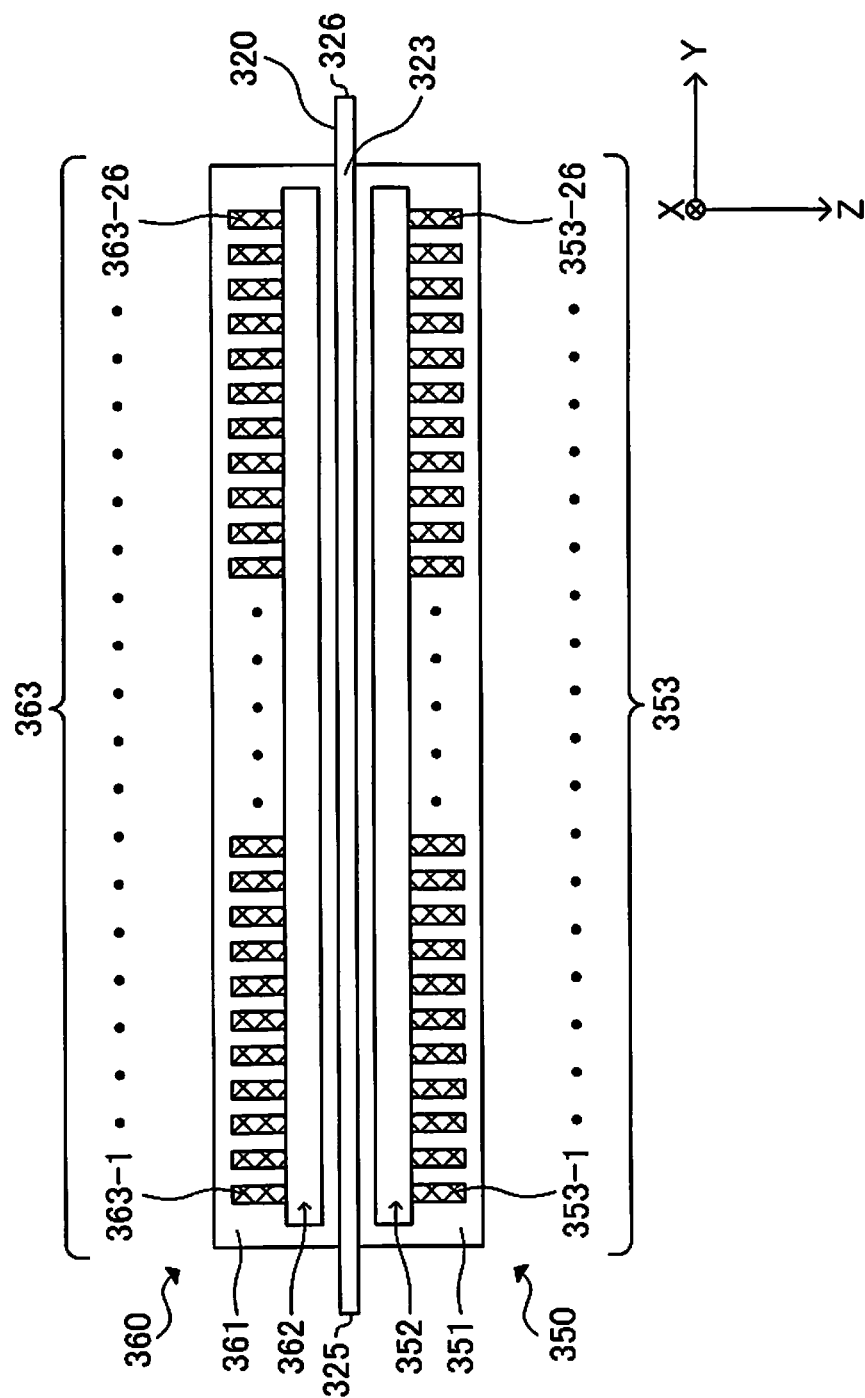
FIG. 15 is a view illustrating a configuration of connectors.

Here, FIG. 15 illustrates a configuration of the connectors 350 and 360. FIG. 15 is a view illustrating a configuration of the connectors 350 and 360. As illustrated in FIG. 15, the connector 350 includes a housing 351, a cable attachment section 352 formed on the housing 351, and a plurality of terminals 353. The plurality of terminals 353 are juxtaposed along the first side 323. Specifically, 26 terminals 353 are juxtaposed along the first side 323. Here, the 26 terminals 353 are referred to as terminals 353-1, 353-2, . . . , and 353-26 in order from the third side 325 toward the fourth side 326 in a direction along the first side 323. The cable attachment section 352 is located on the substrate 320 of the plurality of terminals 353 in the Z direction. Cables such as flexible flat cables are attached in the cable attachment section 352 as a propagation path.

The connector 360 includes a housing 361, a cable attachment section 362 formed on the housing 361, and a plurality of terminals 363. A plurality of terminals 363 are juxtaposed along the first side 323. Specifically, 26 terminals 363 are juxtaposed along the first side 323. Here, the 26 terminals 363 are referred to as terminals 363-1, 363-2, . . . , and 363-26 in order from the third side 325 toward the fourth side 326 in a direction along the first side 323. The cable attachment section 362 is located on a side of the substrate 320 of the plurality of terminals 363 in the Z direction. Cables such as flexible flat cables are attached in the cable attachment section 362 as a propagation path.

Various signals for controlling an operation of the print head 21 propagate through the cables as the propagation path of various control signals attached in the connectors 350 and 360. Moreover, the print head 21 operates based on the various signals input through the connectors 350 and 360.

Figure 16:
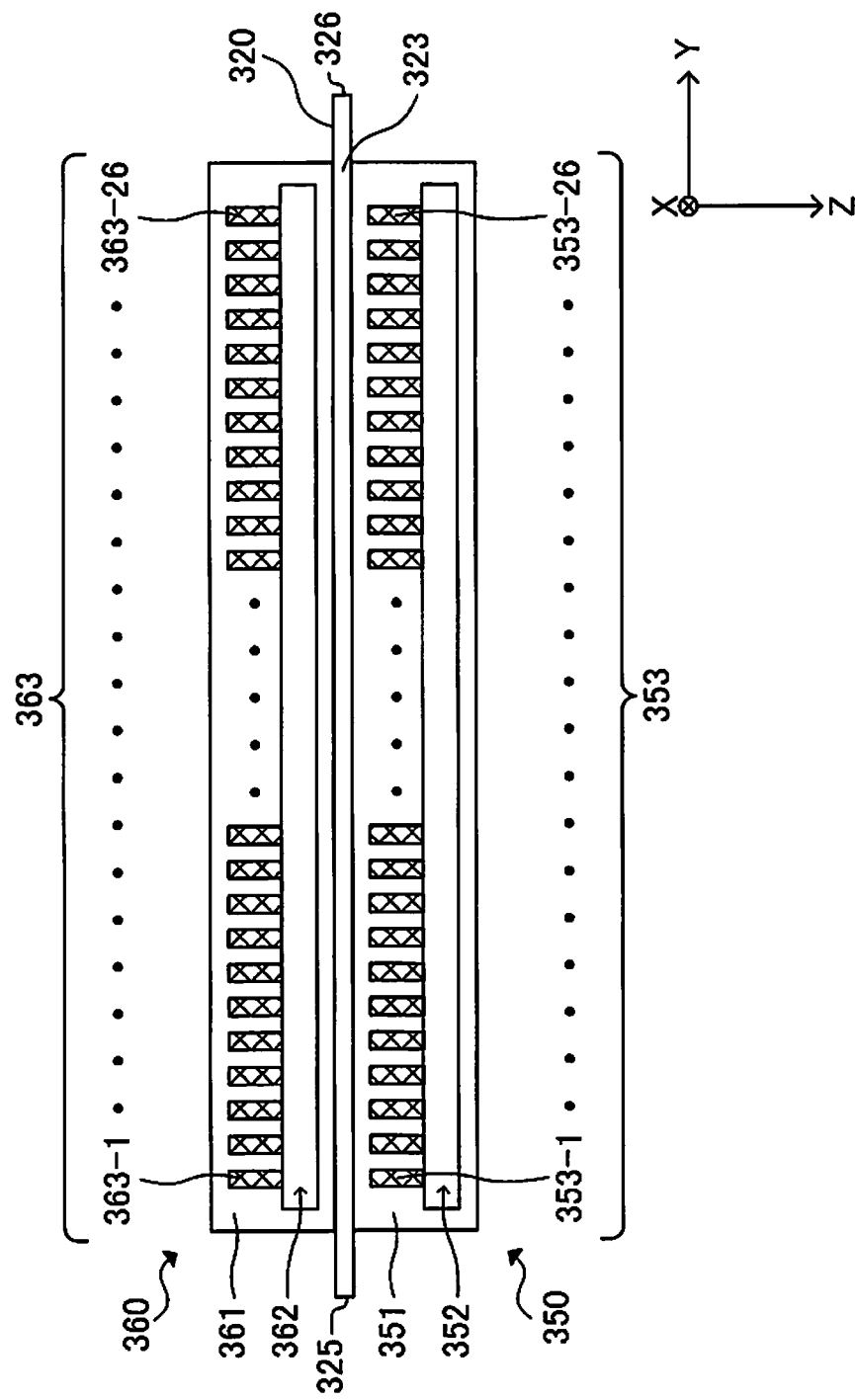
FIG. 16 is a view illustrating another configuration of the connectors.

Here, in the connector 350 illustrated in the FIG. 15, the cable attachment section 352 is located on a side of the substrate 320 in the Z direction and the plurality of terminals 353 are located on a side of the ink discharge surface 311 in the Z direction. However, as the connector 350 in FIG. 16, it is preferable that, the plurality of terminals 353 are located on a side of the substrate 320 in the Z direction and the cable attachment section 352 is located on a side of the ink discharge surface 311 in the Z direction. FIG. 16 is a view illustrating another configuration of the connectors 350 and 360.

In the liquid discharge apparatus 1, most of the ink discharged from the nozzle 651 lands on the medium P to form an image. However, some of the ink discharged from the nozzle 651 may be misted before landing on the medium P and floated inside the liquid discharge apparatus 1. Further, even after the ink discharged from the nozzle 651 lands on the medium P, the ink landed on the medium P may be floated inside the liquid discharge apparatus 1 again due to a movement of the carriage 20 on which the print head 21 is mounted or an air flow generated by transport of the medium P. When the ink floated inside the liquid discharge apparatus 1 is adhered to the plurality of terminals 353 included in the connector 350, there is a possibility that a short circuit occurs between the terminals. As a result, distortion occurs in the waveform of the various signals input to the print head 21, and there is a possibility that the discharge accuracy of the ink discharged from the print head 21 deteriorates.

As the connector 350 in FIG. 16, when the plurality of terminals 353 are located on the side of the substrate 320 in the Z direction, if cables are attached to the connector 350, the plurality of terminals 353 are not provided on the surface of the side of the ink discharge surface 311 in which the ink floated inside the liquid discharge apparatus 1 is highly likely to adhere. For this reason, it is possible to reduce the possibility of occurring the short circuit between the plurality of terminals 353 included in the connector 350 due to the ink floated inside the liquid discharge apparatus 1. Therefore, it is possible to reduce the possibility of occurring the distortion in the signals input to the print head 21.

In the print head 21 configured as described above, a plurality of signals are input to the print head 21 through the connectors 350 and 360, the plurality of signals including the driving signals COM1 to COME, the reference voltage signals CGND1 to CGND6, the setting signals TD1 to TD6, the latch signal LAT, the change signal CH, and the clock signal SCK output from the control mechanism 10. Among the plurality of signals input to the print head 21, the plurality of signals including the setting signal TD1, the latch signal LAT, the change signal CH, and the clock signal SCK propagate in a wiring pattern which is provided on the substrate 320 and are input to the integrated circuit 241 including the diagnosis circuit 240. Moreover, the plurality of signals including the setting signal TD1, the latch signal LAT, the change signal CH, and the clock signal SCK are output as the latch signal cLAT, the change signal cCH, and the clock signal cSCK. The latch signal cLAT, the change signal cCH, and the change signal cSCK propagate in a wiring pattern which is provided on the substrate 320 and are input to each of the electrode groups 330a to 330f.

In addition, among the plurality of signals input to the print head 21, the plurality of signals including the driving signals COM1 to COM6, the reference voltage signals CGND1 to CGND6, and the setting signals TD1 to TD6 propagate in a wiring pattern which is provided on the substrate 320 and are input to each of the electrode groups 330a to 330f instead of passing through the diagnosis circuit 241 included in the integrated circuit 240.

Figure 17:
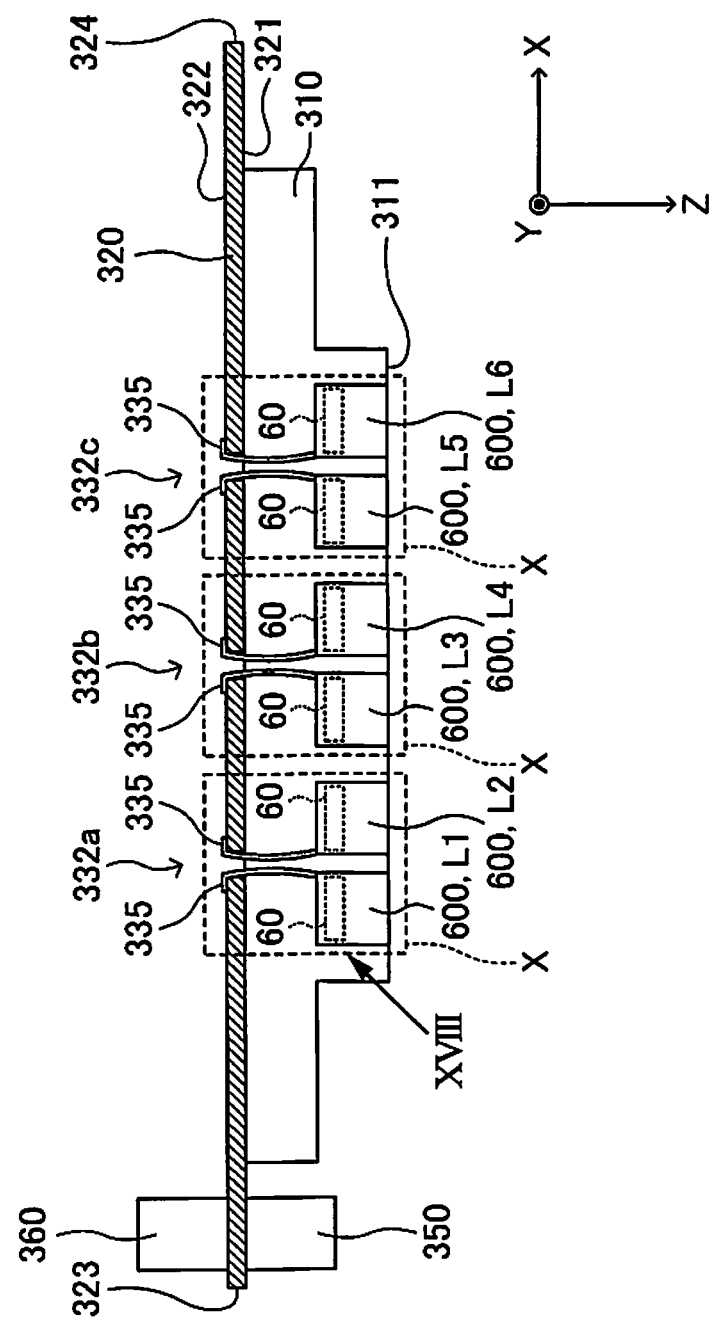
FIG. 17 is a sectional view illustrating the print head when viewed from a Y direction.
Figure 18:
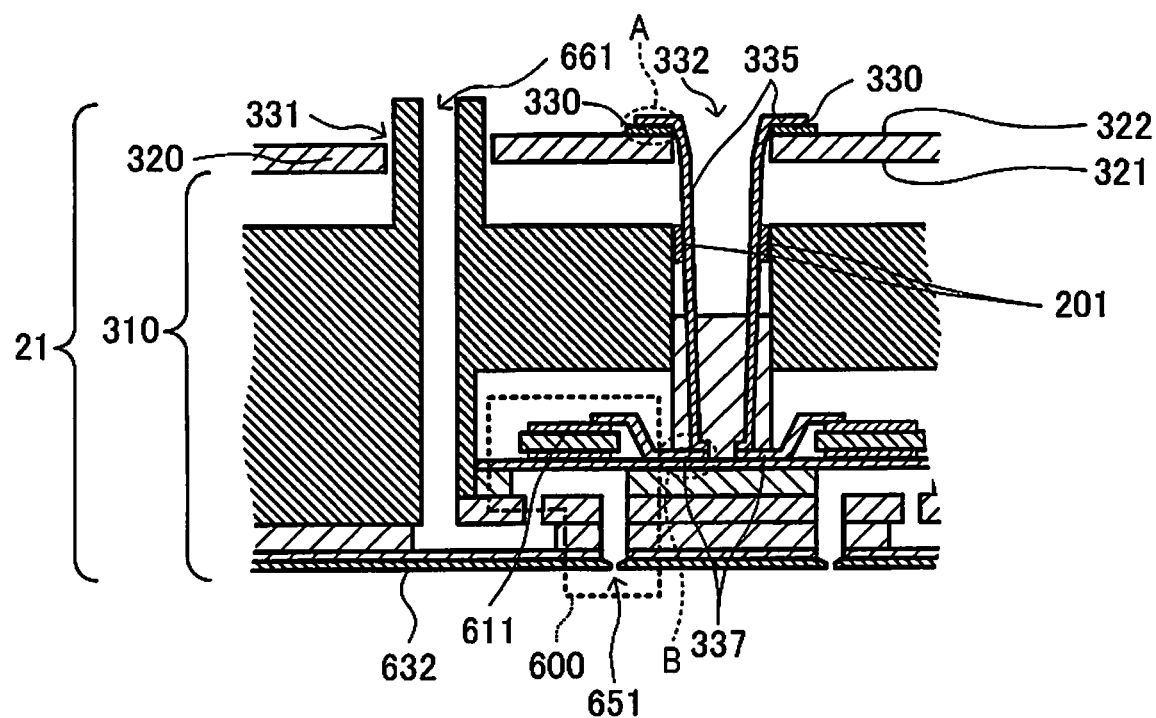
FIG. 18 is an enlarged view of an X portion indicated by a broken line in FIG. 17.

The various signals input to each of the electrode groups 330a to 330f are input to the driving signal selection circuits 200-1 to 200-6 corresponding to each of the nozzle columns L1 to L6 through the flexible wiring substrates 335 electrically coupled to each of the electrode groups 330a to 330f. FIG. 17 is a sectional view illustrating the print head 21 when viewed from the Y direction, and FIG. 18 is an enlarged view of an X portion indicated by a broken line in FIG. 17. In FIG. 17, a plurality of X portions are illustrated, but all of the X portions have the same configuration. For this reason, in the description of FIG. 18, only one X portion is illustrated, furthermore, the FPC insertion holes 332a to 332c are simply referred to as an FPC insertion hole 332, the ink supply path insertion holes 331a to 331f are simply referred to as an ink supply path insertion hole 331, and the electrode groups 330a to 330f are simply referred to as an electrode group 330.

As illustrated in FIGS. 11 and 17, the plurality of nozzle columns L1 to L6 are juxtaposed in the X direction. Specifically, the plurality of nozzle columns L1 to L6 are juxtaposed from the first side 323 on which the connector 350 of the substrate 320 is provided toward the second side 324, that is, in order of the nozzle columns L1, L2, L3, L4, L5, and L6. In other words, the nozzle column L1 is located closest to the first side 323, and the nozzle column L6 is located closest to the second side 324. That is, the shortest distance between the plurality of the piezoelectric elements 60 included in the nozzle column L1 corresponding to the driving signal selection circuit 200-1 and the connector 350 is shorter than the shortest distance between the plurality of piezoelectric elements 60 included in the nozzle column L2 corresponding to the driving signal selection circuit 200-2 and the connector 350. Further, in this case, the piezoelectric element 60 included in other nozzle columns L2 to L6 and each of the nozzle columns L2 to L6 are not located between the plurality of piezoelectric elements 60 included in the nozzle column L1 corresponding to the driving signal selection circuit 200-1 and the connector 350. In other words, the nozzle column L1 is located closest to the connector 350 among the nozzle columns L1 to L6 formed on the ink discharge surface 311.

In other words, the print head 21 includes the plurality of flexible wiring substrates 335 electrically coupled to the substrate 320, and the shortest distance between the flexible wiring substrate 335 corresponding to the nozzle column L1 and the connector 350 is shorter than the shortest distance between the flexible wiring substrate 335 corresponding to the nozzle column L2 and the connector 350. Furthermore, the flexible wiring substrate 335 corresponding to the nozzle column L1 is provided closest to the connector 350 among the plurality of flexible wiring substrates 335 included in the print head 21. Here, the flexible wiring substrate 335 corresponding to the nozzle column L1 is an example of a first wiring substrate, the flexible wiring substrate 335 corresponding to the nozzle column L2 is an example of a second wiring substrate, and the plurality of flexible wiring substrates 335 including the flexible wiring substrate 335 corresponding to the nozzle column L1 and the flexible wiring substrate 335 corresponding to the nozzle column L2 are an example of a plurality of wiring substrates.

In the print head 21 configured as described above, a plurality of signals are input to the flexible wiring substrate 335 coupled to each of the electrode groups 330a to 330f, the plurality of signals including the driving signals COM1 to COM6, the reference voltage signals CGND1 to CGND6, the setting signals TD1 to TD6, the latch signal LAT, the change signal CH, and the clock signal SCK that are input through the connectors 350 and 360.

Specifically, as illustrated in FIG. 18, the flexible wiring substrate 335 is inserted into the FPC insertion hole 332. An A portion which is one end of the flexible wiring substrate 335 is coupled to the electrode group 330, and a B portion which is the other end of the flexible wiring substrate 335 is coupled to one end of electrode wiring 337. The other end of the electrode wiring 337 is coupled to the electrode 611 of the piezoelectric element 60. That is, the electrode wiring 337 is provided by the same number as the discharge section 600. In addition, an integrated circuit 201 is mounted on the flexible wiring substrate 335 using chip on film (COF). In other words, the print head 21 includes the integrated circuit 201, and the integrated circuit 201 is provided on the flexible wiring substrate 335. The integrated circuit 201 includes the driving signal selection circuit 200 and the temperature abnormality detection circuit 250. The setting signal TD1, the change signal cCH, the latch signal cLAT, the clock signal cSCK, and the driving signal COM are input to the integrated circuit 201 through the electrode group 330, whereby the driving signal selection circuit 200 included in the integrated circuit 201 generates the driving signal VOUT. The integrated circuit 201 supplies the generated driving signal VOUT to the electrode 611 of the piezoelectric element 60 corresponding to each of the plurality of discharge sections 600 through the electrode wiring 337. Here, although not illustrated in FIG. 18, the integrated circuit 241 is provided on the first surface 321 of the substrate 320, which is a space formed between the substrate 320 and the head 310. The space may be a space formed by supporting the substrate 320 by the fixing member that are inserted in the fixation portions 347 to 349, and may be a space formed by having a recess in a part of a surface of the head 310 on which the substrate 320 is fixed.

Here, the connector 350 is an example of a connector, and the integrated circuit 241 included in the diagnosis circuit 240 is an example of a first integrated circuit. In addition, the substrate 320 on which the connector 350 and the integrated circuit 241 are provided are an example of a circuit substrate. As illustrated in FIG. 14, the connector 350 and the integrated circuit 241 are provided on the first surface 321 of the substrate 320. In other words, the connector 350 and the integrated circuit 241 are provided on the same surface of the substrate 320. In addition, the integrated circuit 201 including the driving signal selection circuit 200 is an example of a second integrated circuit.

1.7. Details of Signal Input to Print Head

In the liquid discharge apparatus 1 configured as described above, FIGS. 19 and 20 illustrate details of signals input to the print head 21.

FIG. 19 is a view for explaining details of signals input to the connector 350. As illustrated in FIG. 19, the connector 350 includes a terminal to which each of the driving signals COM1 to COM6 is input, a terminal to which each of the reference voltage signals CGND1 to CGND6 is input, a terminal to which the temperature signal TH, the latch signal LAT, the clock signal SCK, the change signal CH, the setting signal TD1, and the abnormality signal XHOT are input, a terminal to which each of the diagnosis signals DIG-A to DIG-E are input, a terminal to which the voltage VHV is input, and a plurality of terminals to which a plurality of ground signals GND are input.

Specifically, the driving signals COM1 to COM6 are input from the terminals 353-11, 353-9, 353-7, 353-5, 353-3, and 353-1, respectively. In addition, the reference voltage signals CGND1 to CGND6 are input from the terminals 353-12, 353-10, 353-8, 353-6, 353-4, and 353-2, respectively.

The diagnosis signal DIG-A is input from the terminal 353-23. Similarly, the latch signal LAT is also input from the terminal 353-23. That is, the terminal 353-23 serves as the terminal to which the diagnosis signal DIG-A is input and the terminal to which the latch signal LAT is input. Here, the terminal 353-23, which serves as the terminal to which the diagnosis signal DIG-A is input and the terminal to which the latch signal LAT is input, is an example of a second terminal.

The diagnosis signal DIG-B is input from the terminal 353-21. Similarly, the clock signal SCK is also input from the terminal 353-21. That is, the terminal 353-21 serves as the terminal to which the diagnosis signal DIG-B is input and the terminal to which the clock signal SCK is input. Here, the terminal 353-21, which serves as the terminal to which the diagnosis signal DIG-B is input and the terminal to which the clock signal SCK is input, is an example of a fourth terminal.

The diagnosis signal DIG-C is input from the terminal 353-19. Similarly, the change signal CH is also input from the terminal 353-19. That is, the terminal 353-19 serves as the terminal to which the diagnosis signal DIG-C is input and the terminal to which the change signal CH is input. Here, the terminal 353-19, which serves as the terminal to which the diagnosis signal DIG-C is input and the terminal to which the change signal CH is input, is an example of a third terminal.

The diagnosis signal DIG-D is input from the terminal 353-17. Similarly, the setting signal TD1 is also input to the terminal 353-17. That is, the terminal 353-17 serves as the terminal to which the diagnosis signal DIG-D is input and the terminal to which the setting signal TD1 is input. Here, the terminal 353-17, which serves as the terminal to which the diagnosis signal DIG-D is input and the terminal to which the setting signal TD1 is input, is an example of a first terminal.

The diagnosis signal DIG-E and the abnormality signal XHOT output from the integrated circuit 241 included in the diagnosis circuit 240 are input to the terminal 353-15. That is, the terminal 353-15 serves as the terminal to which the diagnosis signal DIG-E is input and the terminal to which the abnormality signal XHOT is input.

As described above, in the first embodiment, the diagnosis signals DIG-A to DIG-E, and the latch signal LAT, clock signal SCK, change signal CH, setting signal TD1, and abnormality signal XHOT are input to a common terminal, respectively. Here, an example of a method of inputting, to the common terminal, the diagnosis signals DIG-A to DIG-E, and the latch signal LAT, clock signal SCK, change signal CH, setting signal TD1, and abnormality signal XHOT will be described.

For example, the control circuit 100 generates, in time division, the diagnosis signal DIG-A and the latch signal LAT, the diagnosis signal DIG-B and the clock signal SCK, the diagnosis signal DIG-C and the change signal CH, and the diagnosis signal DIG-D and the setting signal TD1, according to an operation state of the liquid discharge apparatus 1 and the print head 21. Specifically, when the liquid discharge apparatus 1 is in a printing state of discharging the ink, the control circuit 100 generates the latch signal LAT, the clock signal SCK, the change signal CH, and the setting signal TD1 and outputs the latch signal LAT, the clock signal SCK, the change signal CH, and the setting signal TD1 to the print head 21. In addition, when the liquid discharge apparatus 1 is not in the printing state of discharging the ink and the print head 21 performs self-diagnosis, the control circuit 100 generates the diagnosis signals DIG-A to DIG-D and outputs the diagnosis signals DIG-A to DIG-D to the print head 21. Accordingly, after the respective latch signal LAT, the clock signal SCK, the change signal CH, and the setting signal TD1 and the respective diagnosis signals DIG-A to DIG-D propagate through the common wiring, the respective latch signal LAT, the clock signal SCK, the change signal CH, and the setting signal TD1 and the respective diagnosis signals DIG-A to DIG-D are input to the print head 21. That is, the respective latch signal LAT, the clock signal SCK, the change signal CH, and the setting signal TD1 and the respective diagnosis signals DIG-A to DIG-D are input to the common terminal.

The method of inputting, to the common terminal, the diagnosis signal DIG-E and the abnormality signal XHOT is that, for example, when the diagnosis signals DIG-A to DIG-D are input, the diagnosis circuit 240 outputs the diagnosis signal DIG-E representing a diagnosis result based on the diagnosis signals DIG-A to DIG-D, and when the latch signal LAT, the clock signal SCK, the change signal CH, and the setting signal TD1 are input, the diagnosis circuit 240 outputs the abnormality signal XHOT based on the abnormality signal cXHOT representing the detection result of the temperature abnormality which is detected by the temperature abnormality detection circuit 250. In addition, by inputting the diagnosis signal DIG-E and the abnormality signal XHOT to the common terminal, when at least one of the diagnosis result of the temperature abnormality detection circuit 250 as to whether or not there is temperature abnormality and the diagnosis result of the diagnosis circuit 240 is abnormal, the diagnosis circuit 240 inputs a signal indicating that the ink cannot be normally discharged from the print head 21 to the corresponding terminal. When both the diagnosis of the temperature abnormality detection circuit 250 as to whether or not there is temperature abnormality and the diagnosis of the diagnosis circuit 240 are normal, the signal indicating that the ink can be normally discharged from the print head 21 is input to the corresponding terminal.

The method of inputting, to the common terminal of the connector 350, the diagnosis signals DIG-A to DIG-E, and the latch signal LAT, clock signal SCK, change signal CH, setting signal TD1, and abnormality signal XHOT is an example, for example, the method thereof may be a method of switching the signal which propagates through the wiring and the signal which is input to the terminal using the selector or the like.

The setting signal TD, the change signal CH, the latch signal LAT, the clock signal SCK, and the abnormality signal XHOT are important signals for controlling the discharge of the print head 21, and when connection failure or the like occurs in the wiring through which these signals propagate, there is a possibility that the discharge accuracy of ink deteriorates. The wiring through which the important signal propagates and the wiring through which the signal that performs self-diagnosis of the print head 21 propagates are set to be the common wiring, and the terminal to which the signal is input and the terminal to the signal that performs the self-diagnosis of the print head 21 is input are set to be the common terminal, whereby the diagnosis as to whether or not the setting signal TD1, the change signal CH, the latch signal LAT, the clock signal SCK, and the abnormality signal XHOT propagate normally can be performed based on the result of the self-diagnosis of the print head 21. Furthermore, since a plurality of signals propagate through one wiring and a plurality of signals are input to one terminal, it is possible to reduce the number of wiring to be provided in the cable as the propagation path and the number of terminals provided in the connector 350.

The temperature signal TH is input to the terminal 353-25. In addition, the voltage VHV is input to the terminal 353-13. In addition, the ground signal GND is input to each of the terminals 353-14, 353-16, 353-18, 353-20, 353-22, 353-24, and 353-26.

Next, FIG. 20 illustrates details of signals input to the connector 360. FIG. 20 is a view for explaining details of signals input to the connector 360. As illustrated in FIG. 20, the connector 360 includes a terminal to which each of the driving signals COM1 to COM6 is input, a terminal to which each of the reference voltage signals CGND1 to CGND6 is input, a terminal to which the each of the setting signals TD2 to TD6 is input, a terminal to which the each of the voltages VDD1 and VDD2 is input, and a plurality of terminals to which a plurality of ground signals GND are input.

Specifically, the driving signals COM1 to COM6 are input from the terminals 363-12, 363-10, 363-8, 363-6, 363-4, and 363-2, respectively. In addition, the reference voltage signals CGND1 to CGND6 are input from the terminals 363-11, 363-9, 363-7, 363-5, 363-3, and 363-1, respectively.

The setting signals TD2 to TD6 are input from the terminals 363-24, 363-22, 363-20, 363-18, and 363-16, respectively. In addition, the voltage VDD1 is input from the terminal 363-26, and the voltage VDD2 is input from the terminal 363-21.

The ground signal GND is input to each of the terminals 353-13, 353-14, 353-15, 353-17, 353-19, 353-23, and 353-25.

1.8. Wiring Pattern Formed in Print Head

Figure 21:
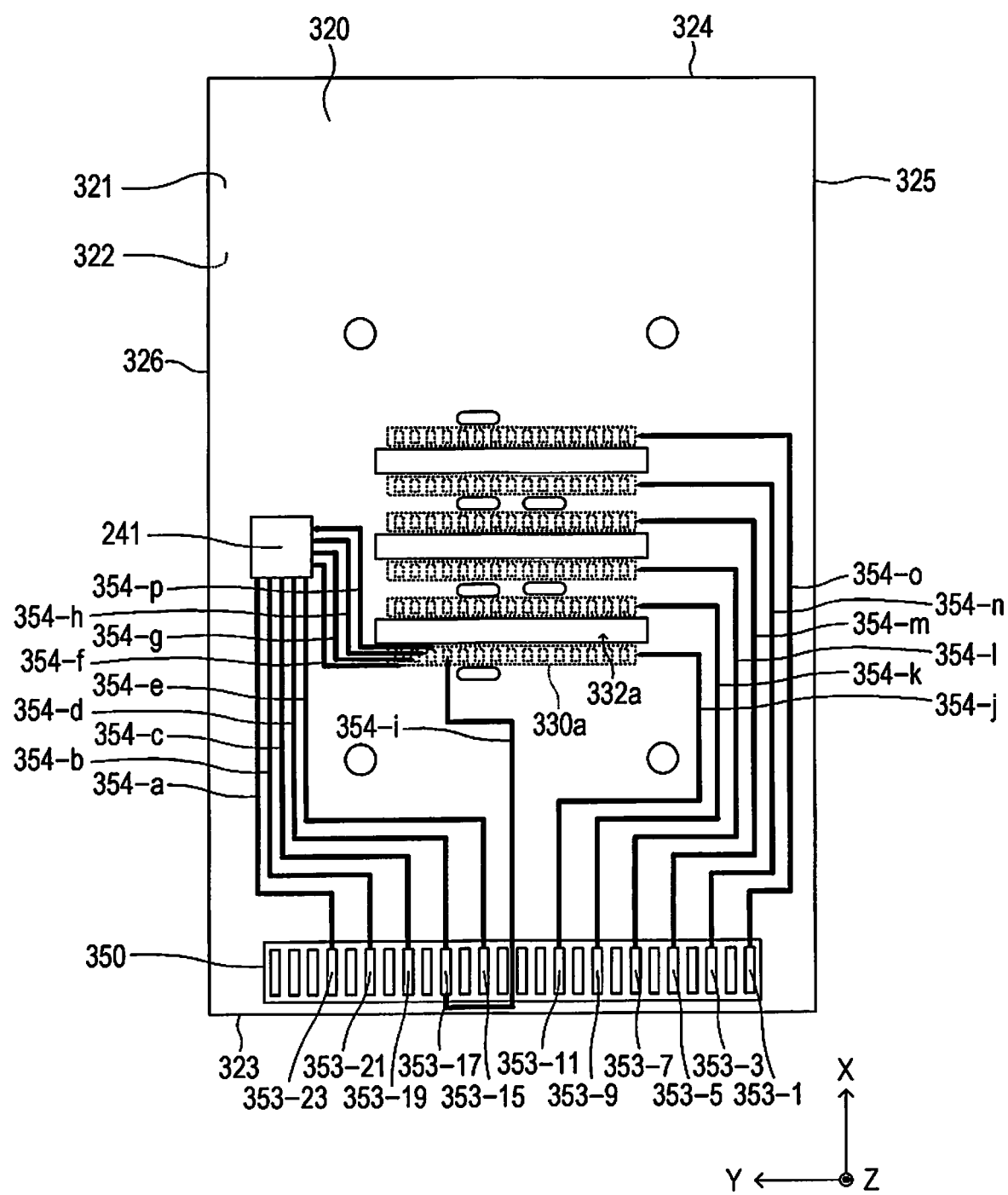
FIG. 21 is a view illustrating an example of wiring formed on the first surface of the substrate.

Here, FIG. 21 illustrates an example of a wiring pattern in which the diagnosis signals DIG-A to DIG-E input from the connector 350 propagate on the first surface 321 of the substrate 320. FIG. 21 is a view illustrating an example of wiring formed on the first surface 321 of the substrate 320. Noted that, a part of the wiring formed on the substrate 320 is not illustrated in FIG. 21. As illustrated in FIG. 21, the electrode groups 330a to 330f formed on the second surface 322 of the substrate 320 are indicated by a broken line.

As illustrated in FIG. 21, the substrate 320 has wiring 354-a to 354-p.

The terminal 353-23 is electrically coupled to the wiring 354-a. The diagnosis signal DIG-A and the latch signal LAT input from the terminal 353-23 are input to the integrated circuit 241 after propagating through the wiring 354-a. That is, the wiring 354-a electrically couples the terminal 353-23 and the integrated circuit 241 to each other. The wiring 354-a through which the diagnosis signal DIG-A and the latch signal LAT propagate is an example of second wiring.

The terminal 353-21 is electrically coupled to the wiring 354-b. The diagnosis signal DIG-B and the clock signal SCK input from the terminal 353-21 are input to the integrated circuit 241 after propagating through the wiring 354-b. That is, the wiring 354-b electrically couples the terminal 353-21 and the integrated circuit 241 to each other. The wiring 354-b through which the diagnosis signal DIG-B and the clock signal SCK propagate is an example of fourth wiring.

The terminal 353-19 is electrically coupled to the wiring 354-c. The diagnosis signal DIG-C and the change signal CH input from the terminal 353-19 are input to the integrated circuit 241 after propagating through the wiring 354-c. That is, the wiring 354-c electrically couples the terminal 353-19 and the integrated circuit 241 to each other. The wiring 354-c through which the diagnosis signal DIG-C and the change signal CH propagate is an example of third wiring.

The terminal 353-17 is electrically coupled to the wiring 354-d. The diagnosis signal DIG-D and the setting signal TD1 input from the terminal 353-17 are input to the integrated circuit 241 after propagating through the wiring 354-d. That is, the wiring 354-d electrically couples the terminal 353-17 and the integrated circuit 241 to each other. The wiring 354-d through which the diagnosis signal DIG-D and the setting signal TD1 propagate is an example of first wiring.

The terminal 353-15 is electrically coupled to the wiring 354-e. The diagnosis signal DIG-E and the abnormality signal XHOT output from the integrated circuit 241 are input to the terminal 353-15 after propagating through the wiring 354-e. That is, the wiring 354-e electrically couples the terminal 353-15 and the integrated circuit 241 to each other.

Here, it is preferable that a via or the like is not formed in each of the wirings 354-a to 354-d through which each of the diagnosis signals DIG-A to DIG-D propagate, for example, as illustrated in FIG. 21, it is preferable that the connector 350 and the integrated circuit 241 configuring the diagnosis circuit 240 are provided on the first surface 321 as the same surface of the substrate 320. Each of the diagnosis signals DIG-A to DIG-D is a signal for diagnosing whether or not the ink can be normally discharged in the integrated circuit 241. Therefore, it is assumed that when ambient noise interferes at the time of propagating the diagnosis signals DIG-A to DIG-D, the integrated circuit 241 cannot normally perform the diagnosis, and as a result, the ink discharge accuracy of the print head 21 may deteriorate. As the via or the like is not provided in the wiring 354-a to 354-d through which each of the diagnosis signals DIG-A to DIG-D propagates, it is possible to reduce the possibility that noise or the like interferes with the diagnosis signals DIG-A to DIG-D.

When the diagnosis circuit 240 that includes the integrated circuit 241 diagnoses that the ink can be normally discharged from the print head 21 based on the diagnosis signals DIG-A to DIG-D, the integrated circuit 241 outputs, to the driving signal selection circuit 200, the latch signal LAT, the clock signal SCK, and the change signal CH as the latch signal cLAT, the clock signal cSCK, and the change signal cCH. Specifically, the change signal cCH, the clock signal cSCK, and the latch signal cLAT output from the terminal of the integrated circuit 241 (not illustrated) are input to the driving signal selection circuit 200 through the flexible wiring substrate 335 after propagating through the wiring 354-*f* to 354-*h*. That is, the wiring 354-*f* to 354-*h* electrically couples the integrated circuit 241 and the flexible wiring substrate 335 to each other. At least one of the wiring 354-*f* to 354-*h* through which the change signal cCH, the clock signal cSCK, and the latch signal cLAT propagate is an example of sixth wiring.

In detail, the integrated circuit 241 configuring the diagnosis circuit 240 is electrically coupled to the wiring 354-*f*. In addition, when the diagnosis circuit 240 diagnoses that the ink can be normally discharged from the print head 21, the wiring 354-*f* is electrically coupled to the wiring 354-*c* through the integrated circuit 241. Thus, the change signal cCH based on the change signal CH is input to the wiring 354-*f*. The change signal cCH is input any of a plurality of electrodes included in the electrode group 330*a* provided on the second surface 322 of the substrate 320 through the wiring 354-*f*, the via (not illustrated), and the like. In addition, the change signal cCH is input to the driving signal selection circuit 200-1 through the flexible wiring substrate 335 coupled to the electrode group 330*a*. That is, the wiring 354-*f* electrically couples the integrated circuit 241 and the driving signal selection circuit 200-1 through the flexible wiring substrate 335 to each other.

In addition, the integrated circuit 241 is electrically coupled to the wiring 354-*g*. In addition, when the diagnosis circuit 240 diagnoses that the ink can be normally discharged from the print head 21, the wiring 354-*g* is electrically coupled to the wiring 354-*b* through the integrated circuit 241. Thus, the clock signal cSCK based on the clock signal SCK is input to the wiring 354-*g*. The clock signal cSCK is input any of a plurality of electrodes included in the electrode group 330*a* provided on the second surface 322 of the substrate 320 through the wiring 354-*g*, the via (not illustrated), and the like. In addition, the clock signal cSCK is input to the driving signal selection circuit 200-1 through the flexible wiring substrate 335 coupled to the electrode group 330*a*. That is, the wiring 354-*g* electrically couples the integrated circuit 241 and the driving signal selection circuit 200-1 through the flexible wiring substrate 335 to each other.

In addition, the integrated circuit 241 is electrically coupled to the wiring 354-*h*. In addition, when the diagnosis circuit 240 diagnoses that the ink can be normally discharged from the print head 21, the wiring 354-*h* is electrically coupled to the wiring 354-*a* through the integrated circuit 241. Thus, the latch signal cLAT based on the latch signal LAT is input to the wiring 354-*h*. The latch signal cLAT is input any of a plurality of electrodes included in the electrode group 330*a* provided on the second surface 322 of the substrate 320 through the wiring 354-*h*, the via (not illustrated), and the like. In addition, the latch signal cLAT is input to the driving signal selection circuit 200-1 through the flexible wiring substrate 335 coupled to the electrode group 330*a*. That is, the wiring 354-*h* electrically couples the integrated circuit 241, the driving signal selection circuit 200-1, and the flexible wiring substrate 335 to one another.

In FIG. 21, only the wiring 354-*f* to 354-*h* through which the latch signal cLAT, the clock signal cSCK, and the change signal cCH input to the driving signal selection circuit 200-1 propagate is illustrated, and the wiring through which the latch signal cLAT, the clock signal cSCK, and the change signal cCH input to the driving signal selection circuits 200-2 to 200-6 propagate is not illustrated.

In addition, any one of the electrodes included in the electrode group 330*a* and the terminal of the integrated circuit 241 (not illustrated) are electrically coupled to each other by the wiring 354-*p*. Through the wiring 354-*p*, the abnormality signal cXHOT output from the temperature abnormality detection circuit 250 propagates. Moreover, the abnormality signal cXHOT is input to the integrated circuit 241.

Further, as illustrated in FIG. 21, the terminal 353-17 is also electrically coupled to the wiring 354-*i*. After the setting signal TD1 input from the terminal 353-17 propagates through the wiring 354-*i*, the setting signal TD1 is coupled to, through the via (not illustrated) and the like, any of the plurality of electrodes included in the electrode group 330*a* provided on the second surface 322 of the substrate 320. In addition, the wiring 354-*i* is input to the driving signal selection circuit 200 through the flexible wiring substrate 335 electrically coupled to the electrode group 330*a*. That is, the wiring 354-*i* electrically couples the integrated circuit 353-17 and the flexible wiring substrate 335 to each other. The wiring 354-*i* through which the setting signal TD1 propagates is an example of fifth wiring.

As described above, by dividing the wiring through which the setting signal TD propagates into the wiring 354-*d* through which the setting signal TD propagates to the integrated circuit 241 and the wiring 354-*i* through which the setting signal TD propagates to the driving signal selection circuit 200 through the flexible wiring substrate 335, it is possible to reduce a possibility that delay of signal and distortion of waveform that are caused by the integrated circuit 241 occur in the setting signal TD. As described above, a frequency of the setting signal TD is higher than frequencies of the latch signal LAT and the change signal CH. In other words, the frequency of the setting signal TD propagating through the wiring 354-*d* and 354-*i* is higher than the frequencies of the change signal CH propagating through the wiring 354-*c* and the latch signal LAT propagating through the wiring 354-*a*. When delay of signal having such a high frequency and distortion of waveform occur in the setting signal TD, an influence on the ink discharge accuracy increases. That is, by branching, at the substrate 320 of the print head 21, the wiring through which the setting signal TD propagates, the setting signal TD having a higher frequency than the change signal CH propagating through the wiring 354-*c* and the latch signal LAT propagating through the wiring 354-*a*, it is possible to reduce a possibility of delay of signal and distortion of waveform in the setting signal TD and to increase ink discharge accuracy.

In addition, the clock signal SCK is a signal having a monotonous repetition period, whereas the setting signal TD differs in a logical level depending on data included in the setting data signal SP and the print data signal SI that are included therein. Therefore, when delay of signal and distortion of waveform occur in the setting signal TD, a possibility of decrease in the ink discharge accuracy increases. That is, by branching the wiring through which the setting signal TD propagates at the substrate 320 of the print head 21, it is possible to obtain a higher effect for increasing the ink discharge accuracy for a case in which the change signal CH, the clock signal SCK, and the latch signal LAT are branched.

The terminal 353-11 to which the driving signal COM1 is input is electrically coupled to the wiring 354-*j*. After propagating through the wiring 354-*j*, the driving signal COM1 is input any of the plurality of electrodes included in the electrode group 330*a* provided on the second surface 322 of the substrate 320 through the via (not illustrated), or the like. In addition, the driving signal COM1 is input to the driving signal selection circuit 200-1 through the flexible wiring substrate 335 coupled to the electrode group 330a. That is, the wiring 354-j electrically couples the terminal 353-11 and the driving signal selection circuit 200-1 to each other.

Similarly, each of the terminals 353-9, 353-7, 353-5, 353-3, and 353-1 to which the driving signals COM2 to COM6 are input is electrically coupled to each of the wiring 354-k to 354-o. Moreover, each of the driving signals COM2 to COM6 is input to any of the plurality of electrodes included in the electrode groups 330b to 330f provided on the second surface 322 of the substrate 320 through the via (not illustrated), and the like after propagating through the wiring 354-k to 354-o.

Figure 22:
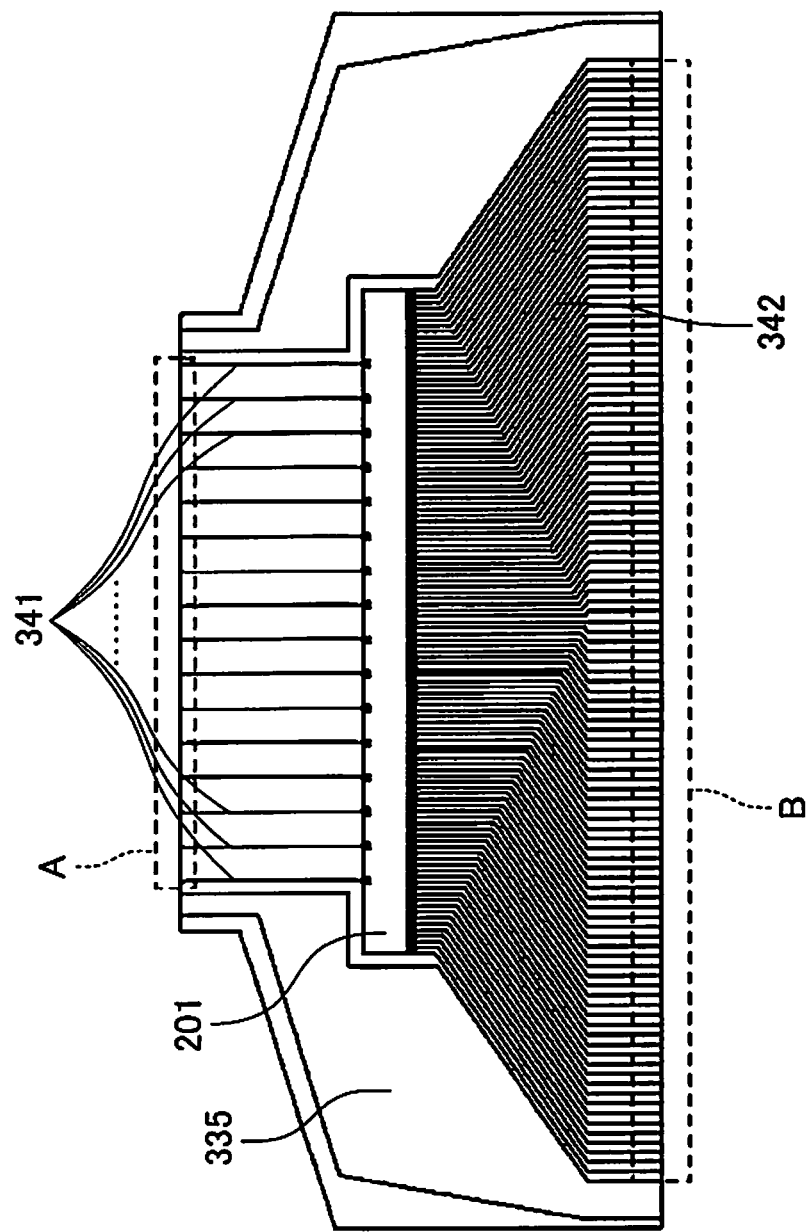
FIG. 22 is a view illustrating a configuration of a flexible wiring substrate.

As described above, the substrate 320 has wiring 354-a to 354-p, and the various signals input from the connector 350 propagate to the flexible wiring substrate 335. Here, FIG. 22 illustrates a configuration of the flexible wiring substrate 335. FIG. 22 is a view illustrating a configuration of the flexible wiring substrate 335.

As illustrated in FIG. 22, the driving signal selection circuit 200 which is the integrated circuit 201 is mounted on the flexible wiring substrate 335. In addition, a plurality of wiring 341 and a plurality of wiring 342 are formed on the flexible wiring substrate 335. One end of the plurality of wiring 341 is electrically coupled to the integrated circuit 201, and the other end thereof is electrically coupled to the electrode group 330 provided on the substrate 320 in an A portion. In addition, one end of the plurality of wiring 342 is electrically coupled to the integrated circuit 201, and the other end thereof is electrically coupled to the electrode wiring 337 in a B portion.

The various signals propagating on the substrate 320 is input to the flexible wiring substrate 335 through the A portion of the flexible wiring substrate 335 electrically coupled to the electrode group 330. In addition, the corresponding signals input to the flexible wiring substrate 335 are input to the integrated circuit 201 propagating through the plurality of wiring 341. The integrated circuit 201 generates and outputs the driving signal VOUT in the driving signal selection circuit 200 included in the integrated circuit 201. Moreover, the driving signal VOUT output from the integrated circuit 201 propagates through the plurality of wiring 342, and is supplied to the corresponding piezoelectric element 60 through the electrode wiring 337.

That is, the flexible wiring substrate 335 has the same number of wiring 341 as the number of signals input from the substrate 320, that is, the number of electrodes formed in the electrode group 330, and has the same number of wiring 342 as the number of plurality of discharge section 600 corresponding to the driving signal selection circuit 200. Therefore, the total number of the wiring 341 the flexible wiring substrate 335 has is less than the total number of wiring 342. For this reason, the number of electrodes arranged in the A portion that electrically couples the wiring 341 of the flexible wiring substrate 335 and the substrate 320 to each other is less than the number of electrodes arranged in the B portion that electrically couples the wiring 342 and the electrode wiring 337 to each other. Therefore, an interval or a pitch between the electrodes in the A portion is wider than an interval between the electrodes in the B portion, for example, the interval between the electrodes in the B portion is 30 μm, whereas the interval between the electrodes in the A portion is 400 μm.

Here, among the plurality of wiring 341, the wiring 341, which electrically couples the wiring 354-i through which the setting signal TD1 propagates and the integrated circuit 201 to each other and through which the setting signal TD1 propagates, is an example of seventh wiring, and the wiring 341 which electrically couples any one of the wiring 354-f to 354-h and the integrated circuit 201 to each other, and the wiring 341 through which at least one of the change signal cCH, the clock signal cSCK, and the latch signal cLAT propagates is an example of eighth wiring.

The flexible wiring substrate 335 may have wiring for propagating the signal propagating on the substrate 320 to the integrated circuit 201 on which the driving signal selection circuit 200 is mounted and for supplying the driving signal VOUT output from the driving signal selection circuit 200 to the plurality of the corresponding discharge sections 600, and the flexible wiring substrate 335 may have a different configuration. However, as described in the present embodiment, by making the substrate a flexible wiring substrate, it is possible to flexibly respond to an interval between the nozzle columns and the number of discharge sections 600 and to improve versatility of the print head 21.

1.9. Operation and Effect

As described above, the liquid discharge apparatus 1 and the print head 21 according to the present embodiment include the connector 350 for inputting the various signals to the print head 21 and outputting the various signals from the print head 21, the integrated circuit 241, and the substrate 320 on which the connector 350 and the integrated circuit 241 are provided.

The substrate 320 has the wiring 354-d electrically coupling the integrated circuit 241 and the terminal 353-17 of the connector 350 to each other, the wiring 354-a electrically coupling the integrated circuit 241 and the terminal 353-23 of the connector 350 to each other, the wiring 354-c electrically coupling the integrated circuit 241 and the terminal 353-19 of the connector 350 to each other, the wiring 354-b electrically coupling the integrated circuit 241 and the terminal 353-21 of the connector 350 to each other. That is, the signal input from each of the terminals 353-17, 353-23, 353-19, and 353-21 of the connector 350 to the print head 21 propagates through the wiring 354-d, 354-a, 354-c, and 354-b, and is input to the integrated circuit 241.

In addition, the substrate 320 has the wiring 354-i electrically coupling the terminal 353-17 of the connector 350 and the flexible wiring substrate 335. That is, among the signals input from the connector 350 to the print head 21, the signal input from the terminal 353-17 is branched at the substrate 320, the branched one signal propagates through the wiring 354-d and is input to the integrated circuit 241, and the branched other signal propagates through the wiring 354-i and is input to the flexible wiring substrate 335.

In general, an integrated circuit device such as the integrated circuit 241 performs various processing such as calculation processing, determination processing, and the like based on the input signals, and outputs the signal based on processing results. For this reason, a circuit is configured to perform the processing in the integrated circuit device. Therefore, a possibility that, in the signal propagating through the integrated circuit device, delay of signal and distortion of waveform occur increases.

On the other hand, in the liquid discharge apparatus 1 and the print head 21 according to the present embodiment, the signal input from the terminal 353-17 of the connector 350 to the print head 21 is branched at the substrate 320. The branched one signal propagates through the wiring 354-d and is input to the integrated circuit 241, and the branched other signal propagates through the wiring 354-i and is input to the flexible wiring substrate 335. Therefore, the signal with possibility of delay of signal and distortion of waveform that are caused by a configuration of the integrated circuit 241 being reduced, is input to the flexible wiring substrate 335.

Therefore, the integrated circuit 241 has a self-diagnosis function, and when the driving signal selection circuit 200 discharges the ink from the nozzle 651 based on the signals input to the flexible wiring substrate 335, the driving signal selection circuit 200 electrically coupled to the flexible wiring substrate 335, a possibility that delay of signal and distortion of waveform that are caused by the integrated circuit 241 for performing the self-diagnosis function in the signals input to the flexible wiring substrate 335 occur is reduced. Thus, in the liquid discharge apparatus 1 and the print head 21 according to the present embodiment, even when the signal for performing the self-diagnosis function and the signal for performing print processing of discharging ink from the nozzle propagate through the common signal path, by inputting the signals to the terminal 353-17 of the connector 350, it is possible to achieve both normally performing the self-diagnosis function of the print head 21 and performing the print processing while reducing the possibility of discharge accuracy deterioration of ink discharged from the nozzle 651.

In addition, in the liquid discharge apparatus 1 and the print head 21 according to the present embodiment, even when the integrated circuit 201 for controlling discharge of ink from the nozzle 651 is mounted on the flexible wiring substrate 335, since the signal with possibility of delay of signal and distortion of waveform that are caused by a configuration of the integrated circuit 241 being reduced, is input to the flexible wiring substrate 335, a possibility that delay of signal and distortion of waveform that are caused by the integrated circuit 241 for performing the self-diagnosis function in the signals input to the integrated circuit 201 occur is reduced.

In the liquid discharge apparatus 1 and the print head 21 according to the present embodiment, the connector 350 and the integrated circuit 241 are provided on the same surface of the substrate 320. Accordingly, a possibility that noise or the like is superimposed on the signal input from each of the terminals 353-17, 353-23, 353-19, and 353-21 of the connector 350, propagating through the wiring 354-*d*, 354-*a*, 354-*c*, and 354-*b*, and input to the integrated circuit 241 is reduced. Thus, processing accuracy of the calculation processing, the determination processing, and the like performed in the integrated circuit 241 is improved. That is, when the integrated circuit 241 has the self-diagnosis function, it is possible to improve accuracy of self-diagnosis in the integrated circuit 241. Therefore, it is possible to achieve both further improving accuracy of the self-diagnosis function of the print head 21 performed in the integrated circuit 241 and performing the print processing while reducing the possibility of ink discharge accuracy deterioration.

In the liquid discharge apparatus 1 and the print head 21 according to the present embodiment, when the print head 21 includes the plurality of flexible wiring substrates 335, the wiring 354-*i* electrically coupled to the terminal 353-17 is electrically coupled to the flexible wiring substrate 335 which is closest to the connector 350 including the terminal 353-17.

A length of the wiring in a case where the wiring propagating the signal input from the terminal 353-17 is branched is longer than that of a case where the wiring is not branched. For this reason, a possibility that external noise interferes with the wiring through which the signal propagates increases. In the liquid discharge apparatus 1 and the print head 21 according to the present embodiment, it is possible to reduce that the length of the wiring 354-*i* becomes longer by setting, as the flexible wiring substrate 335 closest to the connector 350, the flexible wiring substrate 335 electrically coupled to one wiring 354-*i* branched at the substrate 320. Thus, a possibility that external noise interferes with the wiring 354-*i* is reduced. Therefore, it is possible to reduce a possibility that external noise interferes with the signal input from the terminal 353-17 and distortion of waveform of the signal occur, and it is possible to further improve the accuracy of the self-diagnosis function of the print head 21 performed in the integrated circuit 241 and to reduce a possibility of ink discharge accuracy deteriorate.

In addition, in the liquid discharge apparatus 1 and the print head 21 according to the present embodiment, the integrated circuit 241 may perform the self-diagnosis of the print head 21 in accordance with the plurality of the input signals, and in this case, it is preferable that a frequency of the signals input to the terminal 353-17 of the connector 350 is higher than a frequency of the signals input to the terminals 353-19 and 353-23. That is, the frequency of the setting signal TD propagating through the wiring 354-*d* electrically coupling the terminals 353-17 and the integrated circuit 241 to each other may be higher than the frequency of the change signal CH propagating through the wiring 354-*c* electrically coupling the terminal 353-19 and the integrated circuit 241 to each other. Further, the frequency of the setting signal TD propagating through the wiring 354-*d* electrically coupling the terminals 353-17 and the integrated circuit 241 to each other may be higher than the frequency of the latch signal LAT propagating through the wiring 354-*a* electrically coupling the terminal 353-23 and the integrated circuit 241 to each other. In other words, among the signals input to the print head 21, the frequency of the signal branched at the substrate 320 may be a high frequency.

When delay of signal and distortion of waveform occur in the integrated circuit 241, delay time of signal and an amount of distortion of waveform contribute to a configuration of the integrated circuit 241. That is, it may be the substantially same delay time and distortion amount regardless of the frequency of signal input to the integrated circuit 241. Therefore, when delay of signal and distortion of waveform occur in the integrated circuit 241, the influence thereof increases as the signal input to the integrated circuit 241 is a high frequency. Therefore, the frequency of the signals input to the terminal 353-17 of the connector 350 is higher than the frequency of the signals input to the terminals 353-19 and 353-23, such that it possible to reduce an influence of delay of signal and distortion of waveform that are caused by the integrated circuit 241, in the liquid discharge apparatus 1 and the print head 21. As a result, it is possible to reduce a possibility of ink discharge accuracy deterioration due to delay of signal and the waveform distortion that are caused by the integrated circuit 241 for performing the self-diagnosis function.

2. Second Embodiment

Next, a liquid discharge apparatus 1 and a print head 21 in a second embodiment will be described. In the description of the liquid discharge apparatus 1 and the print head 21 in the second embodiment, the same components as in the first embodiment are given the same reference numerals, and the description thereof will be omitted or simplified.

Figure 23:
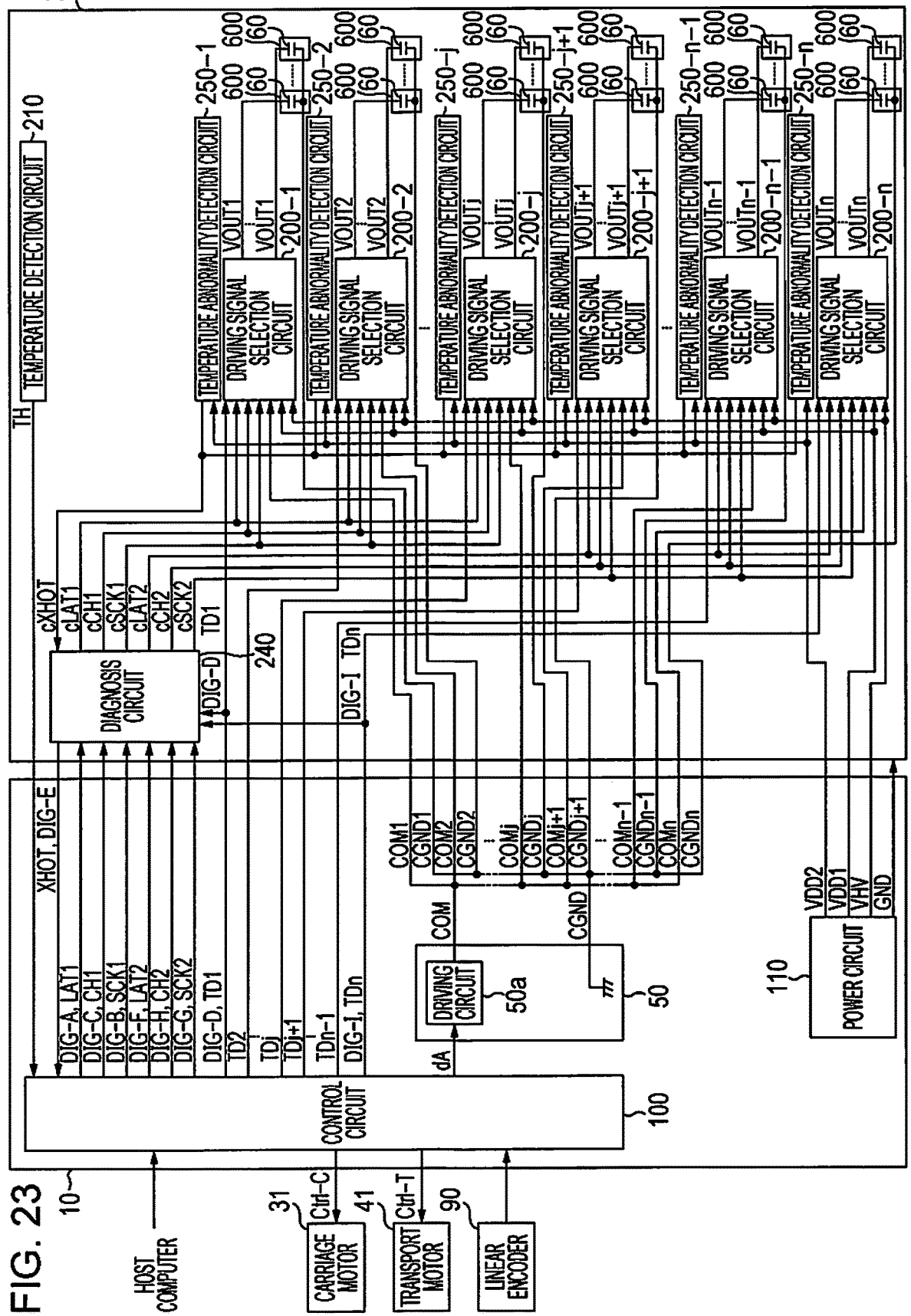
FIG. 23 is a block diagram illustrating an electrical configuration of a liquid discharge apparatus in a second embodiment.

FIG. 23 is a block diagram illustrating an electrical configuration of the liquid discharge apparatus 1 in a second embodiment. As illustrated in FIG. 23, the control circuit 100 in the second embodiment is different from the first embodiment in that the control circuit 100 generates two latch signals LAT1 and LAT2 specifying a discharge timing of the print head 21, two change signals CH1 and CH2 specifying a waveform switching timing of the driving signal COM, and two clock signals SCK1 and SCK2 for specifying a timing at which the setting signal TD is input, and outputs the latch signals LAT1 and LAT2, the change signals CH1 and CH2, and the lock signals SCK1 and SCK2 to the print head 21. In addition, the control circuit 100 in the second embodiment is different from the first embodiment in that the control circuit 100 generates diagnosis signals DIG-A to DIG-D, and DIG-F to DIG-I for diagnosing whether or not the print head 21 can discharge liquid normally and outputs the diagnosis signals DIG-A to DIG-D and DIG-F to DIG-I to the print head 21.

Here, in the liquid discharge apparatus 1 in the second embodiment, the diagnosis signal DIG-A and the latch signal LAT1, the diagnosis signal DIG-B and the clock signal SCK1, the diagnosis signal DIG-C and the change signal CH1, the diagnosis signal DIG-D and the setting signal TD1, the diagnosis signal DIG-F and the latch signal LAT2, the diagnosis signal DIG-G and the clock signal SCK2, the diagnosis signal DIG-H and the change signal CH2, and the diagnosis signal DIG-I and the setting signal TDn are output to the diagnosis circuit 240 included in the print head 21 through the common propagation path.

The diagnosis circuit 240 diagnoses whether or not the ink can be normally discharged based on the diagnosis signals DIG-A to DIG-D and DIG-F to DIG-I. When the diagnosis circuit 240 diagnoses that the ink can be normally discharged from the print head 21 based on the diagnosis signals DIG-A to DIG-D, the diagnosis circuit 240 outputs the latch signal LAT1, the clock signal SCK1, and the change signal CH1, input through the common propagation path with the diagnosis signals DIG-A to DIG-C, as a latch signal cLAT1, a clock signal cSCK1, and a change signal cCH1. In addition, when the diagnosis circuit 240 diagnoses that the ink can be normally discharged in the print head 21 based on the diagnosis signals DIG-F to DIG-I, the diagnosis circuit 240 outputs the latch signal LAT2, the clock signal SCK2, and the change signal CH2, input through the common propagation path with the diagnosis signals DIG-F to DIG-H, as a latch signal cLAT2, a clock signal cSCK2, and a change signal cCH2.

Here, after the setting signal TD1 input through the common propagation path with the diagnosis signal DIG-D among the signals input to the diagnosis circuit 240, is branched in the print head 21, the branched one signal is input to the diagnosis circuit 240 and the branched other signal is input to the driving signal selection circuit 200-1. In addition, after the setting signal TDn input through the common propagation path with the diagnosis signal DIG-I among the signals input to the diagnosis circuit 240, is branched in the print head 21, the branched one signal is input to the diagnosis circuit 240 and the branched other signal is input to the driving signal selection circuit 200-n.

In the following description, it is described that the print head 21 in the second embodiment includes 10 driving signal selection circuits 200-1 to 200-10. Therefore, the 10 setting signals TD1 to TD10 corresponding to each of the 10 driving signal selection circuits 200-1 to 200-10, the 10 driving signals COM1 to COM10, and the 10 reference voltage signals CGND1 to CGND10 are input to the print head 21 in the second embodiment.

Figure 24:
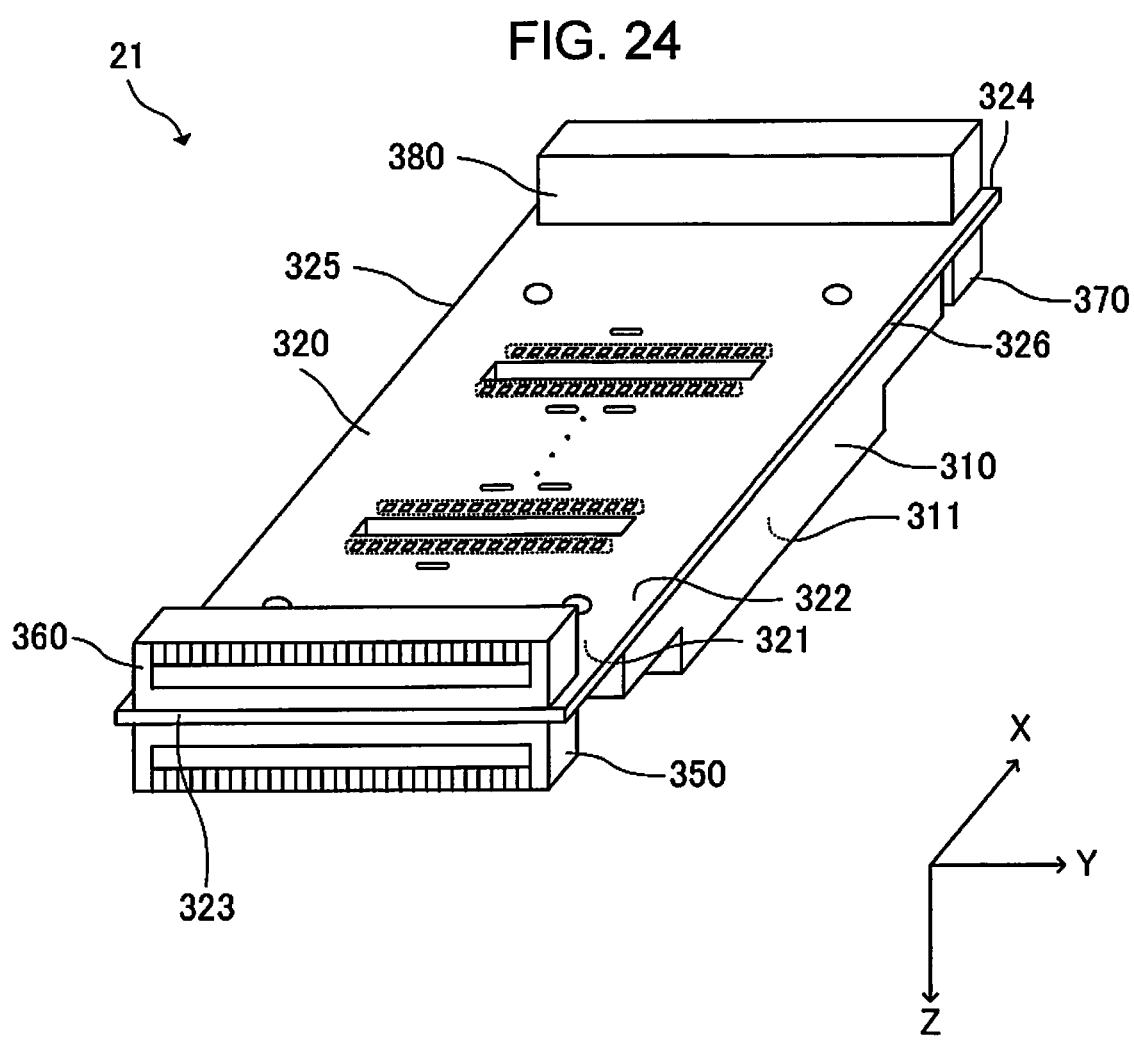
FIG. 24 is a perspective view illustrating a configuration of a print head in the second embodiment.

FIG. 24 is a perspective view illustrating a configuration of the print head 21 in the second embodiment. As illustrated in FIG. 24, the print head 21 includes a head 310 and a substrate 320. In addition, an ink discharge surface 311 on which the plurality of discharge sections 600 are formed is located on a lower surface of the head 310 in the Z direction.

Figure 25:
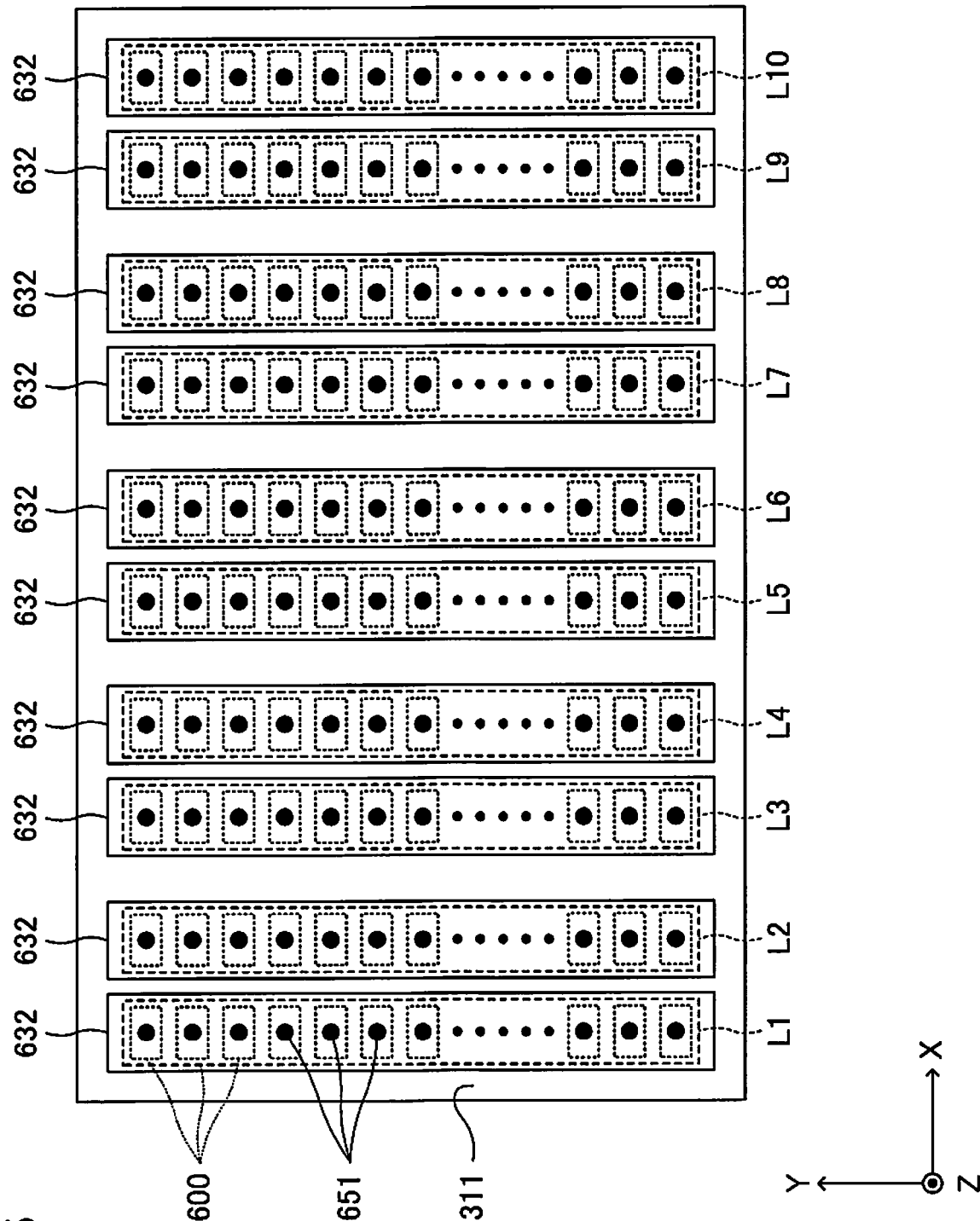
FIG. 25 is a plan view illustrating a configuration of an ink discharge surface in the second embodiment.

FIG. 25 is a plan view illustrating a configuration of the ink discharge surface 311 of the head 310 in the second embodiment. As illustrated in FIG. 25, in the second embodiment, 10 nozzle plates 632 on which a plurality of nozzles 651 are formed are juxtaposed on the ink discharge surface 311 in the X direction. In addition, nozzle columns L1 to L10 in which the nozzles 651 are juxtaposed in the Y direction are formed in each of the nozzle plates 632. The nozzle columns L1 to L10 are provided corresponding to the driving signal selection circuits 200-1 to 200-10, respectively. That is, the plurality of piezoelectric elements 60 included in each of the nozzle columns L1 to L10 form a plurality of piezoelectric element groups.

Returning to FIG. 24, the substrate 320 has a first surface 321 and a second surface 322 facing the first surface 321, and has a substantially rectangular shape formed of a first side 323, a second side 324 facing the first side 323 in the X direction, a third side 325, and a fourth side 326 facing the third side 325 in the Y direction.

Figure 26:
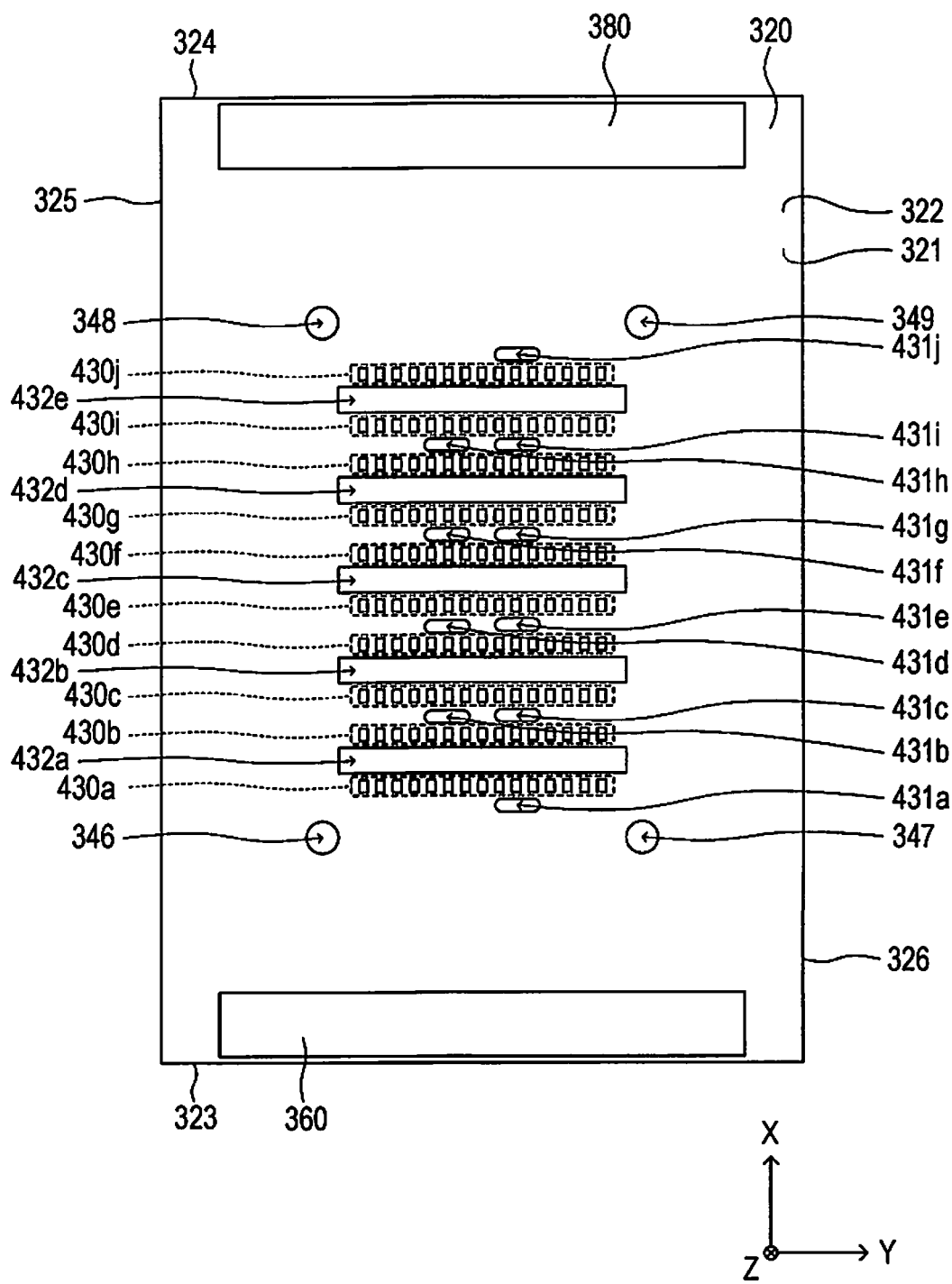
FIG. 26 is a plan view illustrating a substrate in the second embodiment when viewed from a second surface.
Figure 27:
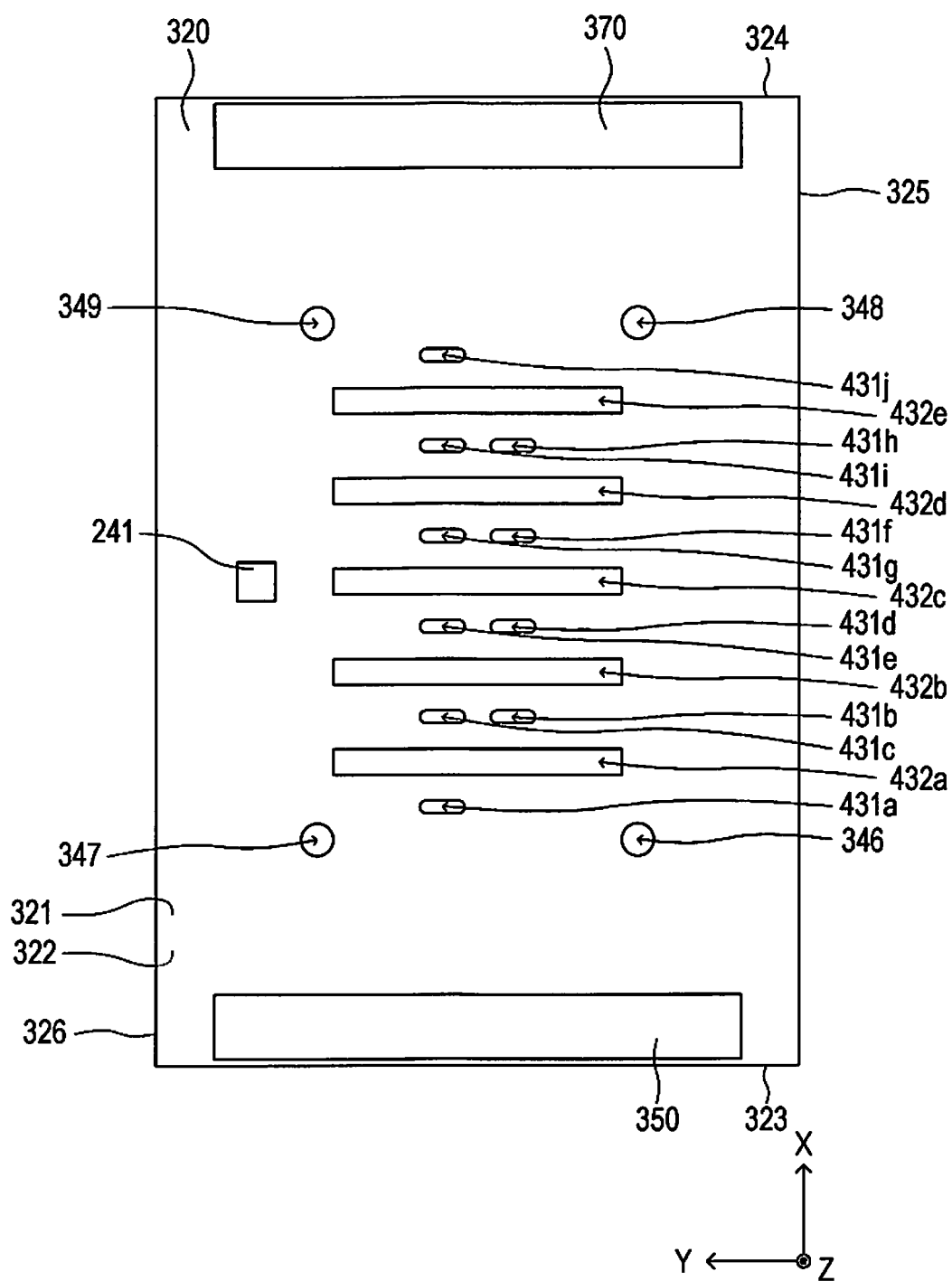
FIG. 27 is a plan view illustrating the substrate in the second embodiment when viewed from a first surface.

FIGS. 26 and 27 illustrate a configuration of the substrate 320 in the second embodiment. FIG. 26 is a plan view illustrating the substrate 320 in the second embodiment when viewed from the second surface 322. In addition, FIG. 27 is a plan view illustrating the substrate 320 in the second embodiment when viewed from the first surface 321.

As illustrated in FIGS. 26 and 27, electrode groups 430a to 430j are provided on the second surface 322 of the substrate 320. Specifically, each of the electrode groups 430a to 430j has a plurality of electrodes which are juxtaposed in the Y direction. The electrode groups 430a to 430j are located in order of the electrode groups 430a, 430b, 430c, 430d, 430e, 430f, 430g, 430h, 430i, and 430j, from the first side 323 toward the second side 324. Here, each of the electrode groups 430a to 430j has a same configuration as each of the electrode groups 330a to 330f in the first embodiment.

In addition, ink supply path insertion holes 431a to 431j and FPC insertion holes 432a to 432e that are through-holes penetrating through the first surface 321 and the second surface 322 of the substrate 320 are formed in the substrate 320.

The FPC insertion hole 432a is located between the electrode group 430a and the electrode group 430b in the X direction, and a flexible wiring substrate 335 electrically coupled to the electrode group 430a and a flexible wiring substrate 335 electrically coupled to the electrode group 430b are inserted therethrough. The FPC insertion hole 432b is located between the electrode group 430c and the electrode group 430d in the X direction, and a flexible wiring substrate 335 electrically coupled to the electrode group 430c and a flexible wiring substrate 335 electrically coupled to the electrode group 430d are inserted therethrough. The FPC insertion hole 432c is located between the electrode group 430e and the electrode group 430f in the X direction, and a flexible wiring substrate 335 electrically coupled to the electrode group 430e and a flexible wiring substrate 335 electrically coupled to the electrode group 430f are inserted therethrough. The FPC insertion hole 432d is located between the electrode group 430g and the electrode group 430h in the X direction, and a flexible wiring substrate 335 electrically coupled to the electrode group 430g and a flexible wiring substrate 335 electrically coupled to the electrode group 430h are inserted therethrough. The FPC insertion hole 432e is located between the electrode group 430i and the electrode group 430j in the X direction, and a flexible wiring substrate 335 electrically coupled to the electrode group 430i and a flexible wiring substrate 335 electrically coupled to the electrode group 430j are inserted therethrough.

The ink supply path insertion hole 431a is located on the first side 323 of the electrode group 430a in the X direction. The ink supply path insertion holes 431b and 431c are located between the electrode group 430b and the electrode group 430c in the X direction, the ink supply path insertion hole 431b and the ink supply path insertion hole 431c are juxtaposed along the Y direction on the third side 325 and on the fourth side 326, respectively. The ink supply path insertion holes 431d and 431e are located between the electrode group 430d and the electrode group 430e in the X direction, the ink supply path insertion hole 431d and the ink supply path insertion hole 431e are juxtaposed along the Y direction on the third side 325 and on the fourth side 326, respectively. The ink supply path insertion holes 431f and 431g are located between the electrode group 430f and the electrode group 430g in the X direction, the ink supply path insertion hole 431f and the ink supply path insertion hole 431g are juxtaposed along the Y direction on the third side 325 and on the fourth side 326, respectively. The ink supply path insertion holes 431h and 431i are located between the electrode group 430h and the electrode group 430i in the X direction, the ink supply path insertion hole 431h and the ink supply path insertion hole 431i are juxtaposed along the Y direction on the third side 325 and on the fourth side 326, respectively. The ink supply path insertion hole 431j is located on the second side 324 of the electrode group 430j in the X direction. In addition, some of ink supply paths (not illustrated) are inserted into each of the ink supply path insertion holes 331a to 331f, the ink supply paths communicating with the ink supply port 661 for introducing the ink to the discharge section 600 corresponding to each of the nozzle columns L1 to L6.

Each of the ink supply path insertion holes 431a to 431j has the same configuration as each of the ink supply path insertion holes 331a to 331f in the first embodiment, and each of the FPC insertion holes 432a to 432e has the same configuration as each of the FPC insertion holes 332a to 332c in the first embodiment.

As illustrated in FIG. 27, the integrated circuit 241 configuring the diagnosis circuit 240 is provided on the first surface 321 of the substrate 320. The integrated circuit 241 is provided between the fixation portions 347 and 349 on the first surface 321 of the substrate 320, and is provided on the fourth side 326 of the FPC insertion holes 432a to 432e. The integrated circuit 241 configuring the diagnosis circuit 240 determines whether or not the ink can be normally discharged from the nozzle 651 based on the diagnosis signals DIG-A to DIG-D and DIG-F to DIG-I. In FIG. 27, one integrated circuit 241 is illustrated as the diagnosis circuit 240, but two or more integrated circuit devices may configure the diagnosis circuit 240. Specifically, the integrated circuit 241 determining whether or not the ink can be normally discharged from the nozzle 651 based on the diagnosis signals DIG-A to DIG-D and the integrated circuit 241 determining whether or not the ink can be normally discharged from the nozzle 651 based on the diagnosis signals DIG-F to DIG-I may be provided on the substrate 320.

As illustrated in FIGS. 26 and 27, connectors 350, 360, 370, and 380 are provided on the substrate 320. The connector 350 is provided along the first side 323 on the first surface 321 of the substrate 320. The connector 360 is provided along the first side 323 on the second surface 322 of the substrate 320. The connectors 350 and 360 in the second embodiment are different from the first embodiment in that the number of the plurality of terminals included in connectors 350 and 360 is 20, and other configurations thereof are the same as the first embodiment. For this reason, the detail description of the connectors 350 and 360 will be omitted in the second embodiment. In the second embodiment, the 20 terminals 353 juxtaposed on the connector 350 are referred to as the terminals 353-1, 353-2, . . . , 353-20, in order from the third side 325 to the fourth side 326 in a direction along the first side 323, and similarly, the 20 terminals 363 juxtaposed on the connector 350 are referred to as the terminals 363-1, 363-2, . . . , 363-20, in order from the third side 325 to the fourth side 326 in a direction along the first side 323.

Figure 28:
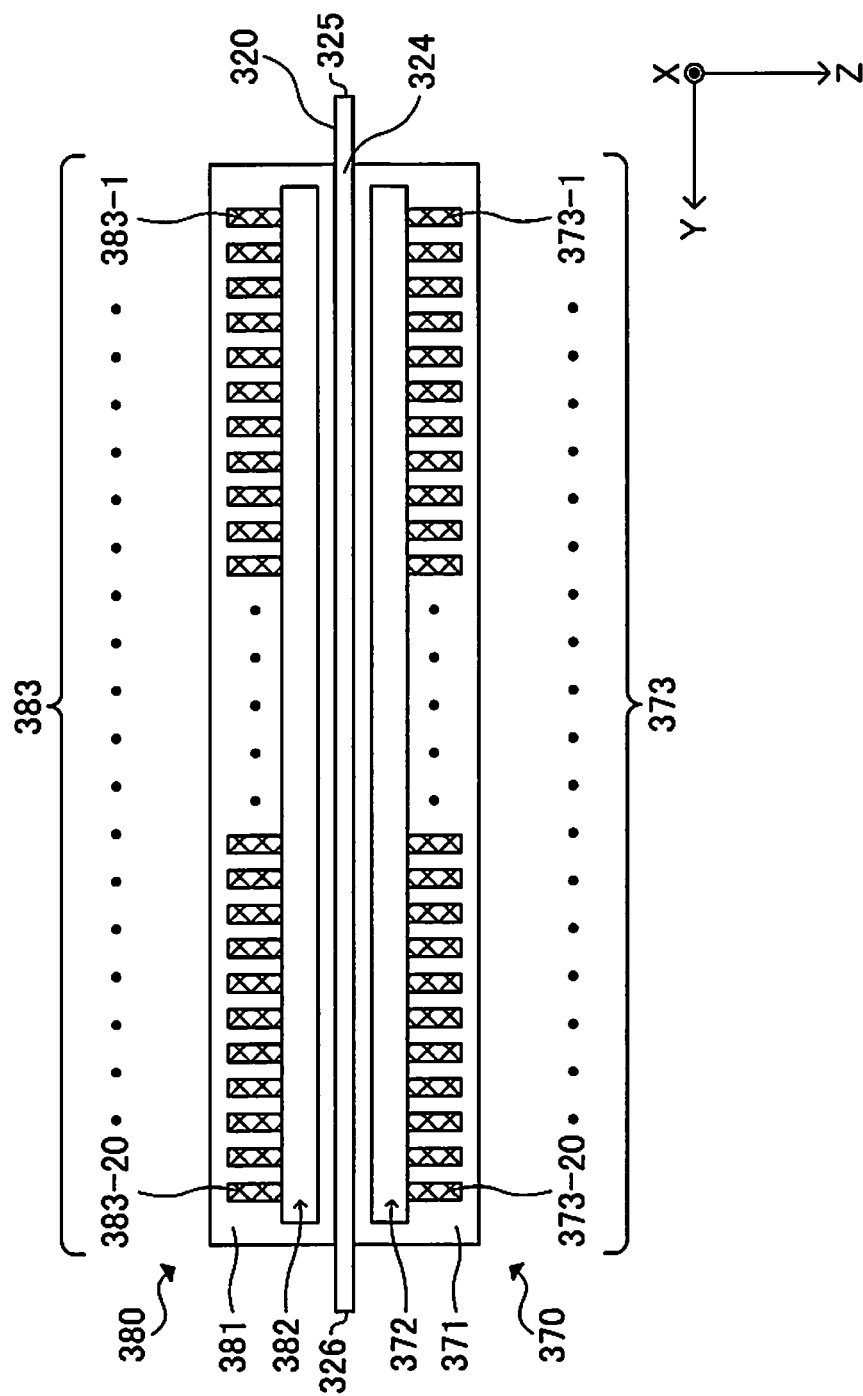
FIG. 28 is a view illustrating a configuration of connectors.

The connector 370 is provided along the second side 324 on the first surface 321 of the substrate 320. The connector 380 is provided along the second side 324 on the second surface 322 of the substrate 320. FIG. 28 illustrates a configuration of the connectors 370 and 380. FIG. 28 is a view illustrating a configuration of the connectors 370 and 380.

The connector 370 includes a housing 371, a cable attachment section 372 formed in the housing 371, and a plurality of terminals 373. The plurality of terminals 373 are juxtaposed along the second side 324. Specifically, 20 terminals 373 are juxtaposed along the second side 324. Here, the 20 terminals 373 are referred to as terminals 373-1, 373-2, . . . , and 373-20 in order from the third side 325 toward the fourth side 326 in a direction along the second side 324. The cable attachment section 372 is located on the substrate 320 of the plurality of terminals 373 in the Z direction. A propagation path such as flexible flat cables is installed in the cable attachment section 372.

The connector 380 includes a housing 381, a cable attachment section 382 formed in the housing 381, and a plurality of terminals 383. The plurality of terminals 383 are juxtaposed along the second side 324. Specifically, 20 terminals 383 are juxtaposed along the second side 324. Here, the 20 terminals 383 is referred to as terminals 383-1, 383-2, . . . , and 383-20 in order from the third side 325 toward the fourth side 326 in a direction along the second side 324. The cable attachment section 382 is located on the substrate 320 of the plurality of terminals 383 in the Z direction. A propagation path such as flexible flat cables is installed in the cable attachment section 382.

Figure 29:
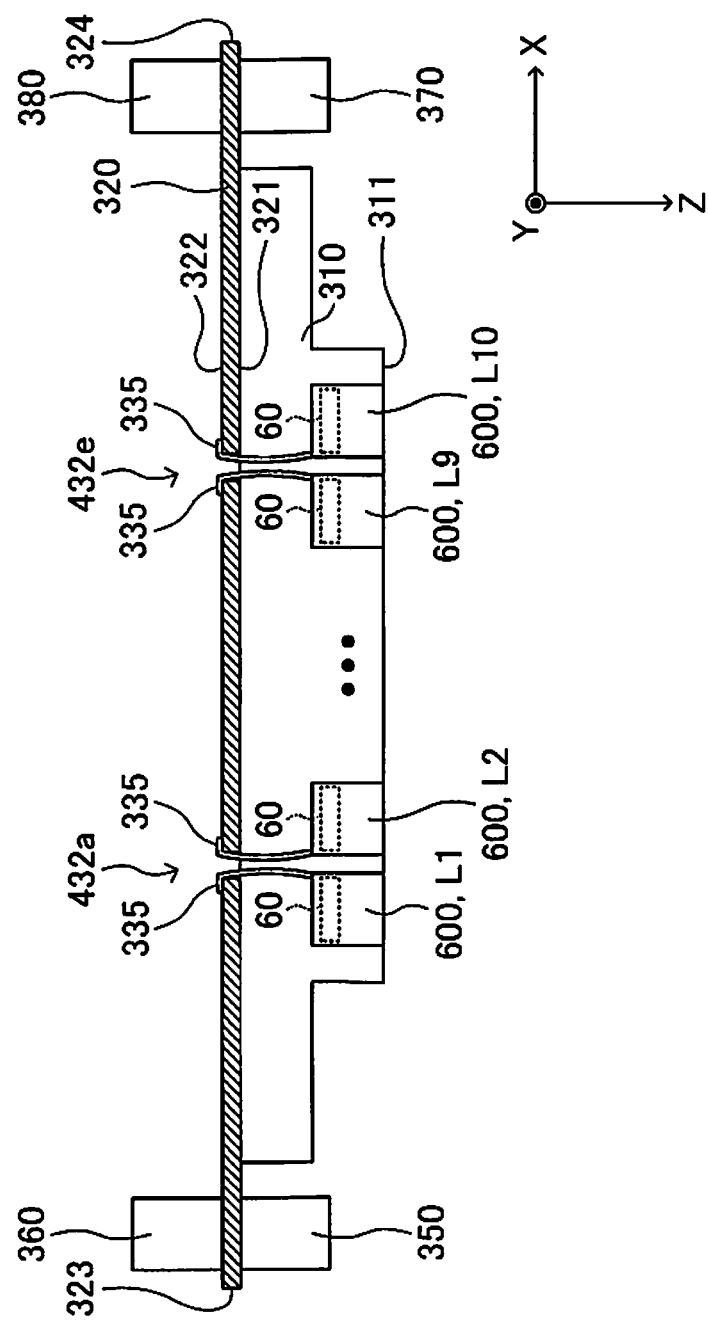
FIG. 29 is a sectional view illustrating a print head in the second embodiment when viewed from a Y direction.

FIG. 29 is a sectional view illustrating the print head 21 in the second embodiment when viewed from a Y direction. As illustrated in FIG. 29, the plurality of nozzle columns L1 to L10 are juxtaposed in a direction along the X direction. Specifically, the plurality of nozzle columns L1 to L10 are juxtaposed from the first side 323 on which the connector 350 of the substrate 320 is provided toward the second side 324 on which the connector 370 is provided, that is, in order of the nozzle columns L1, L2, L3, L4, L5, L6, L7, L8, L9, and L10.

Therefore, the shortest distance between the plurality of the piezoelectric elements 60 included in the nozzle column L1 corresponding to the driving signal selection circuit 200-1 and the connector 350 is shorter than the shortest distance between the plurality of piezoelectric elements 60 included in the nozzle column L2 corresponding to the driving signal selection circuit 200-2 and the connector 350. Further, in this case, the piezoelectric element 60 included in other nozzle columns L2 to L10 and each of the nozzle columns L2 to L10 is not located between the plurality of piezoelectric elements 60 included in the nozzle column L1 corresponding to the driving signal selection circuit 200-1 and the connector 350. In other words, the nozzle column L1 is located closest to the connector 350 among the nozzle columns L1 to L10 formed on the ink discharge surface 311.

That is, the print head 21 includes the plurality of flexible wiring substrates 335 electrically coupled to the substrate 320, and the shortest distance between the flexible wiring substrate 335 corresponding to the nozzle column L1 and the connector 350 is shorter than the shortest distance between the flexible wiring substrate 335 corresponding to the nozzle column L2 and the connector 350. Furthermore, the flexible wiring substrate 335 corresponding to the nozzle column L1 is provided closest to the connector 350 among the plurality of flexible wiring substrates 335 included in the print head 21. Here, the flexible wiring substrate 335 corresponding to the nozzle column L1 is an example of a first wiring substrate in the second embodiment, the flexible wiring substrate 335 corresponding to the nozzle column L2 is an example of a second wiring substrate in the second embodiment, and the plurality of flexible wiring substrates 335 including the flexible wiring substrate 335 corresponding to the nozzle column L1 and the flexible wiring substrate 335 corresponding to the nozzle column L2 are an example of a plurality of wiring substrates in the second embodiment. In addition, the connector 350 is an example of a connector in the second embodiment.

Similarly, the shortest distance between the plurality of the piezoelectric elements 60 included in the nozzle column L10 corresponding to the driving signal selection circuit 200-10 and the connector 370 is shorter than the shortest distance between the plurality of piezoelectric elements 60 included in the nozzle column L9 corresponding to the driving signal selection circuit 200-9 and the connector 370. Further, in this case, the piezoelectric element 60 included in other nozzle columns L1 to L9 and each of the nozzle columns L1 to L9 is not located between the plurality of piezoelectric elements 60 included in the nozzle column L10 corresponding to the driving signal selection circuit 200-10 and the connector 370. In other words, the nozzle column L10 is located closest to the connector 360 among the nozzle columns L1 to L10 formed on the ink discharge surface 311.

That is, the print head 21 includes the plurality of flexible wiring substrates 335 electrically coupled to the substrate 320, and the shortest distance between the flexible wiring substrate 335 corresponding to the nozzle column L10 and the connector 360 is shorter than the shortest distance between the flexible wiring substrate 335 corresponding to the nozzle column L9 and the connector 360. Furthermore, the flexible wiring substrate 335 corresponding to the nozzle column L10 is provided closest to the connector 360 among the plurality of flexible wiring substrates 335 included in the print head 21. Here, the flexible wiring substrate 335 corresponding to the nozzle column L10 is an example of another first wiring substrate in the second embodiment, and the flexible wiring substrate 335 corresponding to the nozzle column L9 is an example of another second wiring substrate in the second embodiment. In addition, the connector 370 is an example of another connector in the second embodiment.

Next, FIGS. 30 to 33 illustrate details of signals input to the connectors 350, 360, 370, and 380.

FIG. 30 is a view for explaining details of signals input to the connector 350 in the second embodiment. As illustrated in FIG. 30, the connector 350 includes a terminal to which each of the driving signals COM1 to COM5 is input, a terminal to which each of the reference voltage signals CGND1 to CGND5 is input, a terminal to which the temperature signal TH, the latch signal LAT1, the clock signal SCK1, the change signal CH1, the setting signal TD1 are input, a terminal to which each of the diagnosis signals DIG-A to DIG-D is input, and a plurality of terminals to which a plurality of ground signals GND are input.

Specifically, the driving signals COM1 to COM5 are input to the terminals 353-9, 353-7, 353-5, 353-3, and 353-2, respectively. In addition, the reference voltage signals CGND1 to CGND5 are input from the terminals 353-10, 353-8, 353-6, 353-4, and 353-2, respectively.

The diagnosis signals DIG-A and the latch signal LAT1 are input to the terminal 353-17. That is, the terminal 353-17 serves as the terminal to which the diagnosis signal DIG-A is input and the terminal to which the latch signal LAT1 is input. Here, the terminal 353-17, which serves as the terminal to which the diagnosis signal DIG-A is input and the terminal to which the latch signal LAT1 is input, is an example of a second terminal in the second embodiment.

The diagnosis signals DIG-B and the latch signal SCK1 are input to the terminal 353-15. That is, the terminal 353-15 serves as the terminal to which the diagnosis signal DIG-B is input and the terminal to which the clock signal SCK1 is input. Here, the terminal 353-15, which serves as the terminal to which the diagnosis signal DIG-B is input and the terminal to which the clock signal SCK1 is input, is an example of a fourth terminal in the second embodiment.

The diagnosis signals DIG-C and the change signal CH1 are input to the terminal 353-13. That is, the terminal 353-13 serves as the terminal to which the diagnosis signal DIG-C is input and the terminal to which the change signal CH1 is input. Here, the terminal 353-13, which serves as the terminal to which the diagnosis signal DIG-C is input and the terminal to which the change signal CH1 is input, is an example of a third terminal in the second embodiment.

The diagnosis signals DIG-D and the setting signal TD1 are input to the terminal 353-11. That is, the terminal 353-11 serves as the terminal to which the diagnosis signal DIG-D is input and the terminal to which the setting signal TD1 is input. Here, the terminal 353-11, which serves as the terminal to which the diagnosis signal DIG-D is input and the terminal to which the setting signal TD1 is input, is an example of a first terminal in the second embodiment.

As described above, the connector 350 has the terminal 353-11 to which the diagnosis signal DIG-D is input, the terminal 353-17 to which the diagnosis signal DIG-A is input, the terminal 353-13 to which the diagnosis signal DIG-C is input, the terminal 353-15 to which the diagnosis signal DIG-B is input, and the terminal 353-9 to which the driving signal COM1 is input.

The temperature signal TH is input to the terminal 353-19 of the connector 350. In addition, the ground signal GND is input to each of the terminals 353-12, 353-14, 353-16, 353-18, and 353-20.

FIG. 31 is a view for explaining details of signals input to the connector 360 in the second embodiment. As illustrated in FIG. 31, the connector 360 includes a terminal to which each of the driving signals COM1 to COM5 is input, a terminal to which each of the reference voltage signals CGND1 to CGND5 is input, a terminal to which the each of the setting signals TD2 to TD5 is input, a terminal to which the voltage VDD1 is input, and a plurality of terminals to which a plurality of ground signals GND are input.

Specifically, the driving signals COM1 to COM5 are input to the terminals 363-10, 363-8, 363-6, 363-4, and 363-2, respectively. In addition, the reference voltage signals CGND1 to CGND5 are input from the terminals 363-9, 363-7, 363-5, 363-3, and 363-1, respectively.

The setting signals TD2 to TD5 are input from the terminals 363-18, 363-16, 363-14, and 363-12, respectively. In addition, the voltage VDD1 is input to the terminal 363-20. In addition, the ground signal GND is input to each of the terminals 353-11, 353-13, 353-15, 353-17, and 353-19.

FIG. 32 is a view for explaining details of signals input to the connector 370. As illustrated in FIG. 32, the connector 370 includes a terminal to which each of the driving signals COME to COM10 is input, a terminal to which each of the reference voltage signals CGND6 to CGND10 is input, a terminal to which the abnormality signal XHOT, the latch signal LAT2, the clock signal SCK2, the change signal CH2, the setting signal TD10 are input, a terminal to which each of the diagnosis signals DIG-E to DIG-I is input, and a plurality of terminals to which a plurality of ground signals GND are input.

Specifically, the driving signals COM6 to COM10 are input to the terminals 373-2, 373-4, 373-6, 373-8, and 373-10, respectively. In addition, the reference voltage signals CGND6 to CGND10 are input to the terminals 373-1, 373-3, 373-5, 373-7, and 373-9, respectively.

The diagnosis signals DIG-E and the abnormality signal XHOT are input to the terminal 373-12.

The diagnosis signals DIG-F and the latch signal LAT2 are input to the terminal 373-14. That is, the terminal 373-14 serves as the terminal to which the diagnosis signal DIG-F is input and the terminal to which the latch signal LAT2 is input. Here, the terminal 373-14, which serves as the terminal to which the diagnosis signal DIG-F is input and the terminal to which the latch signal LAT2 is input, is an example of another second terminal in the second embodiment.

The diagnosis signals DIG-G and the clock signal SCK2 are input to the terminal 373-16. That is, the terminal 373-16 serves as the terminal to which the diagnosis signal DIG-G is input and the terminal to which the clock signal SCK2 is input. Here, the terminal 373-16, which serves as the terminal to which the diagnosis signal DIG-G is input and the terminal to which the clock signal SCK2 is input, is an example of another fourth terminal in the second embodiment.

The diagnosis signals DIG-H and the change signal CH2 are input to the terminal 373-18. That is, the terminal 373-8 serves as the terminal to which the diagnosis signal DIG-H is input and the terminal to which the change signal CH2 is input. Here, the terminal 373-18, which serves as the terminal to which the diagnosis signal DIG-H is input and the terminal to which the change signal CH2 is input, is an example of another third terminal in the second embodiment.

The diagnosis signals DIG-I and the setting signal TD10 are input to the terminal 373-20. That is, the terminal 373-20 serves as the terminal to which the diagnosis signal DIG-I is input and the terminal to which the setting signal TD10 is input. Here, the terminal 373-20, which serves as the terminal to which the diagnosis signal DIG-I is input and the terminal to which the setting signal TD10 is input, is an example of another first terminal in the second embodiment.

As described above, the connector 370 has the terminal 373-20 to which the diagnosis signal DIG-I is input, the terminal 373-14 to which the diagnosis signal DIG-F is input, the terminal 373-18 to which the diagnosis signal DIG-H is input, the terminal 373-16 to which the diagnosis signal DIG-G is input, and the terminal 373-10 to which the driving signal COM10 is input.

The ground signal GND is input to each of the terminals 373-11, 373-13, 373-15, 373-17, and 373-19.

FIG. 33 is a view for explaining details of signals input to the connector 380. As illustrated in FIG. 33, the connector 380 includes a terminal to which each of the driving signals COM6 to COM10 is input, a terminal to which each of the reference voltage signals CGND6 to CGND10 is input, a terminal to which the each of the setting signals TD6 to TD9 is input, a terminal to which the each of the voltages VHV and VDD2 is input, and a plurality of terminals to which a plurality of ground signals GND are input.

Specifically, the driving signals COM6 to COM10 are input to the terminals 383-1, 383-3, 383-5, 383-7, and 383-9, respectively. In addition, the reference voltage signals CGND6 to CGND10 are input to the terminals 383-2, 383-4, 383-6, 383-8, and 383-10, respectively.

The setting signals TD6 to TD9 are input from the terminals 383-13, 383-15, 383-17, and 383-19, respectively. In addition, the voltage VHV is input to the terminal 383-11. In addition, the voltage VDD2 is input to the terminal 383-16.

The ground signal GND is input to each of the terminals 383-12, 383-14, 383-18, and 383-20.

Figure 34:
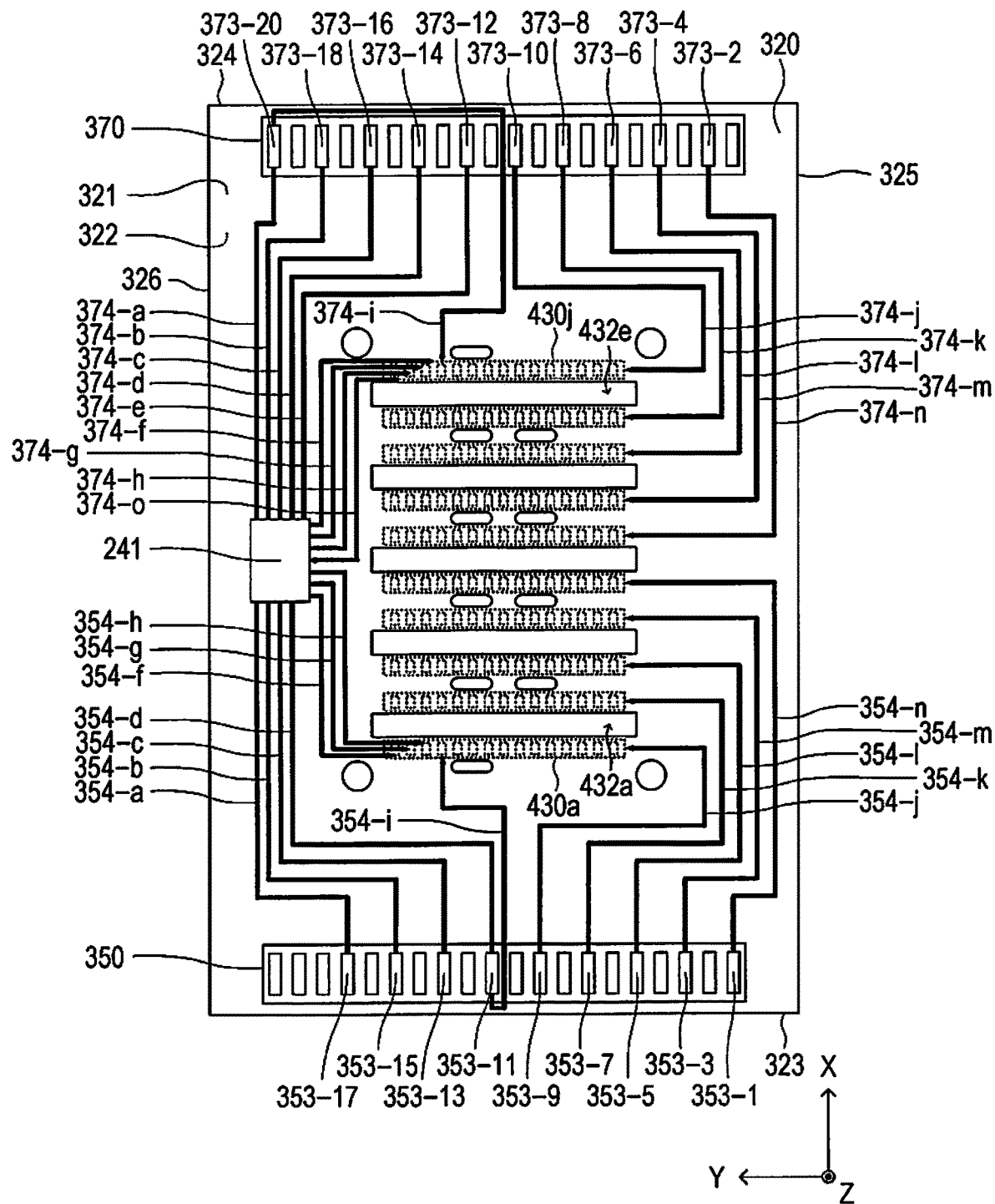
FIG. 34 is a view illustrating an example of wiring formed on the first surface of the substrate in the second embodiment.

FIG. 34 illustrates an example of a wiring through which the diagnosis signals DIG-A to DIG-D input from the connector 350 and the diagnosis signals DIG-E to DIG-I input from the connector 370 propagate on the first surface 321 of the substrate 320. FIG. 34 is a view illustrating an example of wiring formed on the first surface 321 of the substrate 320 in the second embodiment. Noted that, a part of the wiring formed on the substrate 320 is not illustrated in FIG. 34. As illustrated in FIG. 34, the electrode groups 430a to 430j formed on the second surface 322 of the substrate 320 is indicated by a broken line.

As illustrated in FIG. 34, the substrate 320 has wiring 354-a to 354-d, 354-f to 354-n, and 374-a to 374-o.

The terminal 353-17 is electrically coupled to the wiring 354-a. The diagnosis signal DIG-A and the latch signal LAT1 input from the terminal 353-17 are input to the integrated circuit 241 after propagating through the wiring 354-a. That is, the wiring 354-a electrically couples the terminal 353-17 and the integrated circuit 241 to each other. The wiring 354-a through which the diagnosis signal DIG-A and the latch signal LAT1 propagate is another example of second wiring in the second embodiment.

The terminal 353-15 is electrically coupled to the wiring 354-b. The diagnosis signal DIG-B and the clock signal SCK1 input from the terminal 353-15 are input to the integrated circuit 241 after propagating through the wiring 354-b. That is, the wiring 354-b electrically couples the terminal 353-15 and the integrated circuit 241 to each other. The wiring 354-b through which the diagnosis signal DIG-B and the clock signal SCK1 propagate is an example of fourth wiring in the second embodiment.

The terminal 353-13 is electrically coupled to the wiring 354-c. The diagnosis signal DIG-C and the change signal CH1 input from the terminal 353-13 are input to the integrated circuit 241 after propagating through the wiring 354-c. That is, the wiring 354-c electrically couples the terminal 353-13 and the integrated circuit 241 to each other. The wiring 354-c through which the diagnosis signal DIG-C and the change signal CH1 propagate is an example of third wiring in the second embodiment.

The terminal 353-11 is electrically coupled to the wiring 354-*d*. The diagnosis signal DIG-D and the setting signal TD1 input from the terminal 353-11 are input to the integrated circuit 241 after propagating through the wiring 354-*d*. That is, the wiring 354-*d* electrically couples the terminal 353-17 and the integrated circuit 241 to each other. The wiring 354-*d* through which the diagnosis signal DIG-D and the setting signal TD1 propagate is an example of first wiring in the second embodiment.

When the integrated circuit 241 diagnoses that the ink can be normally discharged from the print head 21 based on the diagnosis signals DIG-A to DIG-D, the integrated circuit 241 outputs, to the driving signal selection circuit 200, the latch signal LAT1, the clock signal SCK1, and the change signal CH1 as the latch signal cLAT1, the clock signal cSCK1, and the change signal cCH1. Specifically, the change signal cCH1, the clock signal cSCK1, and the latch signal cLAT1 output from the terminal of the integrated circuit 241 (not illustrated) propagate through the wiring 354-*f* to 354-*h* and are input to the driving signal selection circuit 200. That is, the wiring 354-*f* to 354-*h* electrically couples the integrated circuit 241 and the flexible wiring substrate 335 to each other. At least one of the wiring 354-*f* to 354-*h* through which the change signal cCH, the clock signal cSCK, and the latch signal cLAT propagate is an example of sixth wiring in the second embodiment.

In detail, the integrated circuit 241 configuring the diagnosis circuit 240 is electrically coupled to the wiring 354-*f*. In addition, when the diagnosis circuit 240 diagnosis that the ink can be normally discharged from the print head 21, the wiring 354-*f* is electrically coupled to the wiring 354-*c* through the integrated circuit 241. Thus, the change signal cCH1 based on the change signal CH1 is input to the wiring 354-*f*. The change signal cCH1 is input any of a plurality of electrodes included in the electrode group 430*a* provided on the second surface 322 of the substrate 320 through the wiring 354-*f*, the via (not illustrated), and the like. In addition, the change signal cCH1 is input to the driving signal selection circuit 200-1 through the flexible wiring substrate 335 coupled to the electrode group 430*a*. That is, the wiring 354-*f* electrically couples the integrated circuit 241 and the flexible wiring substrate 335 to each other.

In addition, the integrated circuit 241 is electrically coupled to the wiring 354-*g*. In addition, when the diagnosis circuit 240 diagnosis that the ink can be normally discharged from the print head 21, the wiring 354-*g* is electrically coupled to the wiring 354-*b* through the integrated circuit 241. Thus, the clock signal cSCK1 based on the clock signal SCK1 is input to the wiring 354-*g*. The clock signal cSCK1 is input any of a plurality of electrodes included in the electrode group 430*a* provided on the second surface 322 of the substrate 320 through the wiring 354-*g*, the via (not illustrated), and the like. In addition, the clock signal cSCK1 is input to the driving signal selection circuit 200-1 through the flexible wiring substrate 335 coupled to the electrode group 430*a*. That is, the wiring 354-*g* electrically couples the integrated circuit 241 and the flexible wiring substrate 335 to each other.

In addition, the integrated circuit 241 is electrically coupled to the wiring 354-*h*. In addition, when the diagnosis circuit 240 diagnosis that the ink can be normally discharged from the print head 21, the wiring 354-*h* is electrically coupled to the wiring 354-*a* through the integrated circuit 241. Thus, the latch signal cLAT1 based on the latch signal LAT1 is input to the wiring 354-*h*. The latch signal cLAT1 is input any of a plurality of electrodes included in the electrode group 430*a* provided on the second surface 322 of the substrate 320 through the wiring 354-*h*, the via (not illustrated), and the like. In addition, the latch signal cLAT1 is input to the driving signal selection circuit 200-1 through the flexible wiring substrate 335 coupled to the electrode group 430*a*. That is, the wiring 354-*h* electrically couples the integrated circuit 241 and the flexible wiring substrate 335 to each other.

Further, as illustrated in FIG. 34, the terminal 353-11 is also electrically coupled to the wiring 354-*i*. After the setting signal TD1 input from the terminal 353-11 propagates through the wiring 354-*i*, the setting signal TD1 is input to any of the plurality of electrodes included in the electrodes 430*a* provided on the second surface 322 of the substrate 320 through the via (not illustrated) and the like, and is supplied to the driving signal selection circuit 200 through the flexible wiring substrate 335. That is, the wiring 354-*i* electrically couples the integrated circuit 353-11 and the flexible wiring substrate 335 to each other. The wiring 354-*i* through which the setting signal TD1 propagates is an example of fifth wiring.

The terminal 353-9 to which the driving signal COM1 is input is electrically coupled to the wiring 354-*j*. The driving signal COM1 is input any of the plurality of electrodes included in the electrode group 430*a* provided on the second surface 322 of the substrate 320 through the wiring 354-*j*, the via (not illustrated), and the like. In addition, the driving signal COM1 is input to the driving signal selection circuit 200-1 through the flexible wiring substrate 335 coupled to the electrode group 430*a*. That is, the wiring 354-*j* electrically couples the terminal 353-9 and the driving signal selection circuit 200-1 to each other.

Similarly, each of the terminals 353-7, 353-5, 353-3, and 353-1 to which the driving signals COM2 to COM5 are input is electrically coupled to each of the wiring 354-*k* to 354-*n*. Moreover, each of the driving signals COM2 to COM5 is input to any of the plurality of electrodes included in the electrode groups 430*b* to 430*e* provided on the second surface 322 of the substrate 320 through the via (not illustrated), and the like after propagating through the wiring 354-*k* to 354-*m*.

The terminal 373-20 is electrically coupled to the wiring 374-*a*. The diagnosis signal DIG-I and the setting signal TD10 input from the terminal 373-20 are input to the integrated circuit 241 after propagating through the wiring 374-*a*. That is, the wiring 374-*d* electrically couples the terminal 373-20 and the integrated circuit 241 to each other. The wiring 374-*a* through which the diagnosis signal DIG-I and the setting signal TD10 propagate is an example of another first wiring in the second embodiment.

The terminal 373-18 is electrically coupled to the wiring 374-*b*. The diagnosis signal DIG-H and the change signal CH2 input from the terminal 373-18 are input to the integrated circuit 241 after propagating through the wiring 374-*b*. That is, the wiring 374-*b* electrically couples the terminal 373-18 and the integrated circuit 241 to each other. The wiring 374-*b* through which the diagnosis signal DIG-H and the change signal CH2 propagate is another example of third wiring in the second embodiment.

The terminal 373-16 is electrically coupled to the wiring 374-*c*. The diagnosis signal DIG-G and the clock signal SCK2 input from the terminal 373-16 are input to the integrated circuit 241 after propagating through the wiring 374-*c*. That is, the wiring 374-*c* electrically couples the terminal 373-16 and the integrated circuit 241 to each other. The wiring 374-*c* through which the diagnosis signal DIG-B and the clock signal SCK2 propagate is another example of fourth wiring in the second embodiment.

The terminal 373-14 is electrically coupled to the wiring 374-*d*. The diagnosis signal DIG-F and the latch signal LAT2 input from the terminal 373-14 are input to the integrated circuit 241 after propagating through the wiring 374-*d*. That is, the wiring 374-*d* electrically couples the terminal 373-14 and the integrated circuit 241 to each other. The wiring 374-*d* through which the diagnosis signal DIG-F and the latch signal LAT2 propagate is another example of second wiring in the second embodiment.

When the integrated circuit 241 diagnoses that the ink can be normally discharged from the print head 21 based on the diagnosis signals DIG-F to DIG-I, the integrated circuit 241 outputs, to the driving signal selection circuit 200 through the flexible wiring substrate 335, the latch signal LAT2, the clock signal SCK2, and the change signal CH2 as the latch signal cLAT2, the clock signal cSCK2, and the change signal cCH2. Specifically, the latch signal cLAT2, the clock signal cSCK2, and the change signal cCH2 output from the terminal of the integrated circuit 241 (not illustrated) are input to the driving signal selection circuit 200 through the flexible wiring substrate 335 after propagating the latch signal cLAT2, the clock signal cSCK2, and the change signal cCH2 through the wiring 374-*f* to 374-*h*. That is, the wiring 374-*f* to 374-*h* electrically couples the integrated circuit 241 and the flexible wiring substrate 335 to each other. At least one of the wiring 374-*f* to 374-*h* is another example of sixth wiring in the second embodiment.

In detail, the integrated circuit 241 configuring the diagnosis circuit 240 is electrically coupled to the wiring 374-*f*. In addition, when the diagnosis circuit 240 diagnosis that the ink can be normally discharged from the print head 21, the wiring 374-*f* is electrically coupled to the wiring 374-*d* through the integrated circuit 241. Thus, the latch signal cLAT2 based on the latch signal LAT2 is input to the wiring 374-*f*. The latch signal cLAT2 is input any of a plurality of electrodes included in the electrode group 430*j* provided on the second surface 322 of the substrate 320 through the wiring 374-*f*, the via (not illustrated), and the like. In addition, the latch signal cLAT2 is input to the driving signal selection circuit 200-10 through the flexible wiring substrate 335 coupled to the electrode group 430*j*. That is, the wiring 374-*f* electrically couples the integrated circuit 241 and the driving signal selection circuit 200-10 to each other.

In addition, the integrated circuit 241 is electrically coupled to the wiring 374-*g*. In addition, when the diagnosis circuit 240 diagnosis that the ink can be normally discharged from the print head 21, the wiring 374-*g* is electrically coupled to the wiring 374-*c* through the integrated circuit 241. Thus, the clock signal cSCK2 based on the clock signal SCK2 is input to the wiring 374-*g*. The clock signal cSCK2 is input any of a plurality of electrodes included in the electrode group 430*j* provided on the second surface 322 of the substrate 320 through the wiring 374-*g*, the via (not illustrated), and the like. In addition, the clock signal cSCK2 is input to the driving signal selection circuit 200-10 through the flexible wiring substrate 335 coupled to the electrode group 430*j*. That is, the wiring 374-*g* electrically couples the integrated circuit 241 and the driving signal selection circuit 200-10 to each other.

In addition, the integrated circuit 241 is electrically coupled to the wiring 374-*h*. In addition, when the diagnosis circuit 240 diagnosis that the ink can be normally discharged from the print head 21, the wiring 374-*h* is electrically coupled to the wiring 374-*b* through the integrated circuit 241. Thus, the change signal cCH2 based on the change signal CH2 is input to the wiring 374-*h*. The change signal cCH2 is input any of a plurality of electrodes included in the electrode group 430*j* provided on the second surface 322 of the substrate 320 through the wiring 374-*h*, the via (not illustrated), and the like. In addition, the change signal cCH2 is input to the driving signal selection circuit 200-10 through the flexible wiring substrate 335 coupled to the electrode group 430*j*. That is, the wiring 374-*h* electrically couples the integrated circuit 241 and the driving signal selection circuit 200-10 to each other.

Further, as illustrated in FIG. 34, the terminal 373-14 is also electrically coupled to the wiring 374-*i*. After the setting signal TD10 input from the terminal 373-14 propagates through the wiring 374-*i*, the setting signal TD10 is coupled to, through the via (not illustrated) and the like, any of the plurality of electrodes included in the electrode group 430*j* provided on the second surface 322 of the substrate 320. The wiring 374-*i* through which the setting signal TD10 propagates is another example of fifth wiring in the second embodiment. In addition, the print data signal SI10 is input to the driving signal selection circuit 200-10 through the flexible wiring substrate 335 coupled to the electrode group 430*j*. That is, the wiring 374-*i* electrically couples the terminal 373-14 and the driving signal selection circuit 200-1 to each other.

The terminal 373-10 to which the driving signal COM10 is input is electrically coupled to the wiring 374-*j*. The driving signal COM10 is input any of the plurality of electrodes included in the electrode group 430*j* provided on the second surface 322 of the substrate 320 through the wiring 374-*j*, the via (not illustrated), and the like. In addition, the driving signal COM10 is input to the driving signal selection circuit 200-10 through the flexible wiring substrate 335 coupled to the electrode group 430*j*. That is, the wiring 374-*j* electrically couples the terminal 373-10 and the driving signal selection circuit 200-10 to each other.

Similarly, each of the terminals 373-8, 373-6, 373-4, and 373-2 to which the driving signals COM9 to COM6 are input is electrically coupled to each of the wiring 374-*k* to 374-*n*. Moreover, each of the driving signals COM9 to COM6 is input to any of the plurality of electrodes included in the electrode groups 430*i* to 430*f* provided on the second surface 322 of the substrate 320 through the via (not illustrated), and the like after propagating through the wiring 374-*k* to 374-*m*.

As described above, even when the two sets of the diagnosis signals DIG-A to DIG-D and the diagnosis signals DIG-F to DIG-I are input from each of the two connectors 350 and 370, as in the first embodiment, it is possible to achieve both performing the self-diagnosis function and performing the print processing without deteriorating ink discharge accuracy.

3. Modification Example

In the liquid discharge apparatus 1 and the print head 21 according to the first and second embodiments as described above, the piezoelectric element 60 included in the discharge section 600 may be a type that can discharge ink from the nozzle 651 by displacing. Therefore, the piezoelectric element included in the discharge section 600 is not limited to the displacement depending on bending vibration as in the first and second embodiments, and may be displaced depending on vertical vibration.

Figure 35:
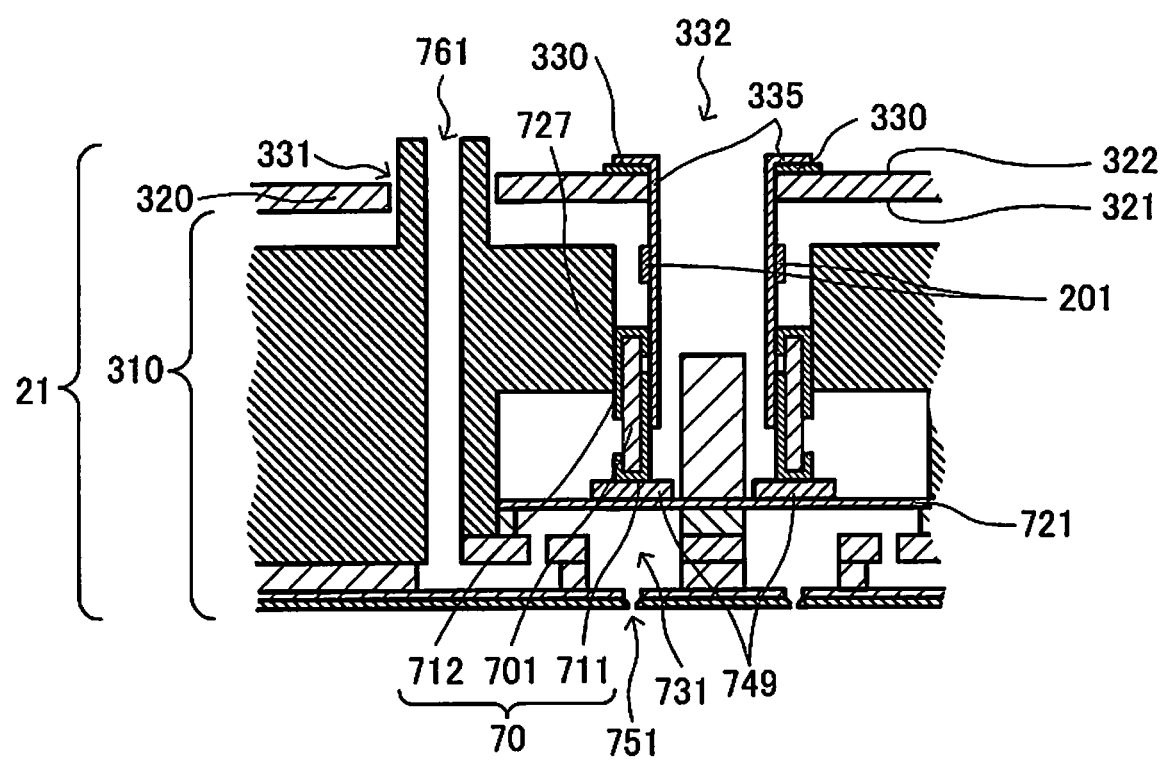
FIG. 35 is a view for explaining a configuration of a piezoelectric element and a liquid discharge operation according to a modification example.

FIG. 35 is a view for explaining a configuration of a piezoelectric element 70 and a liquid discharge operation according to a modification example. In FIG. 35, the same components as those in the first and second embodiments are denoted by the same reference numerals.

The piezoelectric element 70 in the modification example has a piezoelectric substance 701 being stacked between electrodes 711 and 712, and is a stack-type piezoelectric vibrator cut into an elongated comb shape. Such the piezoelectric element 70 is configured as a vertical vibration type piezoelectric vibrator which is extendable in a vertical direction as a longitudinal direction of the vibrator. In the piezoelectric element 70, a fixing end is joined to a fixation portion 727, and a free end is so called a cantilever state protruding outwardly from a tip edge of the fixation portion 727. In addition, a distal end surface of the free end in the piezoelectric element 70 is joined to an island portion 749 formed on one surface of a vibration plate 721. In addition, a cavity 731 for storing ink supplied from an ink supply port 761 is formed on other surface side of the vibration plate 721.

The electrode 711 included in the piezoelectric element 70 is an electrode formed in series on a distal end surface portion of the piezoelectric element 70 and a wiring coupling surface which is one side surface of the piezoelectric element 70 in a stacking direction and to which the flexible wiring substrate 335 is coupled, and the electrode 711 is conducted with an internal electrode (not illustrated) formed inside the piezoelectric element 70. In addition, the electrode 712 is an electrode formed in series on a proximal end surface portion opposite to the distal end surface portion of the piezoelectric element 70 and a fixing plate mounting surface which is the other side surface of the piezoelectric element 70 in the stacking direction, and the electrode 712 is conducted with a common internal electrode (not illustrated) formed inside a piezoelectric vibrator 15.

The driving signal VOUT is supplied to the electrode 711 through the flexible wiring substrate 335, and the reference voltage signal CGND is supplied to the electrode 712 through the flexible wiring substrate 335. At this time, the piezoelectric substance 701 is displaced depending on potential differences between the electrodes 711 and 712 and an individual internal electrode and a common internal electrode. As a result, the piezoelectric element 70 is extendably driven. In other words, the piezoelectric element 70 is vertically driven by a potential difference between the driving signal VOUT and the reference voltage signal CGND. The vibration plate 721 is displaced through the island portion 749 in accordance with the extendable driving of the piezoelectric element 70. As a result, an internal volume of the cavity 731 is changed. Moreover, the ink is discharged from a nozzle 751 in accordance with a change in the internal volume of the cavity 731.

In the print head 21 configured described above which has the piezoelectric element 70 displaced in accordance with the vertical vibration, the same operation and effect as those of the liquid discharge apparatus 1 and the print head 21 illustrated in the first and second embodiments can be obtained.

While the embodiment or the modification has been described above, the present disclosure is not limited to the embodiment or the modification, and can be carried out in various modes within the range not departing from the present disclosure. For example, the above embodiments can be combined as appropriate.

The present disclosure includes configurations (for example, a configuration having the same function, method, and results, or a configuration having the same objective and effects) that are substantially the same as the configurations described in the embodiments. In addition, the present disclosure includes a configuration in which an unsubstantial part described in the above embodiments is replaced by another part. In addition, the present disclosure includes a configuration having the same effects as those of the configurations described in the embodiments, or a configuration capable of achieving the same objective as that of the configurations described in the embodiments. In addition, the present disclosure includes a configuration in which a known technique is added to the configurations described in the embodiments.

What is claimed is:

1. A liquid discharge apparatus comprising:
   a print head discharging a liquid; and
   a control circuit controlling an operation of the print head, wherein
   the print head includes
      a connector having a first terminal, a second terminal, a third terminal, and a fourth terminal,
      a first integrated circuit,
      a circuit substrate on which the connector and the first integrated circuit are provided, and
      a first wiring substrate electrically coupled to the circuit substrate,
   the circuit substrate has first wiring, second wiring, third wiring, fourth wiring, fifth wiring, and sixth wiring,
   the first wiring electrically couples the first terminal and the first integrated circuit to each other,
   the second wiring electrically couples the second terminal and the first integrated circuit to each other,
   the third wiring electrically couples the third terminal and the first integrated circuit to each other,
   the fourth wiring electrically couples the fourth terminal and the first integrated circuit to each other,
   the fifth wiring electrically couples the first terminal and the first wiring substrate to each other, and
   the sixth wiring electrically couples the first integrated circuit and the first wiring substrate to each other.

2. The liquid discharge apparatus according to claim 1, wherein
   the print head includes a second integrated circuit,
   the second integrated circuit is provided on the first wiring substrate,
   the first wiring substrate has seventh wiring and eighth wiring,
   the seventh wiring electrically couples the fifth wiring and the second integrated circuit to each other, and
   the eighth wiring electrically couples the sixth wiring and the second integrated circuit to each other.

3. The liquid discharge apparatus according to claim 1, wherein
   the connector and the first integrated circuit are provided on an identical surface of the circuit substrate.

4. The liquid discharge apparatus according to claim 1, wherein
   the first wiring substrate is a flexible wiring substrate.

5. The liquid discharge apparatus according to claim 1, wherein
   the print head includes a second wiring substrate electrically coupled to the circuit substrate, and
   a shortest distance between the first wiring substrate and the connector is shorter than a shortest distance between the second wiring substrate and the connector.

6. The liquid discharge apparatus according to claim 5, wherein
   the print head includes a plurality of wiring substrates including the first wiring substrate and the second wiring substrate, and
   the first wiring substrate is provided to be closest to the connector among the plurality of wiring substrates.

7. The liquid discharge apparatus according to claim 1, wherein
a frequency of a signal propagating through the first wiring is higher than a frequency of a signal propagating through the second wiring.

8. The liquid discharge apparatus according to claim 1, wherein
a frequency of a signal propagating through the first wiring is higher than a frequency of a signal propagating through the third wiring.

9. The liquid discharge apparatus according to claim 1, wherein
the first integrated circuit determines whether or not the liquid is normally discharged based on a first signal, a second signal, a third signal, and a fourth signal.

10. The liquid discharge apparatus according to claim 9, further comprising:
a driving signal output circuit outputting a driving signal, wherein
the driving signal includes a first waveform, a second waveform, and a constant voltage waveform between the first and second waveforms, the first and second waveforms being for discharging the liquid from the print head.

11. The liquid discharge apparatus according to claim 10, wherein
the first terminal serves as a terminal to which the first signal and a fifth signal for specifying a selection of waveform of the driving signal are input.

12. The liquid discharge apparatus according to claim 10, wherein
the second terminal serves as a terminal to which the second signal and a sixth signal for specifying a liquid discharge timing are input.

13. The liquid discharge apparatus according to claim 12, wherein
the sixth signal is input to the second terminal in a period during which the driving signal has the constant voltage waveform.

14. The liquid discharge apparatus according to claim 10, wherein
the third terminal serves as a terminal to which the third signal and a seventh signal for specifying a waveform switching timing of the driving signal are input.

15. The liquid discharge apparatus according to claim 14, wherein
the seventh signal is input to the third terminal in a period during which the driving signal has the constant voltage waveform.

16. The liquid discharge apparatus according to claim 10, wherein
the fourth terminal serves as a terminal to which the fourth signal and an eighth signal for specifying an operation timing of the print head are input.

17. A print head comprising:
a connector having a first terminal, a second terminal, a third terminal, and a fourth terminal;
a first integrated circuit;
a circuit substrate on which the connector and the first integrated circuit are provided; and
a first wiring substrate electrically coupled to the circuit substrate, wherein the circuit substrate has first wiring, second wiring, third wiring, fourth wiring, fifth wiring, and sixth wiring,
the first wiring electrically couples the first terminal and the first integrated circuit to each other,
the second wiring electrically couples the second terminal and the first integrated circuit to each other,
the third wiring electrically couples the third terminal and the first integrated circuit to each other,
the fourth wiring electrically couples the fourth terminal and the first integrated circuit to each other,
the fifth wiring electrically couples the first terminal and the first wiring substrate to each other, and
the sixth wiring electrically couples the first integrated circuit and the first wiring substrate to each other.

* * * * *